(12) United States Patent
Ishibashi et al.

(10) Patent No.: US 9,767,993 B2
(45) Date of Patent: Sep. 19, 2017

(54) PLASMA PROCESSING APPARATUS

(71) Applicant: TOKYO ELECTRON LIMITED, Tokyo (JP)

(72) Inventors: Kiyotaka Ishibashi, Miyagi (JP); Osamu Morita, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 483 days.

(21) Appl. No.: 14/349,807

(22) PCT Filed: Oct. 3, 2012

(86) PCT No.: PCT/JP2012/006331
§ 371 (c)(1),
(2) Date: Apr. 4, 2014

(87) PCT Pub. No.: WO2013/051248
PCT Pub. Date: Apr. 11, 2013

(65) Prior Publication Data
US 2014/0262034 A1 Sep. 18, 2014

(30) Foreign Application Priority Data

Oct. 7, 2011 (JP) .................................. 2011-223331
Oct. 7, 2011 (JP) .................................. 2011-223334
Oct. 7, 2011 (JP) .................................. 2011-223335

(51) Int. Cl.
*C23C 16/00* (2006.01)
*C23F 1/00* (2006.01)
(Continued)

(52) U.S. Cl.
CPC .. *H01J 37/32201* (2013.01); *C23C 16/45563* (2013.01); *C23C 16/511* (2013.01);
(Continued)

(58) Field of Classification Search
CPC ............. H01J 37/32192; H01J 37/3244; H01J 37/32495; H01J 37/32201; H01J 37/321;
(Continued)

(56) References Cited

U.S. PATENT DOCUMENTS

2006/0137610 A1* 6/2006 Yoshizaki ............. C23C 16/325
118/723 E
2007/0163996 A1* 7/2007 Horiguchi ........... H01J 37/3244
216/67
(Continued)

FOREIGN PATENT DOCUMENTS

| JP | 2003-7497 A | 1/2003 |
|----|---|---|
| JP | 2007-221116 A | 8/2007 |

(Continued)

OTHER PUBLICATIONS

International Search Report mailed Dec. 25, 2012 in PCT/JP2012/006331.

*Primary Examiner* — Rakesh Dhingra
(74) *Attorney, Agent, or Firm* — Rothwell, Figg, Ernst & Manbeck, P.C.

(57) ABSTRACT

This microwave plasma processing apparatus has, as a gas introduction mechanism for introducing a working gas inside a chamber (10), electrical discharge prevention members (96(1) to 96(8)), each of which is provided to a plurality of dielectric window gas passages (94(1) to (94(8))) through which a dielectric window (54) passes. Each electrical discharge prevention member (96(n)), a portion (114) of which protrudes only a height h, which is greater than or equal to a predetermined distance H, upward from the rear surface of a dielectric window (52) on the inlet side, passes through an opening (54a) of a slot plate (54), and inserts into a branched gas supply path (92(n)) of a gas branch part (90). The gas branch part (90), spring coils (116) and the slot plate (54), which surround the protruding portion (114) of each (Continued)

electrical discharge prevention member (96(n)), constitute an enclosing conductor (118).

34 Claims, 42 Drawing Sheets

(51) Int. Cl.
*H01L 21/306* (2006.01)
*H01J 37/32* (2006.01)
*C23C 16/455* (2006.01)
*C23C 16/511* (2006.01)
*H05H 1/46* (2006.01)

(52) U.S. Cl.
CPC ........ *H01J 37/321* (2013.01); *H01J 37/3244* (2013.01); *H01J 37/32192* (2013.01); *H01J 37/32495* (2013.01); *H05H 2001/463* (2013.01)

(58) Field of Classification Search
CPC ............. C23C 16/511; C23C 16/45563; C23C 16/45565; C23C 16/45568; H05H 2001/463
USPC .................. 118/723 MW, 723 R; 156/345.41
See application file for complete search history.

(56) References Cited

U.S. PATENT DOCUMENTS

| | | | |
|---|---|---|---|
| 2008/0254220 A1* | 10/2008 | Tian .................. | H01J 37/32192 427/271 |
| 2008/0303744 A1* | 12/2008 | Hirayama ................. | B08B 7/00 343/900 |
| 2009/0065480 A1* | 3/2009 | Ohmi ....................... | H05H 1/46 216/69 |
| 2009/0230636 A1* | 9/2009 | Goto .................... | H01L 21/6831 279/128 |
| 2009/0242130 A1* | 10/2009 | Tian .................. | H01J 37/32192 156/345.41 |
| 2010/0075066 A1* | 3/2010 | Ueda ..................... | C23C 16/402 427/575 |

FOREIGN PATENT DOCUMENTS

| | | |
|---|---|---|
| JP | 2010-10154 A | 1/2010 |
| WO | 2007/083795 A1 | 7/2007 |

* cited by examiner

PLASMA PROCESSING APPARATUS

CROSS REFERENCE TO RELATED APPLICATION

This application is a 35 U.S.C. 371 National Phase Entry Application from PCT/JP2012/006331, filed Oct. 3, 2012, which claims the benefit of Japanese Patent Application Nos. 2011-223331, 2011-223334 and 2011-223335, all filed Oct. 7, 2011, the disclosures of which are incorporated herein in their entirety by reference.

TECHNICAL FIELD

The present disclosure relates to a plasma processing apparatus that performs a desired processing on a substrate to be processed using plasma generated by electromagnetic discharge of a processing gas.

BACKGROUND

In a manufacturing process of semiconductor devices or flat panel displays (FPDs), plasma is frequently used so as to cause a processing gas to conduct a good reaction at a relatively low temperature in a processing such as, for example, etching, deposition, oxidation, or sputtering. Conventionally, plasma generated by high frequency discharge in a MHz region or plasma generated by microwave discharge in a GHz region is widely used in such plasma processings.

The plasma generated by the microwave discharge has an advantage in that low electron temperature and high density plasma may be generated under a low pressure. In particular, when a microwave introduction window structure incorporating a slot antenna is employed, there are advantages in that large diameter plasma may be efficiently generated and, since no magnetic field is required, a plasma processing apparatus may be simplified.

In such a microwave plasma processing apparatus, however, in order to generate plasma required for a desired process, it is necessary to supply a required processing gas into a vacuum chamber (processing container) in such a manner that the processing gas can be electrically discharged within the chamber. Typically, a microwave introduction dielectric window is attached to a ceiling of the chamber as a ceiling plate. In a plasma generation space within the chamber, since an electric field and radiation power of microwaves are the highest in the proximity of the inner side of the dielectric window (ceiling plate), the highest plasma generation efficiency may be obtained when the processing gas is introduced in the vicinity of that area. For this reason, an upper gas introduction mechanism is widely used in which the upper gas introduction mechanism is configured to introduce a processing gas into the chamber through a gas flow path that extends through the dielectric window.

However, the dielectric window also serves as a microwave propagation path and a number of microwave electric fields are distributed within the dielectric window. Thus, when the processing gas is exposed to the microwave electric fields within the gas flow path of the dielectric window, the processing gas may be electrically discharged. When the processing gas is electrically discharged within the gas flow path of the dielectric window or in the vicinity of an inlet of the gas flow path, unnecessary consumption of a microwave power may be caused. Further, a decomposition product of the processing gas may be deposited to a wall of the gas flow path, thereby causing a reduction in conductance, for example. In the worst case, the dielectric window may be damaged by the electric discharge.

As a method of preventing such abnormal electric discharge within the dielectric window, in the prior art, the wall of the gas flow path within the dielectric window is made of a conductor so as to shield the processing gas flowing in the gas flow path from a microwave electric field. However, in such a method, a gas jet portion of a conductor (metal) facing the plasma generation space may be sputtered due to the attack of ions from the plasma, thereby causing contamination. In addition, since microwave electric fields are electromagnetically shielded, a uniform plasma processing may be disturbed.

As another method, it has been proposed to fill the gas flow path within the dielectric window with an air-permeable electric discharge prevention member (Patent Document 1). The electric discharge prevention member is typically made of a porous dielectric material and is air-permeable since numerous fine pores are communicated with each other therein. Thus, the processing gas may be smoothly sent to the plasma generation space within the chamber. Meanwhile, even if the porous dielectric material is exposed to the microwave electric fields, electrons are hardly accelerated since the space of the gas flow path (the numerous fine pores in the inside of the dielectric material) is too small. As a result, collision ionization of electrons to attain electric discharge does not occur.

PRIOR ART DOCUMENT

Patent Document

Patent Document 1: International Publication WO2007/083795

DISCLOSURE OF THE INVENTION

Problems to be Solved

As described above, when the air-permeable electric discharge prevention member is filled in the gas flow path extending through the dielectric window in the plasma processing apparatus, abnormal electric discharge within the dielectric window may be efficiently suppressed without causing contamination. However, there is a problem in that, even if such an electric discharge prevention member is filled, unexpected electric discharge (abnormal electric discharge) of the processing gas may still occur in the gas flow path at the upstream side in relation to the electric discharge prevention member.

In general, an external gas tube extending from a processing gas supply unit is hermetically connected, via a seal member such as an O-ring, to an inlet of the gas flow path that extends through the dielectric window. Such a kind of a gas tube is formed of a metal such as a stainless steel or copper and is fabricated as a slender tube. However, abnormal electric discharge of the processing gas occurs at a gas groove (in particular, a gap inside the O-ring), which is filled with the process gas in the vicinity of the inlet of the dielectric window side gas flow path connected with an external gas tube, depending on an electromagnetic field strength and a pressure (in general, when the electromagnetic field strength is high and the pressure is low).

In order to prevent the abnormal electric discharge in the gas groove in the vicinity of the inlet of the gas flow path filled with the air-permeable electric discharge prevention member, conventionally used methods are as follows: limiting a microwave inputting power (thereby, reducing the electromagnetic field strength in the gas groove), or sufficiently increasing the pressure in the gas groove (e.g., to be 300 Torr or higher).

However, when the microwave inputting power is limited, the processing speed of the plasma process is reduced, which is very disadvantageous in practice.

In addition, the method of increasing the pressure in the gas groove has many difficulties. That is, when the pressure of the gas groove is increased, a lot of time (several tens or more seconds) is consumed for intake/exhaust of the gas or replacement of gas species before or after the processing of the plasma process and as a result, the throughput is reduced. In addition, when the pressure in the gas groove is increased, the flow rate of the gas may be readily fluctuated through the fluctuation of the pressure in the gas groove due to a change of temperature of the electric discharge prevention member (porous dielectric material) of the gas flow path since the flow rate of the gas depends on the pressure in the gas groove. Consequently, a trouble may occur in stability or reproducibility of the plasma process. When a gas species, of which the vapor pressure is low, is used as the processing gas, it is required to increase the temperature within the external gas tube by, for example, a heating means mounted on the entire external gas tube, in order to increase the pressure. Therefore, the gas supply line is expensive and is enlarged.

The present disclosure has been made so as to solve the problems in the related art as described above and is to provide a plasma processing apparatus which ensures that, when a plasma gas flow path is provided in a dielectric window, through which microwaves for generating plasma is transmitted to be introduced into a chamber, abnormal electric discharge in the vicinity of an inlet of the gas flow path may be prevented.

Means to Solve the Problems

A plasma processing apparatus according to the present disclosure includes: a processing container configured to be evacuated to a vacuum and provided with a dielectric window; a substrate holding unit configured to hold a substrate to be processed within the processing container; a dielectric window gas flow path that penetrates the dielectric window; a processing gas supply unit including an external gas supply path which is connected with the dielectric window gas flow path at a rear side or outside of the dielectric window when viewed from a plasma generation space within the processing container, the processing gas supply unit being configured to supply at least a part of a required processing gas into the processing container through the external gas supply path and the dielectric window gas flow path; an electromagnetic wave supply unit configured to supply electromagnetic waves into the processing container through the dielectric window; an electric discharge prevention member integrally formed in or bonded to the dielectric window, the electric discharge prevention member having an inlet connected to an outlet of the external gas supply path and forming a part or a whole of the dielectric window gas flow path; and a surrounding conductor configured to surround the electric discharge prevention member at least in the vicinity of the inlet of the electric discharge prevention member.

In the above-described configuration, when a plasma process is performed in the processing container, the processing gas sent through the external gas flow path of the processing gas supply unit at a predetermined pressure enters into the dielectric window gas flow path from the inlet of the electric discharge prevention member, passes the air-permeable electric discharge prevention member, and then is jetted out of a terminal end (gas jet port) of the dielectric window gas flow path into the processing container.

Meanwhile, the electromagnetic waves fed from the electromagnetic wave supply unit pass through the dielectric window to be radiated toward the plasma generation space within the processing container on one hand and are propagated in the dielectric window to freely pass through the electric discharge prevention member on the other hand. Thus, the inside of the electric discharge prevention member not only allows the processing gas to flow therethrough but is also exposed to a number of electromagnetic wave electric fields distributed within the dielectric window. In addition, the electromagnetic waves also reach surroundings of the electric discharge prevention member through the electric discharge prevention member, in particular, the external gas flow path.

Here, since the space of the gas flow path (numerous fine holes) are too small within the electric discharge prevention member, electrons are hardly accelerated even if the electric fields of the electromagnetic waves are very strong. Thus, electron collision ionization, i.e. electric discharge is hardly generated. Meanwhile, the electromagnetic wave electric fields progressing from the inside of the dielectric window along the inside of the electric discharge prevention member toward the inlet side of the electric discharge prevention member is attenuated by being reflected within the surrounding conductor which is considerably narrower and deeper than the dielectric window or an equivalent reactance. In addition, as the propagation distance within the surrounding conductor is increased, that is, as the electromagnetic wave electric fields proceeds further toward the inlet side of the electric discharge prevention member, the attenuation amount is increased. As a result, the electric field strength in the vicinity of the input of the electric discharge prevention member may be considerably lower than the electric field strength within the dielectric window.

Accordingly, even if the electromagnetic wave feeding power is arbitrarily increased and the pressure of the gas flow path is arbitrarily decreased, abnormal electric discharge may be prevented securely in the vicinity of the inlet of the electric discharge prevention member which is considered as a place where the abnormal electric discharge may be generated most easily.

Effect of the Invention

According to the plasma processing apparatus of the present disclosure, due to the configurations and actions as described above, abnormal electric discharge in the vicinity of an inlet of a gas flow path may be prevented securely when the gas flow path is provided in a dielectric window which transmits electromagnetic waves for generating plasma to be introduced into a chamber.

DETAILED DESCRIPTION TO EXECUTE THE INVENTION

Hereinafter, an exemplary embodiment of the present disclosure will be described with reference to the accompanying drawings.

Figure 1:
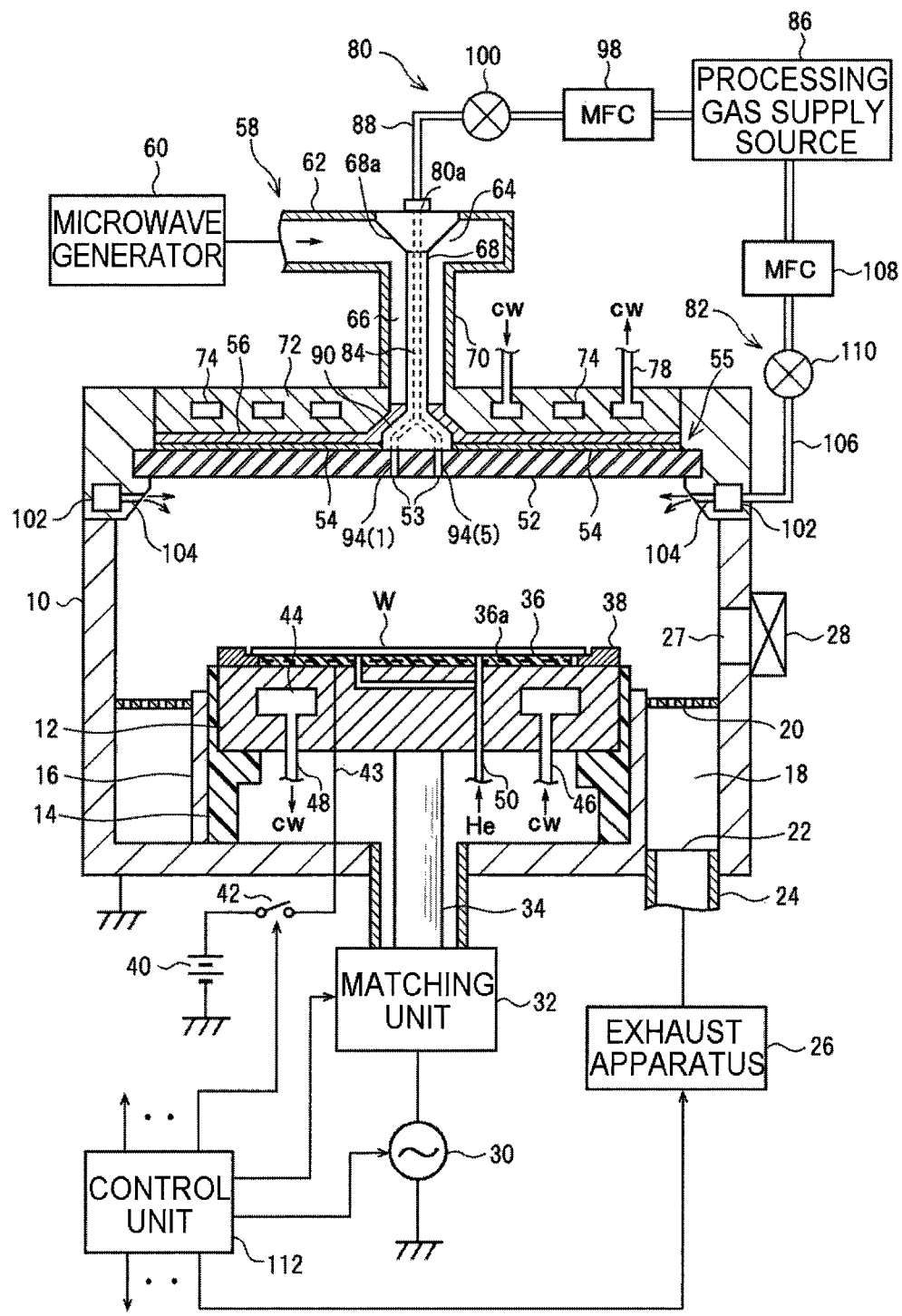
FIG. 1 is a view illustrating a configuration of a microwave plasma processing apparatus according to an exemplary embodiment of the present disclosure.

FIG. 1 illustrates a configuration of a microwave plasma processing apparatus of an exemplary embodiment of the present disclosure. The microwave plasma processing apparatus performs a plasma processing such as, for example, plasma etching, plasma CVD or plasma ALD under surface wave plasma exited using microwaves and a flat plate-type slot antenna and includes a cylindrical vacuum chamber (processing container) 10 made of a metal such as aluminum or a stainless steel. The chamber 10 is grounded.

First, descriptions will be made on each component which is not involved in plasma generation in the microwave plasma processing apparatus.

At a lower central area within the chamber 10, a disc-shaped susceptor 12, on which, for example, a semiconductor wafer W is mounted as a substrate to be processed, is disposed horizontally as a substrate holding table. The susceptor 12 is made of, for example, aluminum, and supported on an insulative cylindrical support unit 14 that extends vertically upward from the bottom of the chamber 10.

An exhaust path 18 is formed between a conductive cylindrical support unit 16 extending from the bottom of the chamber 10 along an outer periphery of the cylindrical support unit 14 and an inner wall of the chamber 10 in which an annular baffle plate 20 is attached to the top or inlet of the exhaust path 18 and one or more exhaust ports 22 are provided in the bottom portion of the exhaust path 18. An exhaust apparatus 26 is connected to each exhaust port 22 through an exhaust tube 24. The exhaust apparatus 26 includes a vacuum pump such as a turbo molecular pump such that the exhaust apparatus 26 may decompress the plasma processing space within the chamber 10 to a desired vacuum degree. Outside the side wall of the chamber 10, a gate valve 28 is attached to open/close a semiconductor wafer W carry-in/carry-out port 27.

An electrostatic chuck 36 is provided on the top surface of the susceptor 12. The electrostatic chuck 36 includes a bias electrode configured to draw ions into the semiconductor wafer W, and an electrode 36a configured to hold the semiconductor wafer W by an electrostatic attractive force. A high frequency power source 30 for RF bias is electrically connected to the bias electrode through a matching unit 32 and a power feeding rod 34. The high frequency power source 30 outputs high frequency waves of a frequency suitable for controlling the energy of the ions drawn into the semiconductor wafer W, for example, high frequency waves of 13.56 MHz, with a predetermined power. The matching unit 32 accommodates a matching device configured to match an impedance of the high frequency power source 30 side and an impedance of the load (mainly, electrode, plasma, and chamber) side, and a blocking condenser is included in the matching device.

A focus ring 38 is provided radially outside the electrostatic chuck 36 to annually surround the semiconductor wafer W. A direct current (DC) power source 40 is electrically connected to the electrode 36a via a switch 42 and a coated wire 43. With the aid of the DC voltage applied from the DC power source 40, the semiconductor wafer W may be attracted to and held on the electrostatic chuck 36 by an electrostatic force.

An annular coolant flow path 44 extending, for example, in a circumferential direction, is provided within the susceptor 12. The coolant flow path 44 is supplied in circulation with a coolant, for example, a fluorine-based thermal medium or cooling water cw, of a predetermined temperature from the chiller unit (not illustrated) through pipes 46, 48. The processing temperature of the semiconductor wafer W on the electrostatic chuck 36 may be controlled according to the temperature of the coolant. In addition, a heat transfer gas, for example, He, from a heat transfer gas supply unit (not illustrated) is supplied to a space between the top surface of the electrostatic chuck 36 and the rear surface of the semiconductor wafer W through a gas supply tube 50. In addition, in order to load/unload the semiconductor wafer W, for example, a lift pin configured to be moved up and down in the vertical direction through the susceptor 12 and a lifting mechanism thereof (not illustrated) are also provided.

Next, descriptions will be made of each component that is involved in generating plasma in the microwave plasma etching apparatus.

A circular dielectric window 52 configured to introduce microwaves is hermetically adhered to a ceiling surface of the chamber 10 which faces the susceptor 12 as a ceiling plate. A space just below the dielectric window 52 within the chamber serves as a plasma generation space. The dielectric window 52 is made of a microwave-permeable dielectric material such as, for example, quartz or ceramics such as $Al_2O_3$, and has a thickness of, for example, about 20 mm considering pressure resistance.

The dielectric window 52 is provided with a slot plate 54 which is a conductor attached to or disposed on the top surface of the dielectric window 52. The slot plate 54 has a plurality of slot pairs 55 (FIG. 46) which are configured to irradiate microwaves and distributed concentrically in a rotationally symmetric arrangement. On the slot plate 54, a dielectric plate 56 is provided so as to shorten the wavelength of microwaves propagated inside the slot plate 54. The slot plate 54 is electromagnetically coupled to the microwave transmission line 58. A flat plate-type slot antenna, for example, a disc-shaped radial line slot antenna 55, is constituted by the slot plate 54, the dielectric plate 56, and an antenna rear plate provided to be opposite to the slot plate.

The microwave transmission line 58 is a line configured to transmit, for example, microwaves of 2.45 GHz, which are output from the microwave generator 60 with a predetermined power, to the radial line slot antenna 55, and includes a waveguide 62, a waveguide-coaxial tube converter 64, and a coaxial tube 66. The waveguide 62 is, for example, a rectangular waveguide and transmits the microwaves from the microwave generator 60 to the waveguide-coaxial tube converter 64 using a TE mode as a transmission mode.

The waveguide-coaxial tube converter 64 connects a start end of the rectangular waveguide 62 and the terminal end of the coaxial tube 66 and converts the transmission mode of the rectangular waveguide 62 into the transmission mode of the coaxial tube 66. The coaxial tube 66 extends vertically downward from the waveguide-coaxial tube converter 64 to the central portion of the top of the chamber 10 and the terminal end of the coaxial line is coupled to the radial line slot antenna 55 through the dielectric plate 56. The outer conductor 70 of the coaxial tube 66 is formed as a cylindrical body integrally with the rectangular waveguide 62 and the microwaves are propagated to the space between the inner conductor 68 and the outer conductor 70 in a TEM mode.

The microwaves output from the microwave generator 60 are propagated to the waveguide 62, the waveguide-coaxial tube converter 64 and the coaxial tube 66 of the microwave transmission line 58 as described above, and fed to the radial line slot antenna 55 through the dielectric plate 56. In addition, the microwaves expanded in the radial direction while being shortened in the wavelength within the dielectric plate 56 become plane waves of circular polarization having two orthogonal polarization components from each slot pair of the antenna 55 and are radiated toward the inside of the chamber 10. The gas in the vicinity of the surface of the dielectric window 52 is ionized by the electric fields of surface waves (microwave electric fields) propagated in the radial direction along the surface of the dielectric window and as a result, high-density and low-electronic temperature plasma is generated.

On the dielectric plate 56, a cooling jacket plate 72 which also serves as an antenna rear plate is provided to cover the top of the chamber 10. The cooling jacket plate 72 is made of, for example, aluminum, and has a function of absorbing (radiating) heat of dielectric loss which is generated from the dielectric window 52 and the dielectric plate 56. For the cooling function, a coolant of a predetermined temperature, for example, a fluorine-based heat medium or cooling water cw is circulated in a flow path 74 formed in the cooling jacket plate 72 from a chiller unit (not illustrated) through pipes 76, 78.

The microwave plasma processing apparatus is provided with two routes of: an upper gas introduction section 80 that includes a gas flow path provided in the dielectric window 52, and a lateral (side) gas introduction section 82 that includes a gas flow path provided in the side wall of the chamber 10, as a gas introduction mechanism configured to introduce a processing gas into the chamber 10.

In the upper gas introduction section 80, a hollow gas flow path 84 is provided in the inner conductor 68 of the coaxial tube 66 to extend in the axial direction through the inside of the inner conductor 68. In addition, a first gas supply tube 88 from a processing gas supply source 86 is connected to the upper end of the inner conductor 68 and the gas flow path of the first gas supply tube 88 and the gas flow path 84 of the coaxial tube 66 are communicated with each other.

A block-type connector unit 90 is connected to the lower end of the inner conductor 68. The connector unit 90 has a reversed taper shape of which the diameter increases toward a lower base end and branches a gas flow therein. The connector unit 90 includes one (common) inlet 90a connected with the terminal end of the gas flow path 84 of the coaxial tube 66, and a plurality of internal flow paths, for example, eight (8) internal flow paths which are bored and radially branched from the common inlet 90a to the inside thereof, i.e., branched gas supply paths 92(1) to 92(8). The connector unit 90 is hermetically facing the rear surface (top surface) of the central portion of the dielectric window 52.

The connector unit 90 is made of a conductor such as, for example, copper, aluminum, a stainless steel, or an alloy thereof. The connector unit 90 is connected to the inner conductor 68 of the coaxial tube 66, forms the terminal end of the coaxial tube, and electrically grounded.

Figure 3:
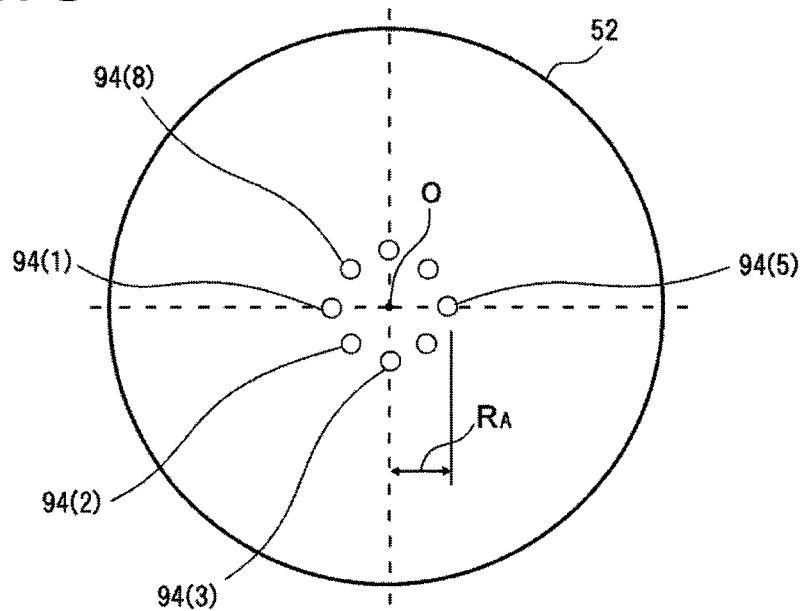
FIG. 3 is a plan view illustrating arranged positions (layout) of a plurality of dielectric window gas flow paths formed in a dielectric window in the central gas introduction section.

The dielectric window 52 is formed with inner flow paths which are connected to the terminal ends of the branched gas supply paths 92(1) to 92(8) of the connector unit 90, respectively, that is, dielectric window gas flow paths 94(1) to 94(8). The dielectric window gas flow paths 94(1) to 94(8) are arranged, preferably, on a circumference of a predetermined distance (radius) $R_A$ from the center O of the dielectric window 52 at equidistant intervals (FIG. 3), and each of the dielectric window gas flow paths 94(1) to 94(8) vertically passes through the dielectric window 52 to face the plasma generation space within the chamber 10 (FIG. 1).

Figure 2:
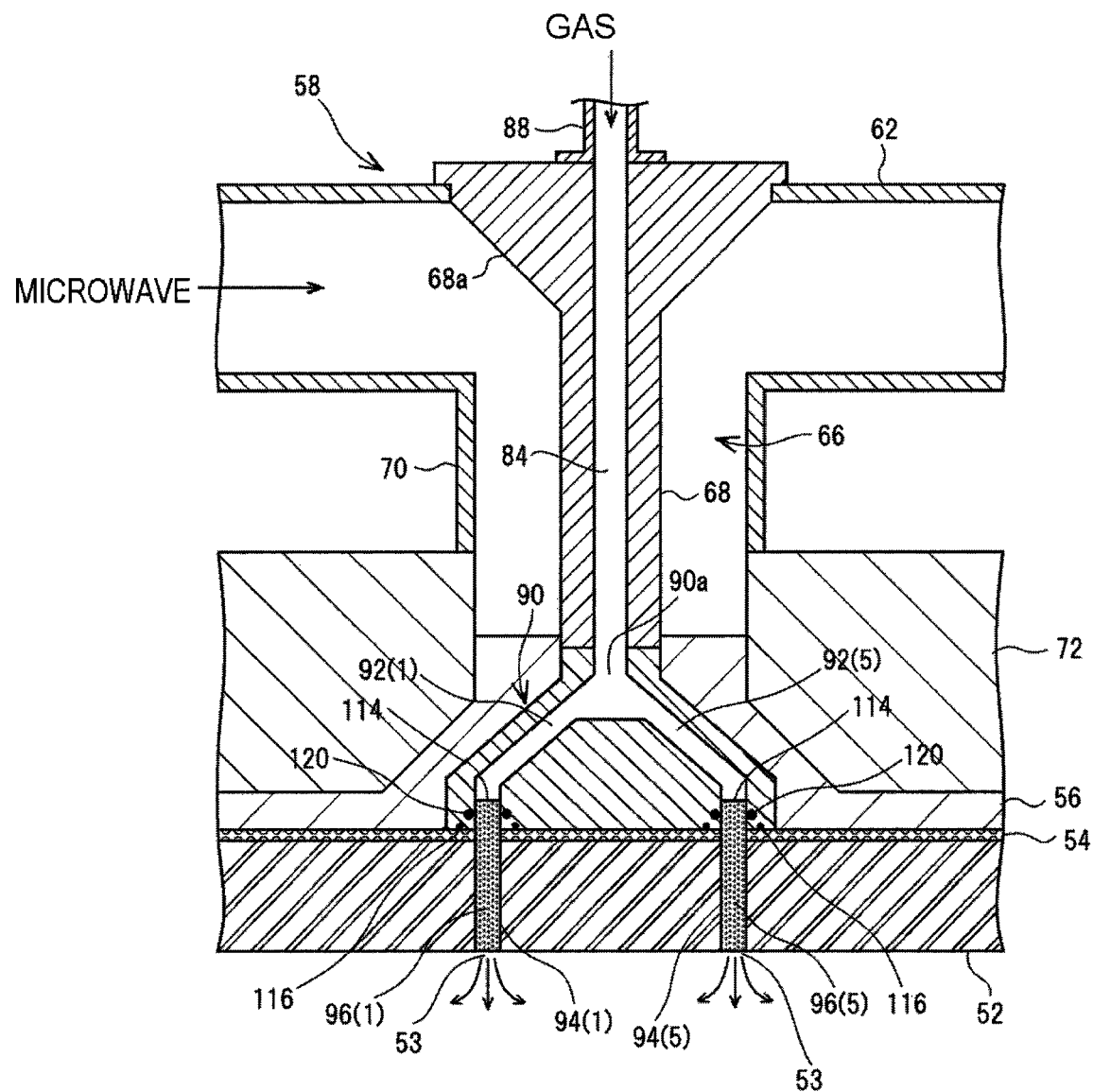
FIG. 2 is a cross-sectional view illustrating a configuration of a central gas introduction section in the plasma processing apparatus of FIG. 1.

As illustrated in FIG. 2, each of the dielectric window gas flow paths 94($n$) ($n$=1 to 8) that pass through the dielectric window 52 is provided with an air-permeable electric discharge prevention member 96($n$) which is made of a dielectric material. In the present exemplary embodiment, each of the electric discharge prevention members 96($n$) occupies a whole of (or a part of) corresponding dielectric window gas flow path 94($n$). Each of the electric discharge prevention members 96($n$) is connected with one corresponding branched gas supply path 92($n$) at the rear side of the dielectric window 52, and faces the plasma generation space within the chamber 10 to form a gas jet port 53 at the front side of the dielectric window 52.

In each of the dielectric window gas flow paths 94($n$), an inlet side portion connected with a terminal end (outlet) of a branched gas supply path 92($n$) of the connector unit 90 will be described in detail below.

In the upper gas introduction section 80, a processing gas, which is pumped from the processing gas supply source 86 at a predetermined pressure (for example, an etching gas or a film-forming gas), flows through the first gas supply tube 88, the gas flow path 84 of the coaxial tube 66, the each branched gas supply path 92($n$) of the connector unit 90, and the each electric discharge prevention member 96($n$) of the dielectric window 52 in this order and is ejected from each gas jet port 53 at the terminal end the electric discharge prevention member 96($n$) to be diffused in the plasma generation space from the central portion toward the peripheral portion within the chamber 10. In addition, a mass flow controller (MFC) 98 and an opening/closing valve 100 are provided in a middle of the first gas supply tube 88.

The side gas introduction section 82 is placed at a position lower than the bottom surface of the dielectric window 52, and includes a buffer chamber (manifold) 102 formed in an annular shape within the side wall of the chamber 10, side wall gas jet ports 104 facing the plasma generation space from the buffer chamber 102 at equidistant intervals in the circumferential direction, and a second gas supply tube 106 extending from the processing gas supply source 86 to the buffer chamber 102. An MFC 108 and an opening/closing valve 110 are provided in a midway of the second gas supply tube 106.

In the side gas introduction section 82, a processing gas (e.g., an etching gas or a film-forming gas) pumped from the processing gas supply source 86 at a predetermined pressure is introduced into the buffer chamber 102 within the side wall of the chamber 10 through the second gas supply tube 106. In addition, the processing gas is jetted substantially horizontally from the respective side wall gas jet ports 104 to be diffused in the plasma generation space from the peripheral portion toward the central portion within the chamber 10.

In addition, the processing gases, which are respectively introduced from the upper gas introduction section 80 and the side gas introduction section 82 into the chamber 10, may be different kinds or the same kind of gases. The processing gases may be introduced into the chamber 10 at independent flow rates or an optional flow rate ratio through the MFCs 98, 108, respectively. For example, an inert gas as a plasma excitation gas may be introduced from the upper gas introduction section 80 and a film-forming gas as a process gas may be introduced from the side gas introduction section 82.

The control unit 112 includes a microcomputer and controls the operation of each of the components within the microwave plasma processing apparatus such as, for example, the exhaust apparatus 26, the high frequency power source 30, a switch 42 for the electrostatic chuck 36, the microwave generator 60, the upper gas introduction section 80, the side gas introduction section 82, the processing gas supply source 86, and a heat transfer gas supply unit (not illustrated) or the operations of the entire apparatus. In addition, the control unit 112 is connected with, for example, a touch panel for man-machine interface (not illustrated) and a storage device that stores data such as various programs or set values that define various operations of the plasma processing apparatus.

In order to perform, for example, etching in the microwave plasma processing apparatus, first, the gate valve 28 is opened and a semiconductor wafer to be processed W is carried into the chamber 10 and placed on the electrostatic chuck 36. Then, a processing gas, i.e. an etching gas (in general, a mixed gas) is introduced into the chamber 10 from the gas introduction section 80 or 82 at a predetermined flow rate, the pressure within the chamber is decompressed to a set value by the exhaust apparatus 26. For example, when etching a silicon oxide film, for example, a mixed gas of argon gas, a fluorine-containing hydrocarbon gas, and oxygen gas is used. In addition, a heat transfer gas (helium gas) is supplied to a contact interface of the electrostatic chuck 36 and the semiconductor wafer W from the heat transfer gas supply unit, and the switch 42 is turned ON to fix the semiconductor wafer W by the electrostatic attractive force of the electrostatic chuck 36. Then, the microwave generator 60 is turned ON so as to propagate microwaves, which are output from the microwave generator 60 with a predetermined power, from the microwave transmission line 58 and power is fed to the radial line slot antenna 55 so that the microwaves are radiated from the antenna 55 into the chamber 10. In addition, the high frequency power source 30 is turned ON to output RF bias high frequency waves with a predetermined power and the high frequency waves are applied to the bias electrode through the matching unit 32 and the power feeding rod 34.

The etching gases introduced into the plasma generation space within the chamber 10 from the gas jet ports 53 of the upper gas introduction section 80 and the gas jet ports 104 of the side gas introduction section 82 are ionized or dissociated by the microwave surface waves propagated radially along the bottom surface of the slot plate 54 and plasma. Thus, the plasma generated in the vicinity of the dielectric window 52 is diffused downward such that isotropic etching by radicals in the plasma and/or vertical etching by ion radiation are performed with respect to a film to be processed on the main surface of the semiconductor wafer W.

Important process conditions in the plasma etching as described above are gas species, flow rate, pressure of the etching gas, power of microwaves, and power of RF bias. Nowadays, as micronization of semiconductor devices is advanced, highly anisotropic and selective etching is requested in microwave plasma etching and the processing at a low pressure condition becomes more important. Meanwhile, in order to form high density and large diameter plasma so as to improve an etching speed, it is desirable to increase a power of microwaves. In addition, in order to improve throughput, it is desirable to reduce a pressure within a gas flow path of a gas introduction mechanism. It is also requested that various objects to be processed be etched in a desired shape and it is desirable that the above-described process conditions may be freely set without being limited by any other condition. Further, when a plurality of layers are processed at once, it may be requested, for example, that the first layer be processed at a low pressure condition and the second layer be processed at a high pressure condition. In such a case, it is requested that an intended processing be performed in either condition.

What is problematic under the requirements and operations of such a plasma process is that in the upper gas introduction section, abnormal electric discharge of the processing gas easily occurs in the vicinity of the inlets of dielectric window gas flow paths passing through the dielectric window (ceiling plate) and that plasma is introduced into the outlets of the dielectric window gas flow paths. These have been problems to be solved in the related art as described above.

In connection with this point, the microwave plasma processing apparatus of the present exemplary embodiment employs a configuration to be described below around the dielectric window gas flow paths 94($n$) of the dielectric window (ceiling plate) 52 so as to suppress abnormal electric discharge or introduction of plasma within the dielectric window gas flow paths 94($n$) or in the vicinity of inlets of the dielectric window gas flow paths 94($n$) even if the power of microwaves is arbitrarily increased or the pressure in the vicinity of the inlets of the dielectric window gas flow paths 94($n$) is arbitrarily decreased in order to perform a plasma process. In addition, the performance and reliability of the plasma processing can be improved.

Example 1 Concerning Configuration Around Dielectric Window Gas Flow Path

Figure 4:
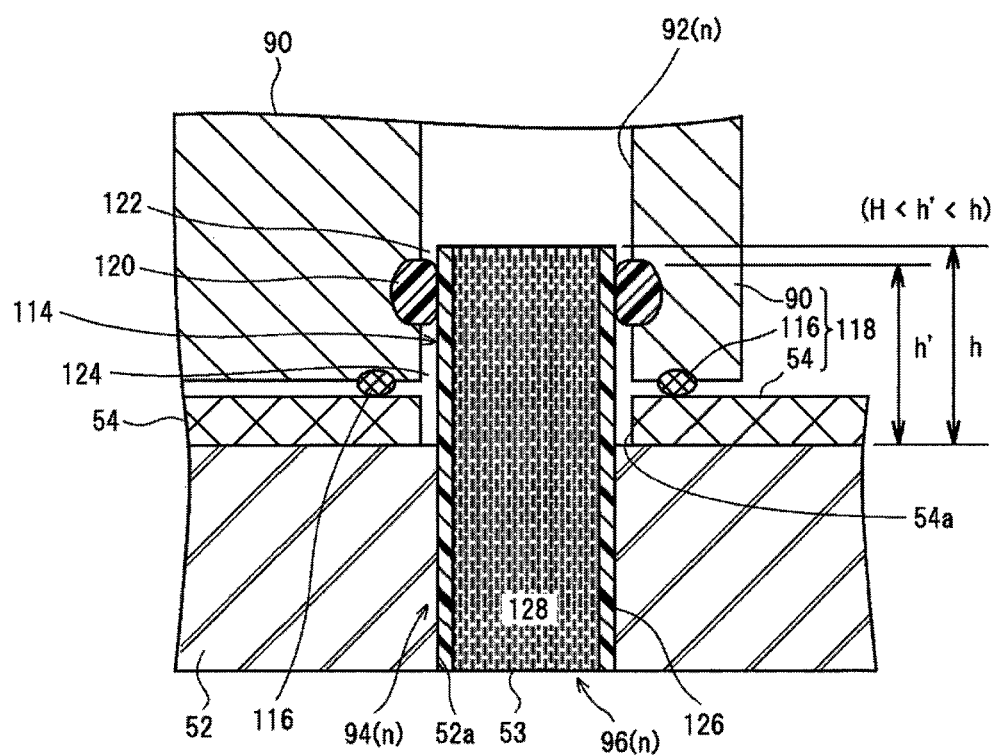
FIG. 4 is a partially enlarged cross-sectional view illustrating a configuration around a dielectric window gas flow path in Example 1.

FIG. 4 illustrates a configuration around a dielectric window gas flow path in Example 1. As illustrated, in the present example, each electric discharge prevention member 96($n$) provided in one of the dielectric window gas flow paths 94($n$) forms a whole of (or a part of) the corresponding dielectric window gas flow path 94($n$), and the inlet side portion 114 of the electric discharge prevention member 96($n$) protrudes upward by a height h which is equal to or longer than a predetermined distance H from the rear surface of the dielectric window 52 and is inserted into a branched gas supply. path 92(*n*) of the connector unit 90 through an opening 54*a* in the slot plate 54.

Here, an endless or ring-shaped conductor that surrounds the electric discharge prevention member 96(*n*), for example, a spring coil 116, is inserted between the bottom surface of the connector unit 90 and the top surface of the slot plate 54. In the present example, the connector unit 90, the spring coil 116 and the slot plate 54 that surround the protruding portion 114 of the electric discharge prevention member 96(*n*) form a surrounding conductor 118. In addition, the connector unit 90 and the slot plate 54 are electrically connected with each other through the spring coil 116, and electrically connected with the outer conductor 70 of the coaxial tube 66 through the inner conductor 68 of the coaxial tube 66 and the cooling jacket plate 72 (i.e., grounded), respectively.

In addition, for example, an endless or ring-shaped seal member, for example, an O-ring 120 is inserted between the protruding portion 114 of the electric discharge prevention member 96(*n*) and the connector unit 90 that surrounds the protruding portion 114. Above the O-ring 120 and around the protruding portion 114 of the electric discharge prevention member 96(*n*), an annular gap (gas groove) 122 is formed which communicates with the gas flow path. Meanwhile, an annular gap 124 formed below the O-ring 120 communicates with an atmospheric space.

When the annular gap (gas groove) 122 is formed above the O-ring 120 and around the protruding portion 114 of the electric discharge prevention member 96(*n*) as described above, it is desirable that the surrounding conductor 118 is configured to surround the protruding portion 114 over an extent h' which is equal to or longer than the predetermined distance H from the lower end position (most recessed position) of the annular gap (gas groove) 122.

The electric discharge prevention member 96(*n*) includes a cylinder portion 126 which is made of a dielectric material, for example, ceramics, and integrally formed in or bonded to the opening 52*a* in the dielectric window 52, and an air-permeable dielectric material 128 filled in the cylinder portion 126. The air-permeable dielectric material 128 is made of a porous dielectric material such as, for example, quartz, alumina, or ceramics such as aluminum nitride and is air-permeable since numerous fine pores connected with each other within the dielectric material 128.

When a plasma process is performed, in the upper gas introduction section 80, the pressing gas sent through the branched gas supply path 92(*n*) of the connector unit 90 at a predetermined pressure is adapted to enter the air-permeable dielectric material 128 from the inlet of the electric discharge prevention member 96(*n*) and exit the numerous fine pores in the air-permeable dielectric material 128 downward to be jetted from the gas jet port 53 at the terminal end of the air-permeable dielectric material 128. Since the air-permeable dielectric material 128 has the numerous fine pores as described above, the plasma in the plasma generation space is not introduced through the inside of the air-permeable dielectric material 128.

Meanwhile, the microwaves transmitted from the microwave generator 60 through the microwave transmission line 58 are propagated into the dielectric window 52 from the radial line slot antenna 55 and radiated toward the plasma generation space within the chamber 10. At this time, the microwaves penetrate the dielectric window 52 and the electric discharge prevention member 96(*n*). Therefore, the inside of the electric discharge prevention member 96(*n*) not only allow the processing gas to flow therethrough but also is exposed to microwave electric fields. In addition, the microwave electric fields are also propagated to the inside of the connector unit 90.

However, since the space of the gas plow paths (numerous fine pores) of the air-permeable dielectric material 128 is small within the electric discharge prevention member 96(*n*), electrons are hard to be accelerated therein even if the microwave electric fields are relatively strong. Accordingly, electric discharge hardly occurs.

In addition, the central microwave electric fields of the protruding portion 114 of the electric discharge prevention member 96(*n*) from the inside of the dielectric window 52 are attenuated by being reflected within a waveguide, i.e. the surrounding conductor 118, rather than within the dielectric window 52, or by an equivalent reactance. In addition, as the propagating distance of the microwave electric fields within the surrounding conductor 118 is increased, i.e. as the microwave electric fields progress to the inlet side of the electric discharge prevention member 96(*n*), the attenuation amount is increased at dB level in proportion to the entire length h of the protruding portion 114. Thus, the electric field strength in the vicinity of the inlet of the electric discharge prevention member 96(*n*) becomes lower than the electric field strength within the dielectric window 52.

Accordingly, when the microwave feeding power is arbitrarily increased or the pressure of the gas flow paths in the upper gas introduction section 80 is arbitrarily decreased, it is also possible to suppress the abnormal electric discharge in the vicinity of the inlet of the electric discharge prevention member 96(*n*) where the abnormal electric discharge easily occurs.

As an example, in the present exemplary embodiment, even when the microwave feeding power density (feeding power÷area of transmission window) was 2 W/cm$^2$ and the pressure within the gas groove 122 in the vicinity of the inlet of the electric discharge prevention member 96(*n*)) was decreased to 90 Tor, no abnormal electric discharge occurred in the vicinity of the gas groove 122.

In the present example, the plurality of branched gas supply paths 92(1) to 92(8) formed within the substantially conical connector unit 90 connected with the terminal end of the gas flow path 84 of the coaxial tube 66 were connected to the inlets of the electric discharge prevention members 96(1) to 96(8) at the dielectric window 52 side, respectively, as external gas supply paths. As a modified example, a configuration, in which a plurality of (e.g., eight (8)) independent conductor tubes branched in parallel to each other from the terminal end of the gas flow path 84 of the coaxial tube 66 are connected to the inlets of the electric discharge prevention members 96(1) to 96(8), respectively, as the external gas supply paths, is also possible.

[Method of Fabricating and Attaching Electric Discharge Prevention Member]

A method of fabricating an electric discharge prevention member 96(*n*) and attaching the electric discharge prevention member 96(*n*) to a dielectric window 52 will be described with reference to FIGS. 5A to 5C.

Figure 5A:
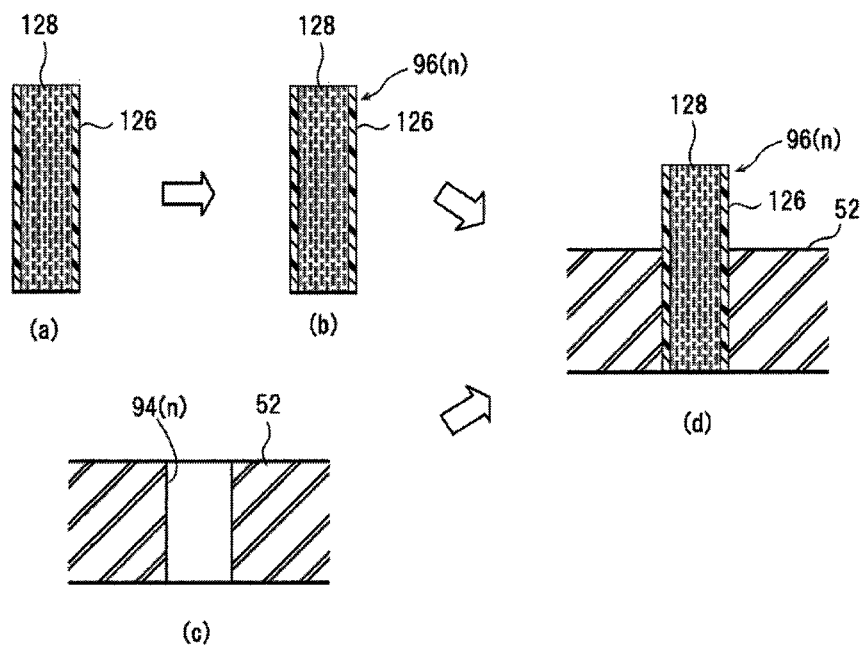
FIG. 5A is a view illustrating a method of fabricating and attaching an electrical discharge prevention member to a dielectric window.

As illustrated in FIG. 5A, in a first method, a porous dielectric material 128 is filled in a cylindrical ceramic green body 126 (step (a)), and the porous dielectric material 128 and the cylindrical ceramic green body 126 are integrally bonded to each other by baking them at a predetermined temperature to be thermally shrunk and solidified (step (b)). Meanwhile, a through hole for use as the dielectric window gas flow path 94(*n*) is formed in the dielectric window 52 in the state of green body (step (c)). The electric discharge prevention member 96(n) is integrally formed in the dielectric window 52 by inserting the integrated rod-shaped dielectric material 126, 128 after the baking process, i.e. the electric discharge prevention member 96(n), into the through hole of the dielectric window 52 of the green body, and baking the dielectric window 52 and the electric discharge prevention member 96(n) at a temperature not higher than a distortion point (step (d)).

Figure 5B:
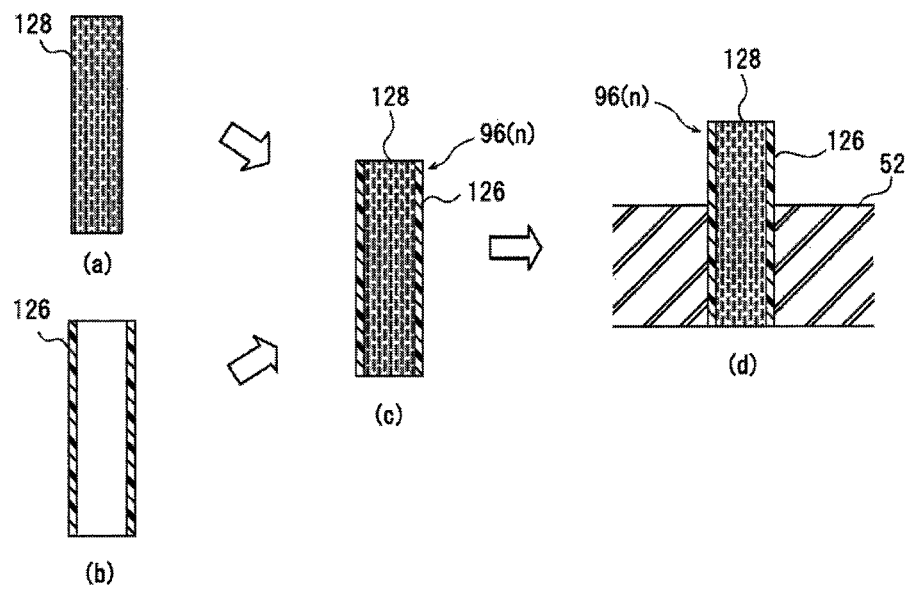
FIG. 5B is another method of fabricating and attaching the electrical discharge prevention member to the dielectric window.

As illustrated in FIG. 5B, in a second method, a porous dielectric material 128 is inserted into a cylindrical ceramic green body 126 (steps (a) and (b)), an electric discharge prevention member 96(n) is fabricated by integrally baking the porous dielectric material 128 and the cylindrical ceramic green body 126 at a predetermined temperature (c), and the electric discharge prevention member 96(n) is inserted into a through hole previously formed in a dielectric window 52 and integrally bonded to the dielectric window 52 by an adhesive (step (d)).

Various dielectric materials may be used for the cylindrical portion 126 and the porous dielectric material 128 of the electric discharge prevention member 96(n) without being limited to quartz, alumina and aluminum nitride.

Modified Example of Example 1

FIGS. 6A to 6H illustrate several modified examples in Example 1. In the modified example of FIG. 6A, a cylindrical conductor (collar) 132 extending upward from the rear surface of the dielectric window 52 to a position in the vicinity of the O-ring 120 is fitted on the outer circumferential surface of the protruding portion 114 of the electric discharge prevention member 96(n). In addition, an annular or endless flexible conductor, for example, a spring coil 134 is inserted between the outer circumferential surface of the conductor collar 132 and the inner circumferential surface of the connector unit (or the external gas tube) 90. Between the lower end of the connector unit (or the external gas tube) 90 and the top surface (rear surface) of the dielectric window 52, a gap 136 may occur due to, for example, an assembling error or thermal expansion of each member. In the present modified example, the surrounding conductor 118 is segmented into a plurality of conductor members 90, 134, 132 along the electric discharge prevention member 96(n). In addition, a configuration, in which the slot plate 54 is omitted from the surrounding conductor 118 as in the present modified example, is also possible.

In such a configuration, the surrounding conductor 118 that surrounds the protruding portion 114 of the electric discharge prevention member 96(n) over the entire length of the protruding portion 114 is formed by the connector unit (or the external gas tube) 90, the spring coil 134, and the conductor collar 132. According to this configuration, an electric variation of the surrounding conductor 118 may be suppressed even if the gap 136 has occurred between the connector unit (or the external gas tube) 90 and the dielectric window 52.

Figure 6A:
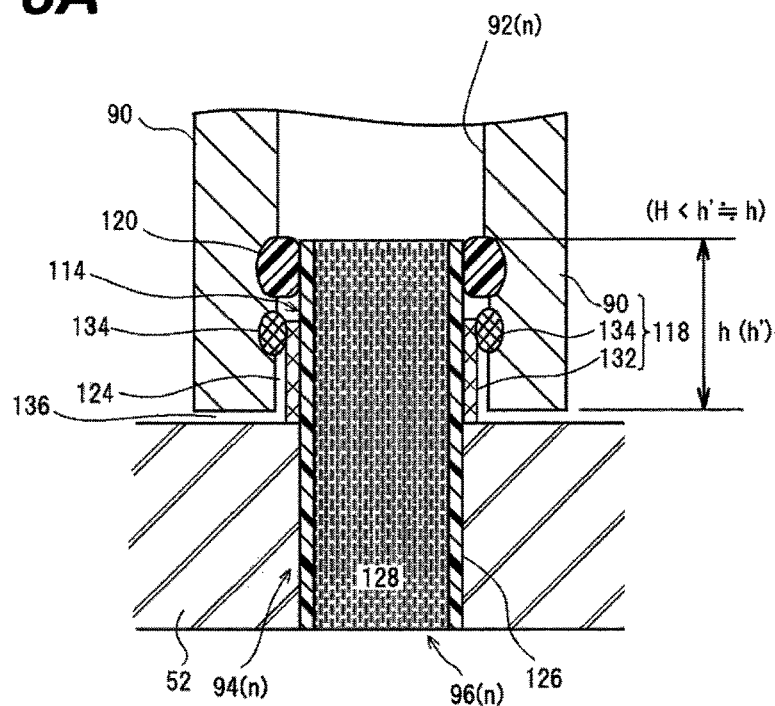
FIG. 6A is a partially enlarged cross-sectional view illustrating a modified example of Example 1 concerning the configuration around the dielectric window gas flow path.

In addition, as illustrated in FIG. 6A, it is desirable to locate the attaching position of the O-ring 120 close to the inlet of the electric discharge prevention member 96(n). Then, the distance h from the height position of the inlet of the electric discharge prevention member 96(n) to the height position of the lower end of the surrounding conductor 118 and the distance h' from the height position of the lower end of the gas groove 122 (the most recessed position) to the height position of the lower end of the surrounding conductor 118 may be made to be substantially equal to each other.

In such a case, the gas groove 122 (FIG. 4) formed around the protruding portion 114 is negligibly small.

Figure 6B:
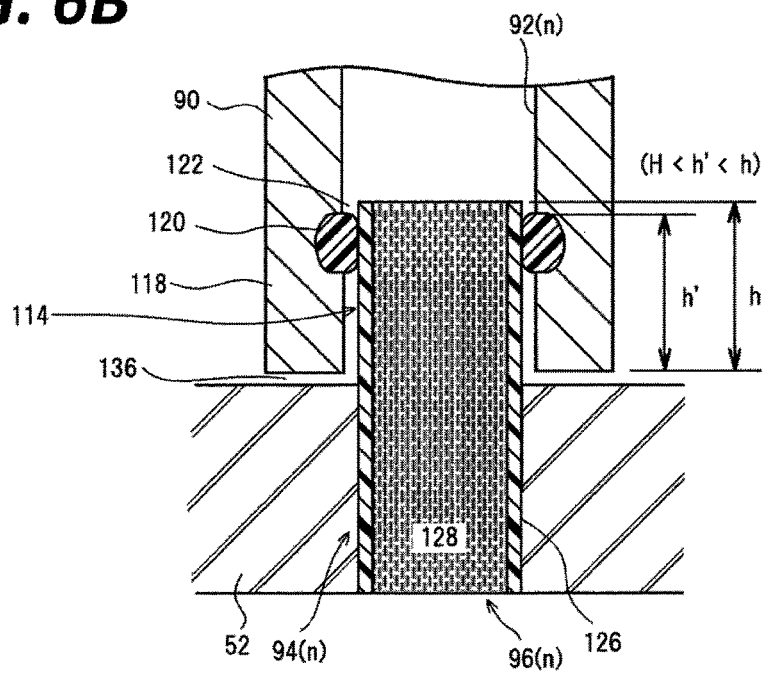
FIG. 6B is a partially enlarged cross-sectional view illustrating another modified example concerning the configuration around the dielectric window gas flow path.
Figure 6C:
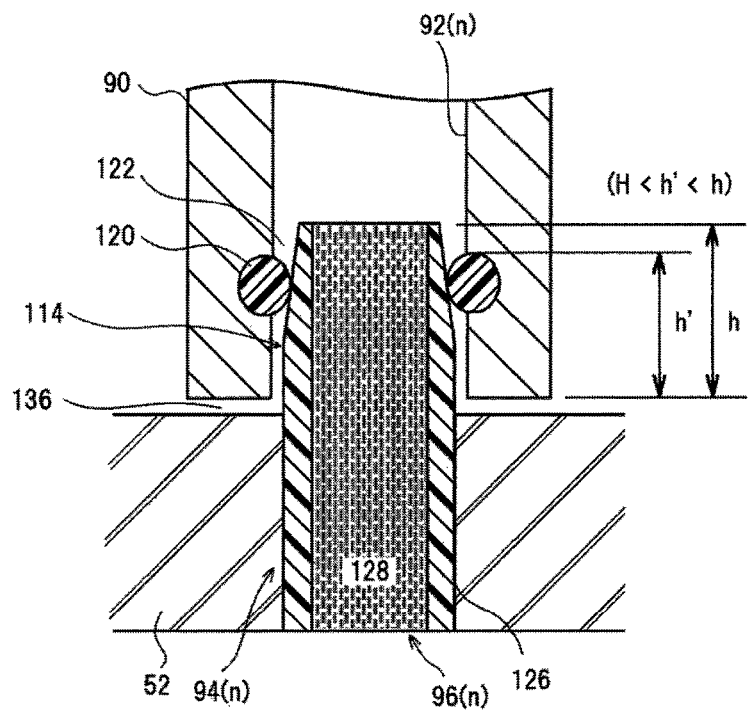
FIG. 6C is a partially enlarged cross-sectional view illustrating another modified example concerning the configuration around the dielectric window gas flow path.

In the modified example of FIG. 6B, the conductor collar 132 and the spring coil 134 are omitted from the modified example of FIG. 6A as described above. In the modified example of FIG. 6C, the tip end of the protruding portion 114 of the electric discharge prevention member 96(n) in the modified example of FIG. 6B is formed in a taper shape. As in FIGS. 6B and 6C, the surrounding conductor 118 may be configured using a single body of a conductor member (connector unit 90).

Figure 6D:
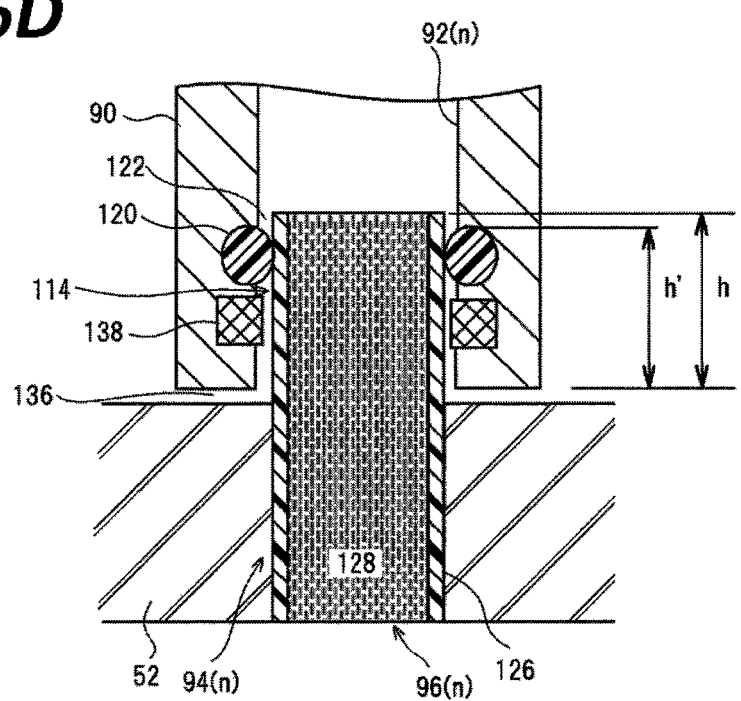
FIG. 6D is a partially enlarged cross-sectional view illustrating another modified example concerning the configuration around the dielectric window gas flow path.

In the modified example of FIG. 6D, a ring-shaped electromagnetic field absorption member 138 made of, for example, a ferrite is provided between the outer circumferential surface of the protruding portion 114 of the electric discharge prevention member 96(n) and the inner circumferential surface of the connector unit (or gas branch tube) 90. In such a case, electric fields of microwaves propagated from the inside of the dielectric window 52 along the inside of the protruding portion 114 of the electric discharge prevention member 96(n) from the top are attenuated by being reflected within the surrounding conductor 118 or by an equivalent reactance, and further attenuated by being absorbed to the electromagnetic field absorption member 138. Thus, the entire length of the protruding portion 114 and the entire length h of the surrounding conductor may be reduced (to be shorter than the predetermined distance H).

Figure 6E:
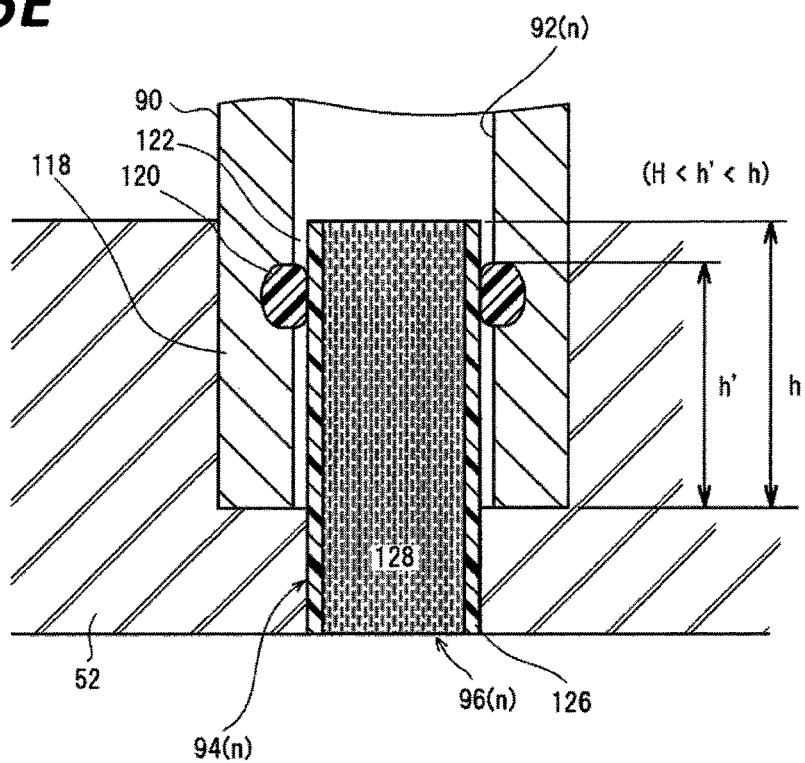
FIG. 6E is a partially enlarged cross-sectional view illustrating still another modified example concerning the configuration around the dielectric window gas flow path.
Figure 6F:
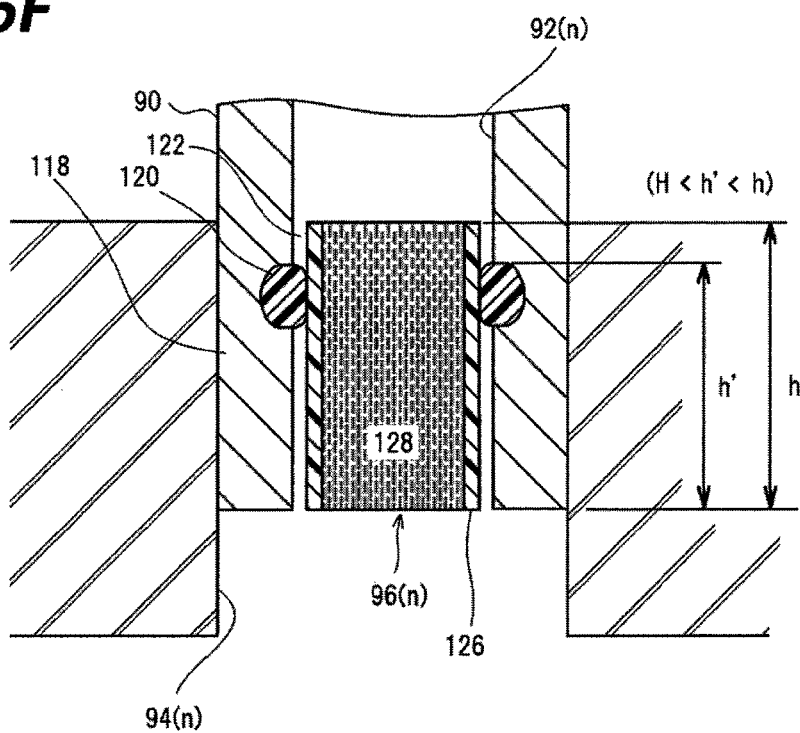
FIG. 6F is a partially enlarged cross-sectional view illustrating still another modified example concerning the configuration around the dielectric window gas flow path.

FIG. 6E illustrates a modified example in which the surrounding conductor 118 is embedded in the dielectric window 52. In the present modified example, the connector unit (or the external gas tube) 90 forms the surrounding conductor 118 as a single body. In addition, a configuration, in which a separate conductor (not illustrated) connected with the connector unit (or the external gas tube) 90 is embedded in the dielectric window 52 as the surrounding conductor 118, is also possible. In addition, in the present modified example, the inlet of the electric discharge prevention member 96(n) is positioned at a height which is substantially equal to that of the rear surface of the dielectric window 52. Accordingly, the electric discharge prevention member 96(n) is not provided with the protruding portion 114. Further, as illustrated in FIG. 6F, a configuration, in which the electric discharge prevention member 96(n) is terminated in front of the outlet of the dielectric window gas flow path 94(n) (inside when viewed from the plasma generation space) within the dielectric window 52, is also possible.

Figure 6G:
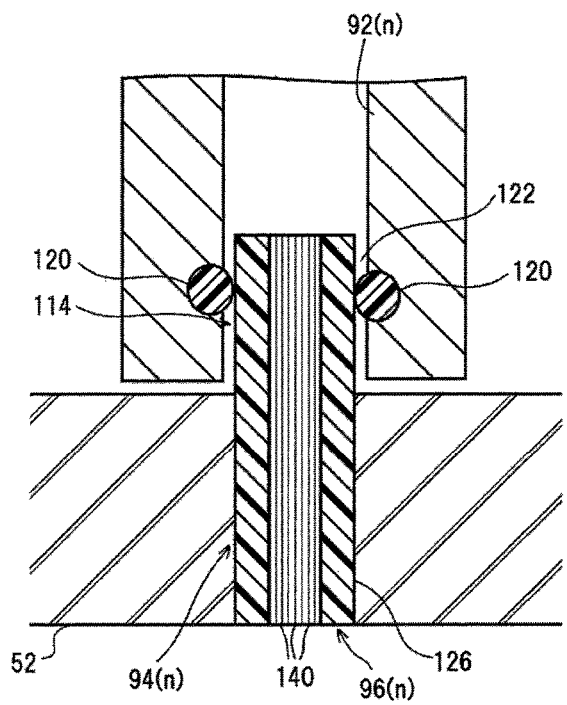
FIG. 6G is a partially enlarged cross-sectional view illustrating still another modified example concerning the configuration around the dielectric window gas flow path.

The modified example of FIG. 6G relates to a structure of the electric discharge prevention member 96(n). An air-permeable electric discharge prevention member 96(n) is formed using a dielectric material (e.g., ceramics) having a plurality of extra fine through holes 140 extending in the axial direction.

Figure 6H:
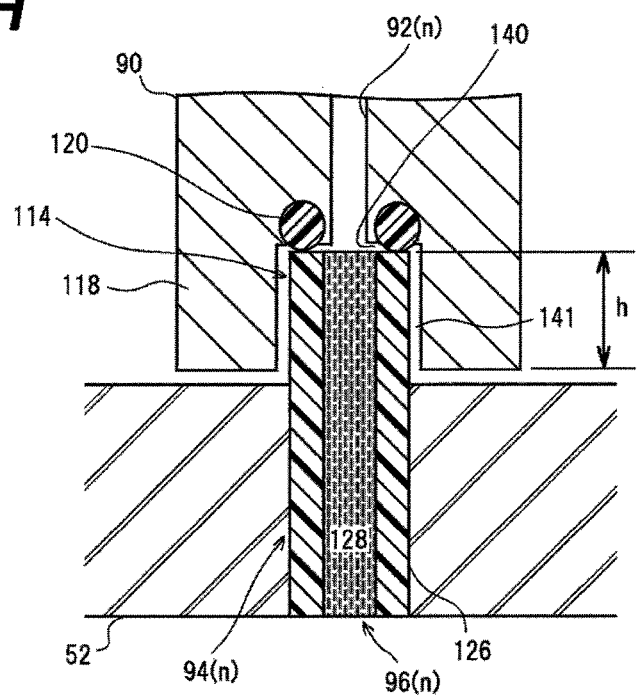
FIG. 6H is a partially enlarged cross-sectional view illustrating yet another modified example concerning the configuration around the dielectric window gas flow path.

In the modified example of FIG. 6H, for example, an endless seal member, for example, an O-ring 120, is provided between the end surface at the inlet of the electric discharge prevention member 96(n) and the outlet (terminal end) of the connector unit (or external gas tube) 90. In such a case, the gap 141 occurring on the outer circumference of the protruding portion 114 of the electric discharge prevention member 96(n) communicates with the atmospheric space. In the configuration in which the O-ring 120 is disposed on the inlet end surface of the electric discharge prevention member 96(n) as described above, a gap (gas groove) 140 where electric fields are easily concentrated is formed radially inside the O-ring 120. However, in the present modified example, as described above, the electric fields of microwaves propagated from the inside of the dielectric window 52 along the inside of the protruding portion 114 of the electric discharge prevention member 96(n) from the top are attenuated by being reflected within the surrounding conductor 118 or by an equivalent reactance. Therefore, the electric field strength in the vicinity of the inlet of the electric discharge prevention member 96(n) becomes smaller than the electric field strength inside the dielectric window 52 and as a result, electric discharge hardly occurs even in the gap (gas groove) 140 inside the O-ring 120.

Figure 6I:
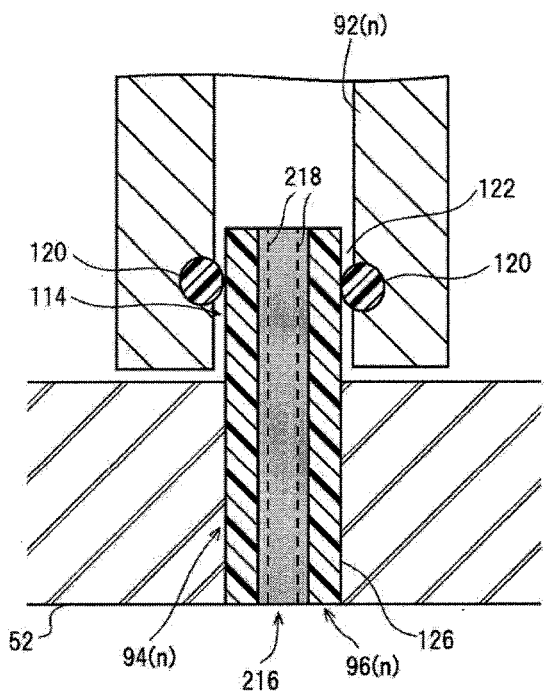
FIG. 6I is a partially enlarged cross-sectional view illustrating yet another modified example concerning the configuration around the dielectric window gas flow path.
Figure 6J:
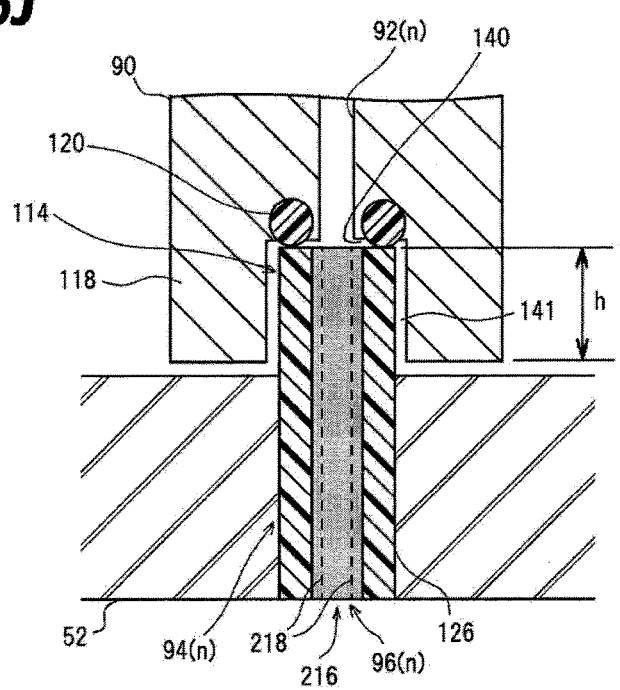
FIG. 6J is a partially enlarged cross-sectional view illustrating yet another modified example concerning the configuration around the dielectric window gas flow path.

The modified examples of FIGS. 6I and 6J are characterized in that, in the electric discharge prevention member 96(n) of the modified examples of FIGS. 6G and 6H, a nozzle piece 216 made of a dielectric material and having longitudinal grooves 218 in Example 9 to be described later is filled in the cylinder portion 126.

[Condition Concerning Distance Range of Surrounding Conductor]

As described above, Example 1 has a configuration which, in the inlet side of the dielectric window gas flow path 94(n) of the dielectric window (ceiling plate) 52, surrounds the air-permeable electric discharge prevention member 96(n) provided in the dielectric window gas flow path 94(n) at least in the vicinity of the inlet of the air-permeable electric discharge prevention member 96(n). The electric discharge prevention member 96(n) is surrounded by the electrically grounded surrounding conductor 118 from its inlet toward the outlet (gas jet port) over an extent h which is equal to or longer than the predetermined distance H. Due to this, the electric field strength in the vicinity of the inlet of the electric discharge prevention member 96(n) is decreased to be lower than the electric field strength within the dielectric window 52, thereby suppressing abnormal electric discharge.

In this configuration, as the extent (distance) h of the electric discharge prevention member 96(n) surrounded by the surrounding conductor 118 is increased, the electric field strength in the vicinity of the inlet may be decreased such that the effect of suppressing abnormal electric discharge can be enhanced. Meanwhile, the protruding amount of the protruding portion 114 of the electric discharge prevention member 96(n) is increased or the embedded amount of the surrounding conductor 118 embedded in the dielectric window 52 (FIGS. 6E and 6F) is increased. In the viewpoint of, for example, complicating an apparatus structure and increasing costs, it is desirable to make the surrounding extent (distance) h close to the required minimum distance H.

Assuming that the wavelength of microwaves 2.45 GHz is $\lambda_d$ when the microwaves are propagated in the dielectric material of the electric discharge prevention member 96(n), the surrounding extent (distance) of the surrounding conductor 118 is H, and the inner diameter of the surrounding conductor 118 or the length of a major axis of a maximum inscribed ellipse of the surrounding conductor 118 is D, the inventors have calculated correlations among the parameters H, $\lambda_d$, D with respect to the electric field strength reduction effect (electric field strength reduction ratio) of the surrounding conductor 118 using an electromagnetic field calculation simulation. The results are represented in FIGS. 7 and 9.

Figure 7:
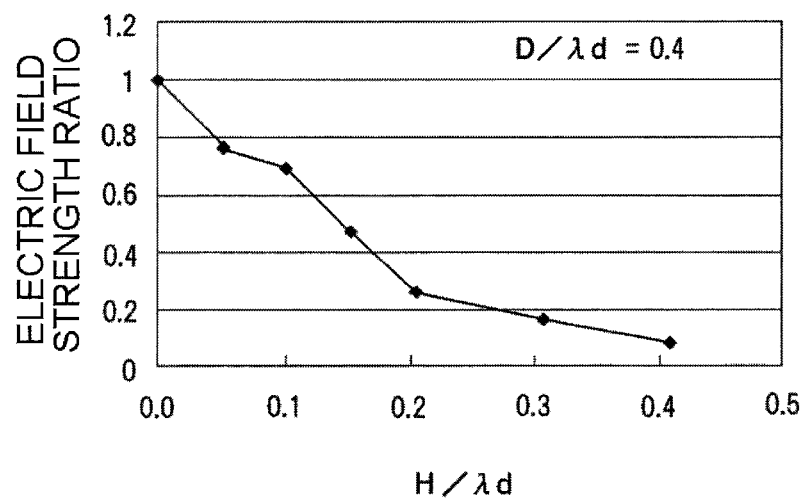
FIG. 7 is a plotted diagram representing an $H/\lambda_d$ dependency of an electric field strength ratio in a case where $D/\lambda_d=0.4$.
Figure 9:
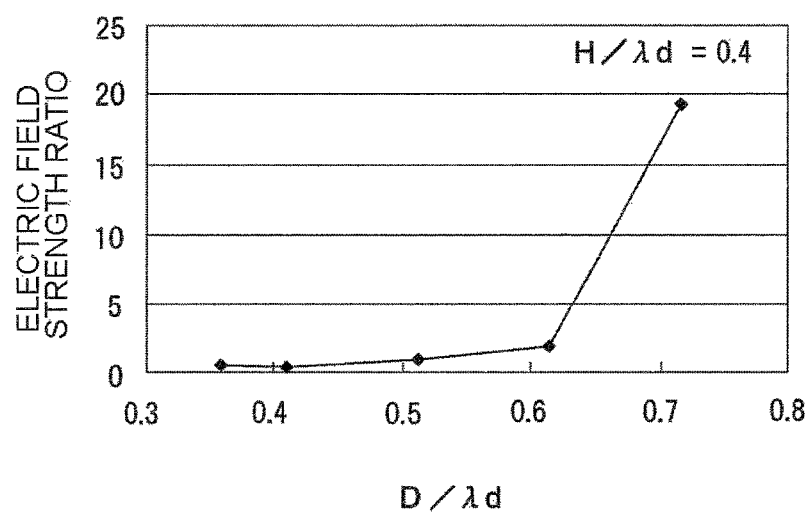
FIG. 9 is a plotted diagram representing a $D/\lambda_d$ dependency of an electric field strength ratio in a case where $H/\lambda_d=0.4$.

That is, an $H/\lambda_d$ dependency of an electric field strength ratio when $D/\lambda_d=0.4$ is represented in FIG. 7, and a $D/\lambda_d$ dependency of an electric field strength ratio when $H/\lambda_d=0.4$ is represented in FIG. 9.

Figure 8:
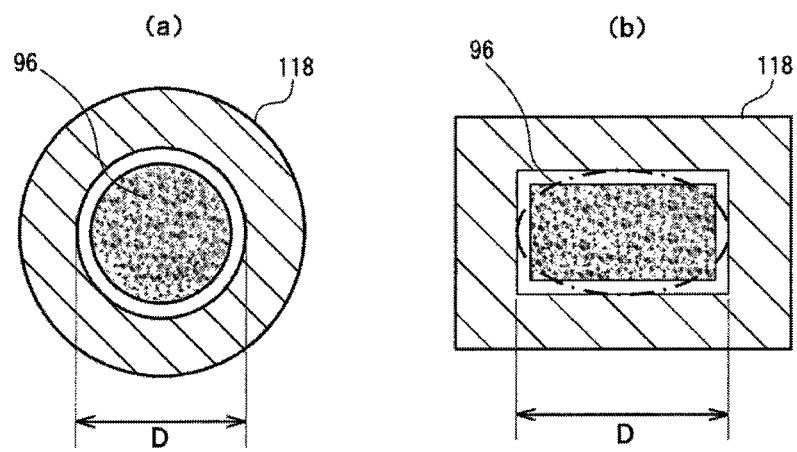
FIG. 8 is a cross-sectional view representing a definition of an inner diameter or a length of a major axis of a maximum inscribed ellipse of a surrounding conductor.

As illustrated in FIG. 8A, when the electric discharge prevention member 96(n) and the surrounding conductor 118 have a circular cross section, the inner diameter of the surrounding conductor 118 is used in the attribute D. In addition, as illustrated in FIG. 8B, when the electric discharge prevention member 96(n) and the surrounding conductor 118 have a rectangular cross section, the length of the major axis of the maximum inscribed ellipse of the surrounding conductor 118 is used in the attribute D.

From FIG. 7, it can be seen that when H is set to be larger than 0.05 times of $\lambda_d$ (or H is set to be larger than 0.13 times of D), the electric field strength may be reduced by 20% or more. In addition, when H is set to be larger than 0.2 times of $\lambda_d$ (or H is set to be larger than 0.5 times of D), the electric field strength may be reduced by 80% or more.

Meanwhile, as represented in FIG. 9, when D exceeds 0.6 times of $\lambda_d$, the action of the surrounding conductor 118 as an attenuator deteriorates. Accordingly, it is desirable that the condition of $D \leq 0.6\lambda_d$ is satisfied.

As a specific example, for example, when the electric discharge prevention member (dielectric material) of the electric discharge prevention member 96(n) is alumina, the wavelength $\lambda_d$ is about 38 mm, and the inner diameter of the surrounding conductor 118 or the length of the major axis of the maximum inscribed ellipse of the surrounding conductor 118, D, is about 24 mm, H=8 mm.

Applied Example of Example 1

Figure 10:
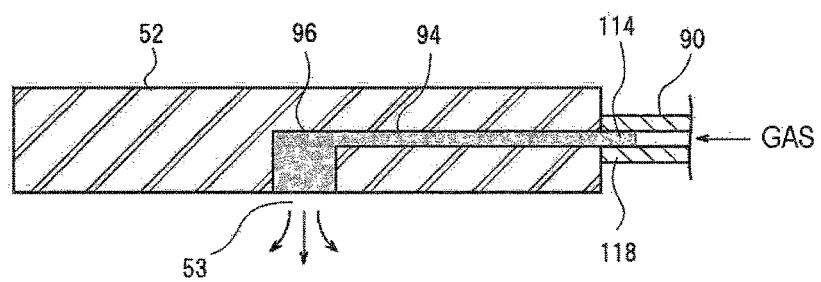
FIG. 10 is a view illustrating a modified example in a case where an inlet of the dielectric window gas flow path is provided in a side surface of the dielectric window.

As illustrated in FIG. 10, a configuration, in which the inlet of the dielectric window gas flow path 94 is disposed on a side surface of the dielectric window 52 rather than on the rear surface (top surface) of the dielectric window 52, is also possible. Even in this case, a configuration, in which the electric discharge prevention member 96 provided in the dielectric window gas flow path 94 has a protruding portion 114 as described above and a surrounding conductor 118 which is the same as that described above surround the protruding portion 114, may be properly employed.

Example 2 Concerning Configuration Around Dielectric Window Gas Flow Path

Figure 11:
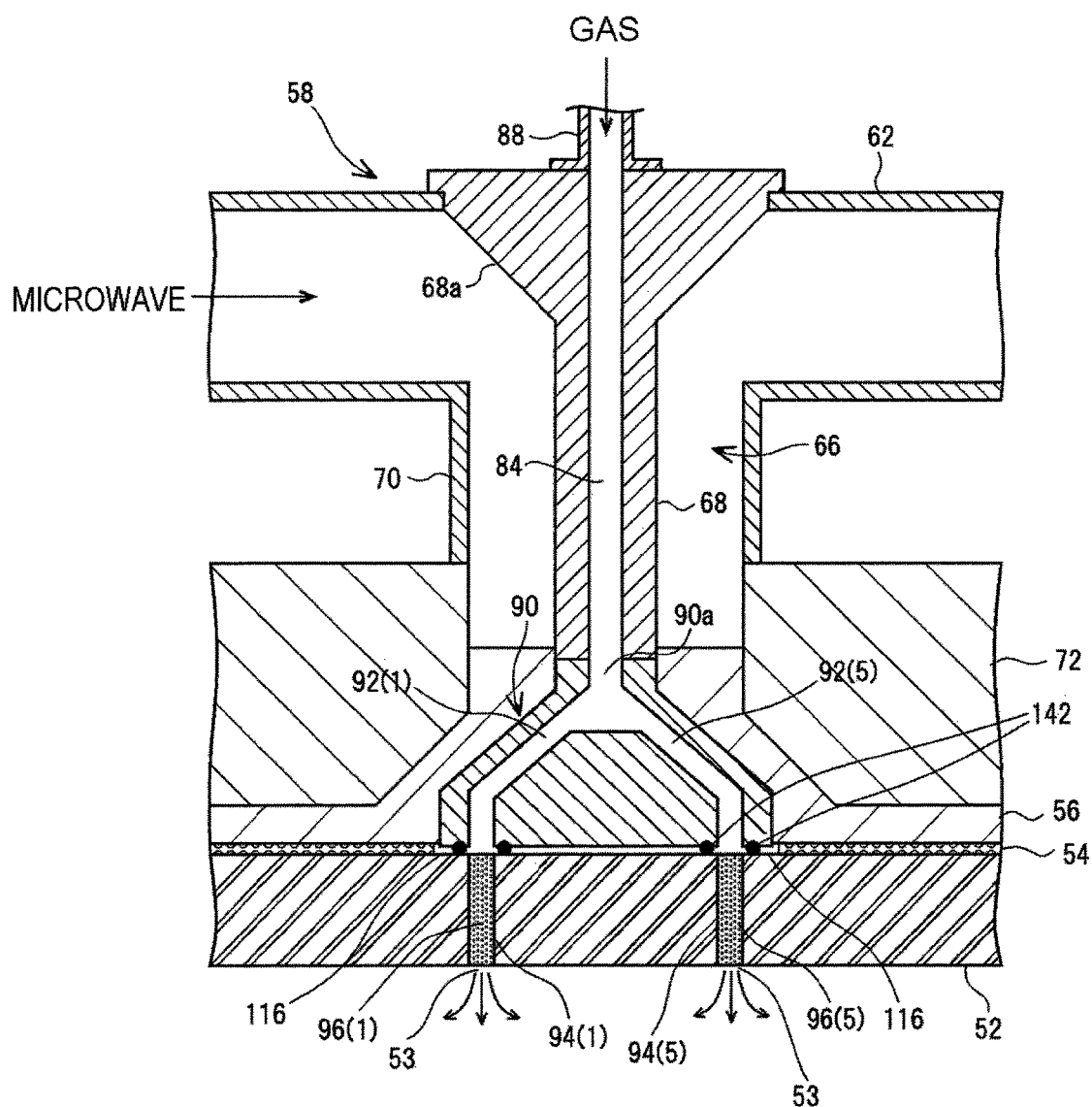
FIG. 11 is a cross-sectional view illustrating a configuration around dielectric window gas flow paths in Example 2.
Figure 12:
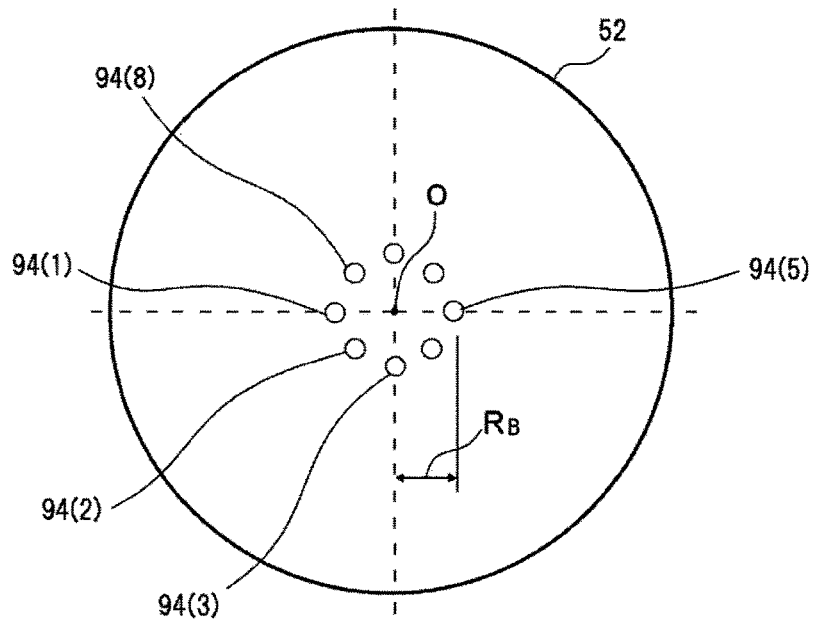
FIG. 12 is a plan view illustrating arranged positions (layout) of the dielectric window gas flow paths in the configuration of FIG. 11.

FIG. 11 illustrates a configuration around a dielectric window gas flow path in another viewpoint (Example 2) of the present disclosure. Also in the present exemplary, dielectric window gas flow paths 94(n) of a dielectric window 52 are preferably arranged at equidistant intervals on a circumference of a predetermined distance (radius) RB from the center O of a dielectric window 52 (FIG. 12) and connected to branched gas supply paths 92(n) of a connector unit 90, respectively. In addition, as in Example 1 as described above, each of the dielectric window gas flow paths 94(n) is provided with an air-permeable electric discharge prevention member 96(n) made of a dielectric material. However, since the inlet side portion of the electric discharge prevention member 96(n) is not configured to protrude upward from the rear surface of the dielectric window 52, no surrounding conductor 118 is provided around the electric discharge prevention member 96(n). In such a case, an endless seal member, for example, an O-ring 142 is inserted between the connector unit 90 and the dielectric window 52 so as to seal the vicinity of the inlet of each dielectric window gas flow path 94(n).

As described above in connection with the prior art, in a microwave plasma processing apparatus including a gas flow path through a dielectric window, abnormal electric discharge of a processing gas may occur in a gap (gas groove) formed in a portion where the outlet of an external gas tube from a processing gas supply unit and the inlet of the dielectric window gas flow path are connected with each other (a gap (gas groove) formed inside the O-ring (within the gas flow path)). Typically, the gap inside the O-ring has the same size as the gap in the outside the O-ring (atmospheric space) and is managed to be equal to or less than 0.2 mm so as to secure a complete seal function.

Figure 13A:
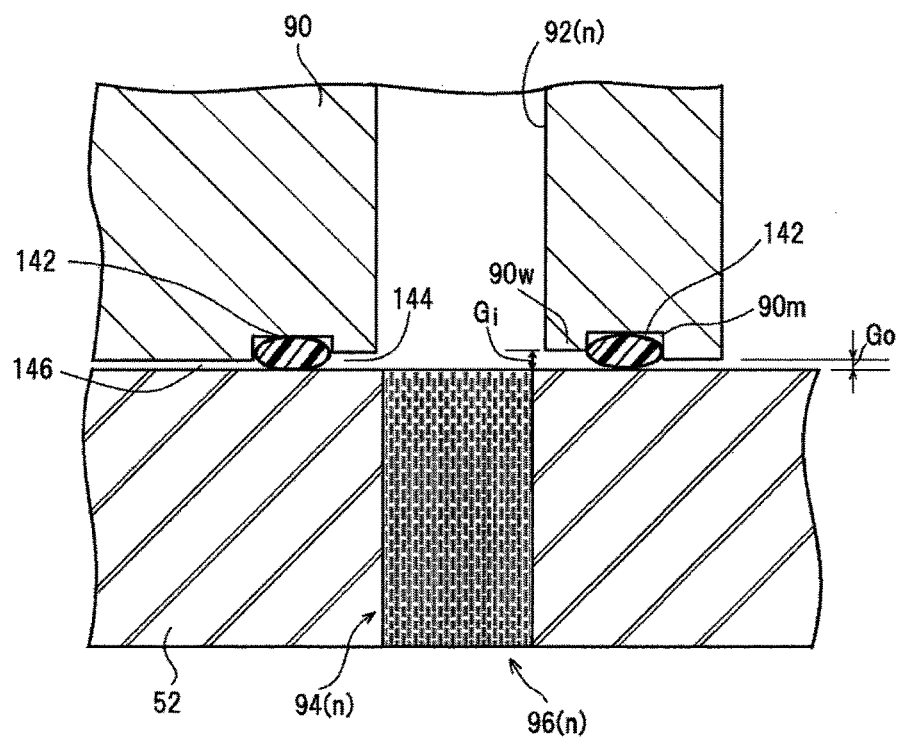
FIG. 13A is a partially enlarged cross-sectional view illustrating a main portion of the configuration of FIG. 11 in an enlarged scale.
Figure 13B:
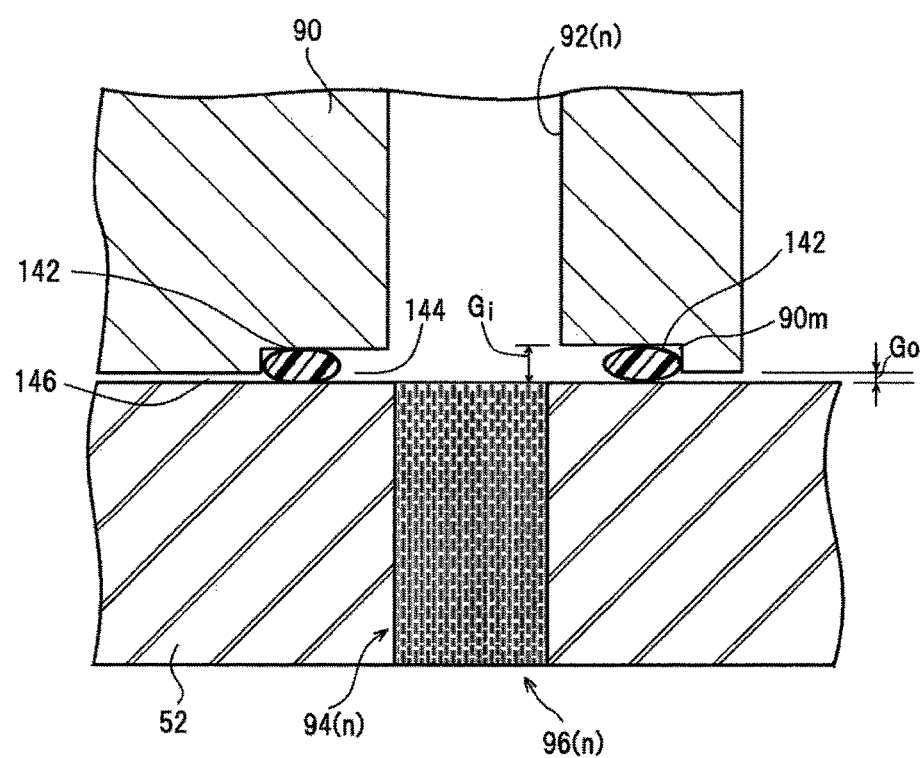
FIG. 13B is a partially enlarged cross-sectional view illustrating a modified example of a main portion of the configuration of FIG. 11 in an enlarged scale.

As illustrated in FIGS. 13A and 13B, the present example is characterized in that the gap 144 inside the O-ring 142 (within the gas flow path) is formed to have a larger gap size than the gap 146 outside the O-ring 142 (atmospheric space) ($G_i > G_o$). The inventors have verified by a simulation that the electric field strength in the vicinity of the inlet of the dielectric window gas flow path 94(n), in particular the electric field strength in the gap 144 inside the O-ring 142 may be effectively reduced by the configuration as described above.

Figure 14:
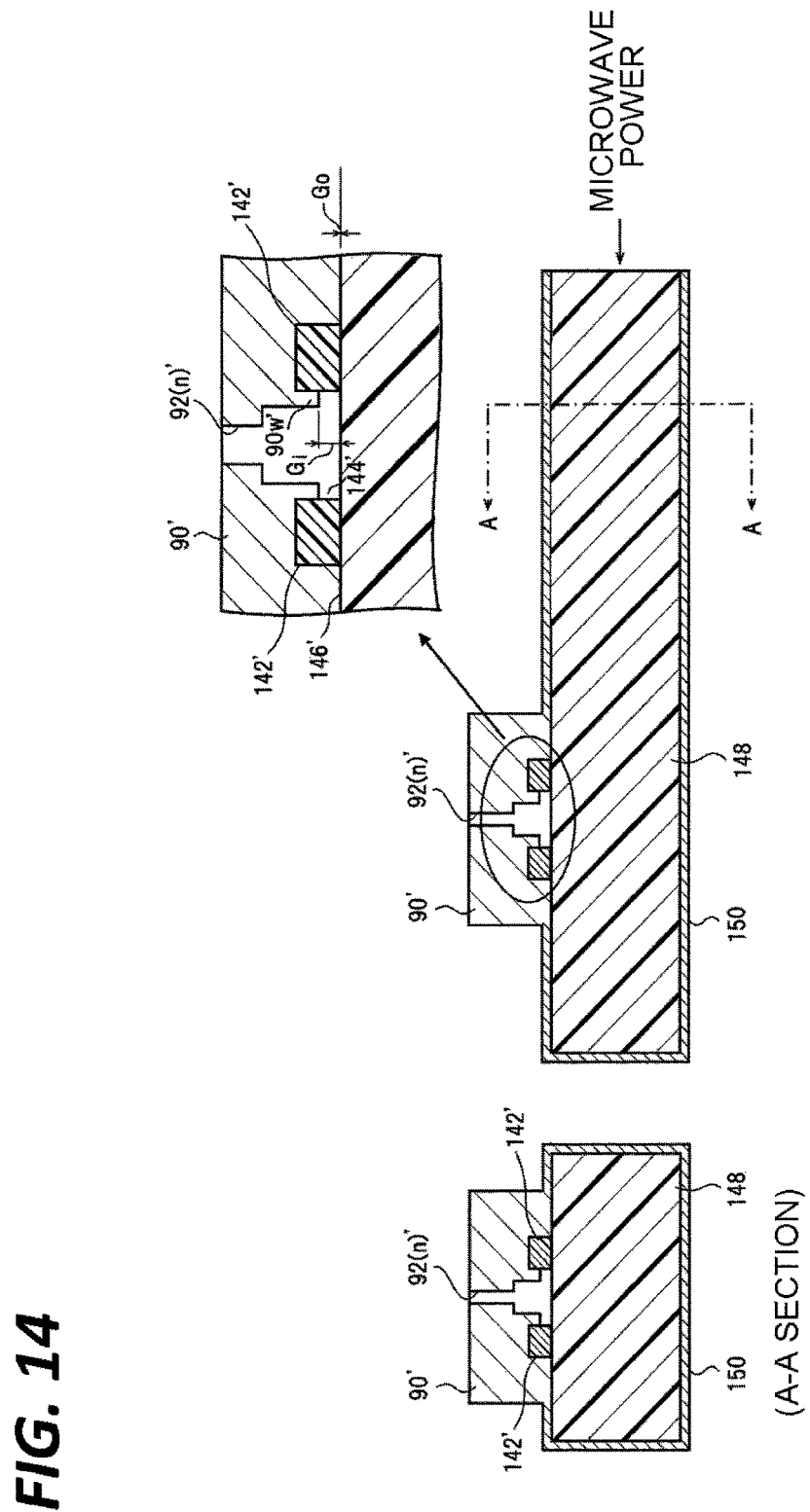
FIG. 14 is a view illustrating a configuration of a model which was used for calculating electromagnetic fields in Example 2.

The simulation was performed using a model in which a gas introduction section 90' made of a metal is connected, through an O-ring 142', to a side surface in the vicinity of a closed end of a rectangular waveguide (with a cross-sectional size of 35 mm×17.5 mm) filled with a dielectric material 148 made of alumina as illustrated in FIG. 14. The dielectric material 148 of the model corresponds to the dielectric window 52 and the electric discharge prevention member 96(n) of FIG. 13A, the O-ring 142' corresponds to the O-ring 142 of FIG. 13A, and the gas introduction section 90' corresponds to the connector unit 90 of FIG. 13A. In addition, the gap 144' inside the O-ring 142' corresponds to the gap 144 inside the O-ring 142 of FIG. 13A. In addition, the gap 146' outside the O-ring 142' corresponds to the gap 146 outside the O-ring 142 of FIG. 13A. In the simulation, the gap size $G_o$ of the gap outside the O-ring 142' was set to 0.1 mm (a fixed value).

Figure 15:
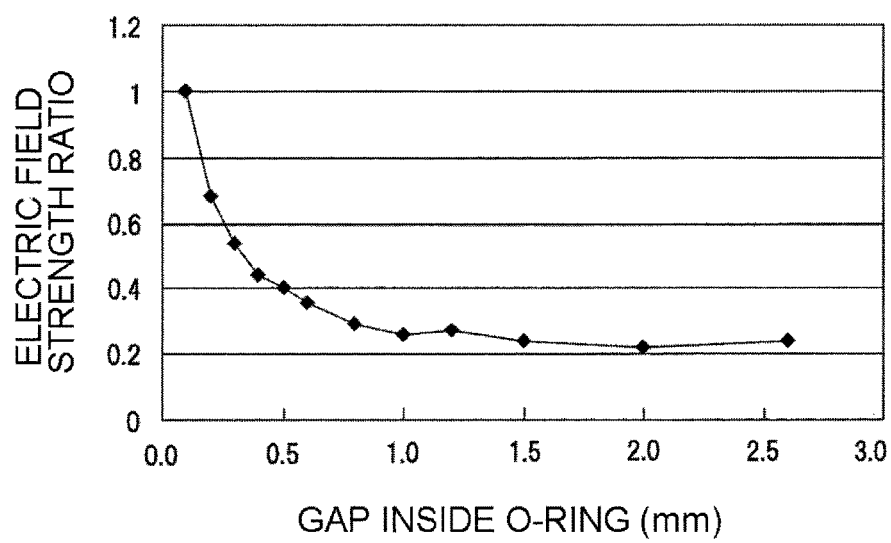
FIG. 15 is a plotted diagram representing the calculated results of the electromagnetic fields.

FIG. 15 illustrates a simulation result of a relative value of an electric field strength (electric field strength ratio) in the gap (gas groove) 144) when the gap size $G_i$ of the gap (gas groove) 144 inside the O-ring 142 was changed from 0.1 mm (reference value) to 2.6 mm) as a parameter.

As illustrated, the electric field strength in the gap (gas groove) 144' inside the O-ring 142') logarithmically decreases as the gap size $G_i$ increases. More specifically, the electric field strength ratio decreases to about 0.5 at $G_i$=0.3 mm, decreases to about 0.4 at $G_i$=0.5 mm, and gradually approaches about 0.2 at $G_i \geq 1.0$ mm. From the simulation result, it can be seen that a range of $G_i \geq 0.3$ mm is desirable in order to half the electric filed strength in the gap (gas groove) 144 inside the O-ring 142. Further, it can be seen that a range of 0.5 mm≤Gi≤1.0 mm is desirable in order to reduce the electric field strength in the gap (gas groove) 144 inside the O-ring 142 while securing a good sealing function.

In addition, as illustrated in FIG. 13B, a configuration, in which a wall portion 90w (FIG. 13A) is not provided inside the O-ring 142 on the bottom surface of the connector unit 90, may also be acceptable. With this configuration, fabrication of an O-ring fitting groove 90m and mounting of the O-ring 142 in the connector unit 90 may be facilitated.

Figure 16:
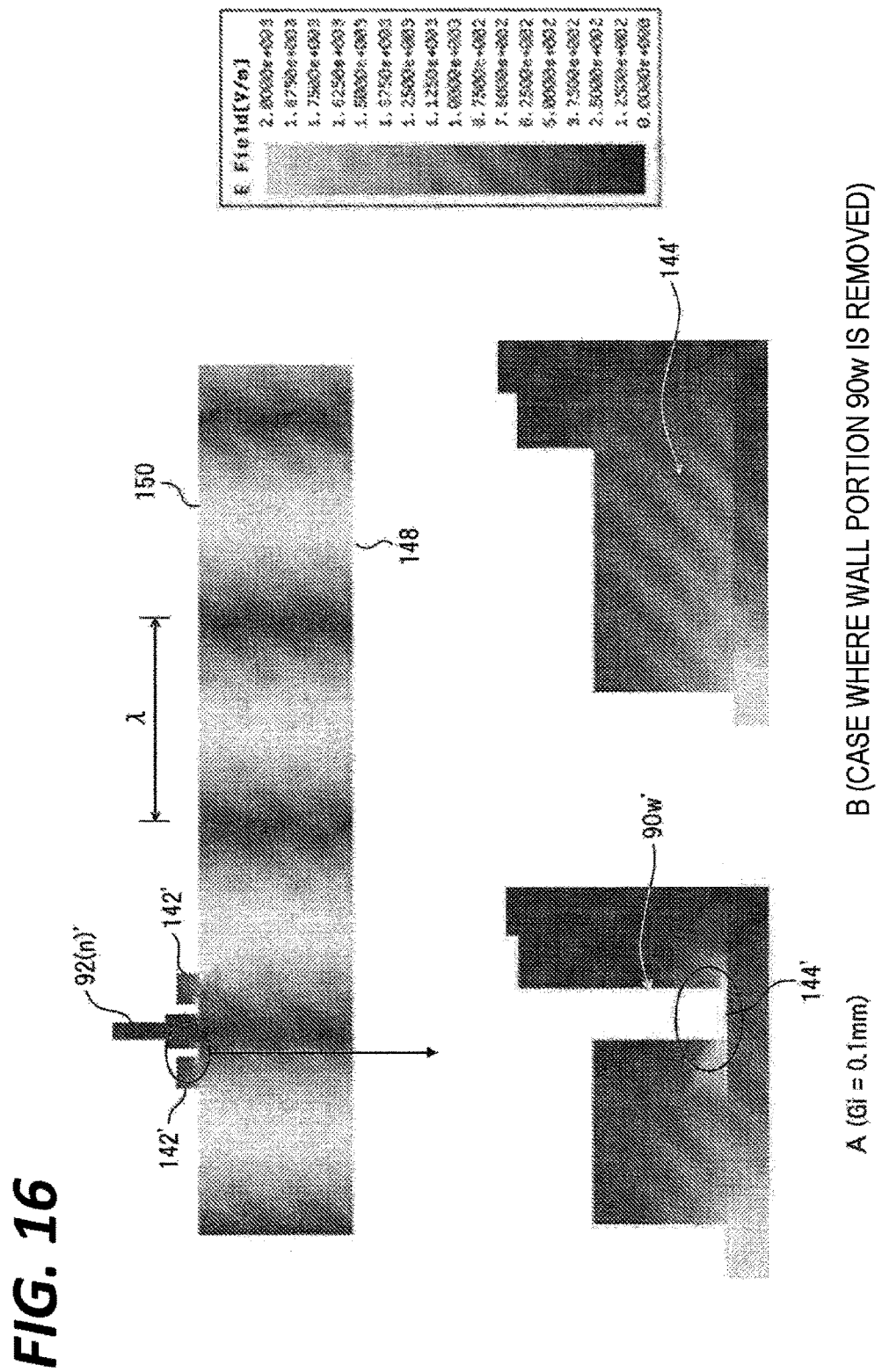
FIG. 16 is a view illustrating a distribution of electric field strengths obtained by calculating the electromagnetic fields in the vicinity of inlets of dielectric window gas flow paths.

FIG. 16 illustrates an electric field strength distribution at respective portions in the above-described model obtained in the simulation in which the electric field strength values are converted into luminance values. The partial enlarged view A in FIG. 16 illustrates a case in which the gap size $G_i$ of the gap (gas groove) 144' inside the O-ring 142 is set to be the same as the gap size $G_o$ of the gap 146' outside the O-ring 142 ($G_i$=0.1 mm). It can be seen that electric fields are concentrated to the gap (gas groove) 144' inside the O-ring 142 and thus, the electric field strength is increased. Whereas, the partial enlarged view B in FIG. 16 illustrates a case in which the wall portion 90w' (FIG. 14) inside the O-ring 142' is completely removed ($G_i$=about 3 mm), from which it can be seen that the electric field strength in the gap (gas groove) 144' inside the O-ring 142 is reduced.

In addition, a smaller gap size $G_o$ of the gap 146 outside the O-ring 142 is favorable so as to stably securing the seal function of the O-ring 142 and it is desirable to manage the gap size $G_o$ to be not more than 0.2 mm as usual.

As described above, according to Example 2, in the microwave plasma processing apparatus including the gas flow path 94(n) passing through the dielectric window 52, the gap 144 inside the O-ring 142 (within a gas flow path) provided at a place where the outlet of the external gas tube 90 from the upper gas introduction section 80 and the inlet of the dielectric window gas flow path 94(n) are connected with each other is formed to have a larger gap size than the gap 146 outside the O-ring 142 (in the atmospheric space) ($G_i > G_o$). As a result, it is possible to suppress the electric fields from being concentrated to the gap 144 inside the O-ring 142 while securing a good seal function and further to suppress abnormal electric discharge in the vicinity of the inlet of the dielectric window gas flow path 94(n).

Modified Example of Example 2

Figure 17:
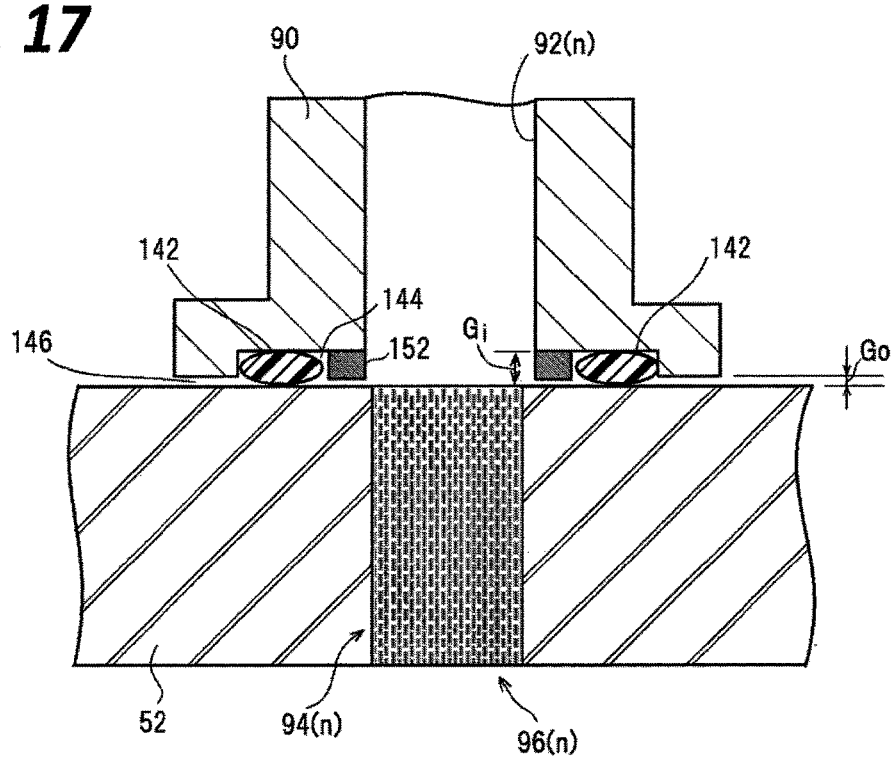
FIG. 17 is a partially enlarged cross-sectional view illustrating a modified example of Example 2.
Figure 18:
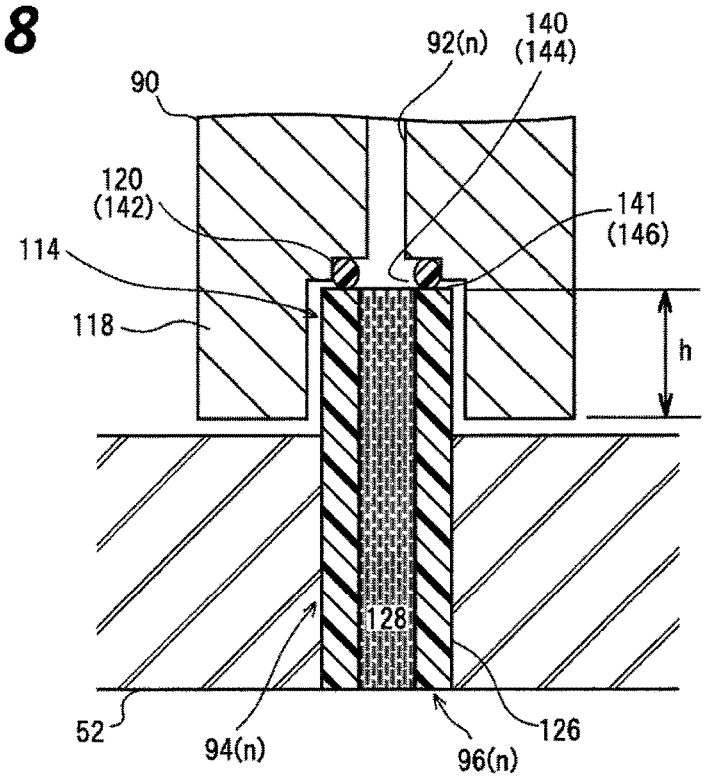
FIG. 18 is a partially enlarged cross-sectional view illustrating another modified example of Example 2.

FIGS. 17 and 18 illustrate modified examples of Example 2. In the modified example of FIG. 17, as in the configuration of FIG. 13B, the wall portion 90w (FIG. 13A) inside the O-ring 142 is removed and an annular or endless dielectric material 152 is provided in that place. According to the configuration of the present modified example, it is possible not only to reduce the concentration of electric fields to the gap 144 inside the O-ring 142, but also to suppress the O-ring 142 from being exposed to the processing gas (i.e., from being easily deteriorated).

The modified example of FIG. 18 is characterized by a configuration obtained by combining Example 1 and Example 2. That is, according to Example 1, as in the modified example of FIG. 6H, a portion 114 at the inlet side of an electric discharge prevention member 96(n) provided in a dielectric window gas flow path 94(n) is formed to protrude from the rear surface of the dielectric window 52, and a surrounding conductor 118 is provided around the protruding portion 114 of the electric discharge prevention member 96(n). In addition, an endless seal member, for example, an O-ring 120 (142) is provided between the end surface of the inlet of the electric discharge prevention member 96(n) and the outlet of the connector unit (or the external gas tube) 90. In addition, according to Example 2, the gap 140 (144) inside the O-ring 120 (142) is set to have a larger gap size than the gap 141 (146) outside the O-ring 120 (142) (in the atmospheric space) ($G_i > G_o$).

In such a configuration, since the effects according to Example 1 and the effects according to Example 2 are added to each other such that the abnormal electric discharge prevention effect in the vicinity of the inlet of the dielectric window gas flow path 94(n) can be further enhanced. That is, the electric fields of microwaves propagated from the inside of the dielectric window 52 along the inside of the protruding portion 114 of the electric discharge prevention member 96(n) from the top are attenuated by being reflected within the surrounding conductor 118 or by an equivalent reactance such that the electric fields will not be concentrated to the gap 140 (144) inside the O-ring 120 (142) in the vicinity of the inlet of the electric discharge prevention member 96(*n*).

In addition, as described below, the technical idea of the present disclosure in Example 2, that is, a configuration in which a gap inside an endless seal member (in a gas flow path) provided in the vicinity of an inlet of a dielectric window gas flow path is formed to be larger than a gap outside the endless seal member ($G_i > G_o$) may be applied to a case in which no electric discharge prevention member is provided in the dielectric window gas flow path.

Figure 19:
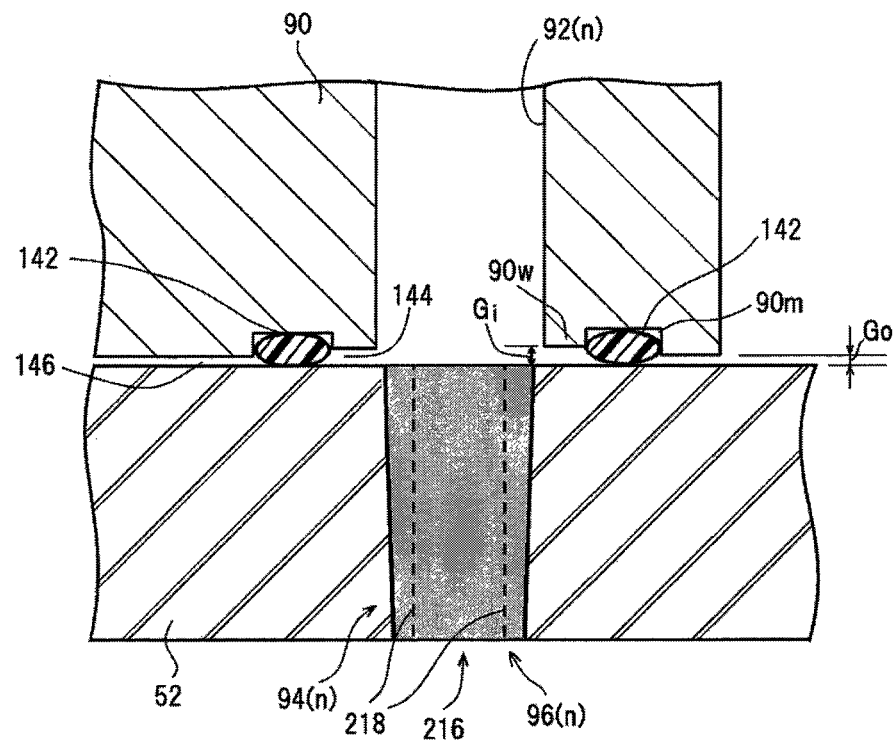
FIG. 19 is a partially enlarged cross-sectional view illustrating still another modified example of Example 2.

The modified example of FIG. 19 is characterized by a configuration in which a nozzle piece 216 made of a dielectric material and having longitudinal grooves in Example 9 to be described below is fitted in the dielectric window gas flow path 94(*n*) as the electric discharge prevention member 96(*n*) of FIGS. 13A and 13B.

Figure 20:
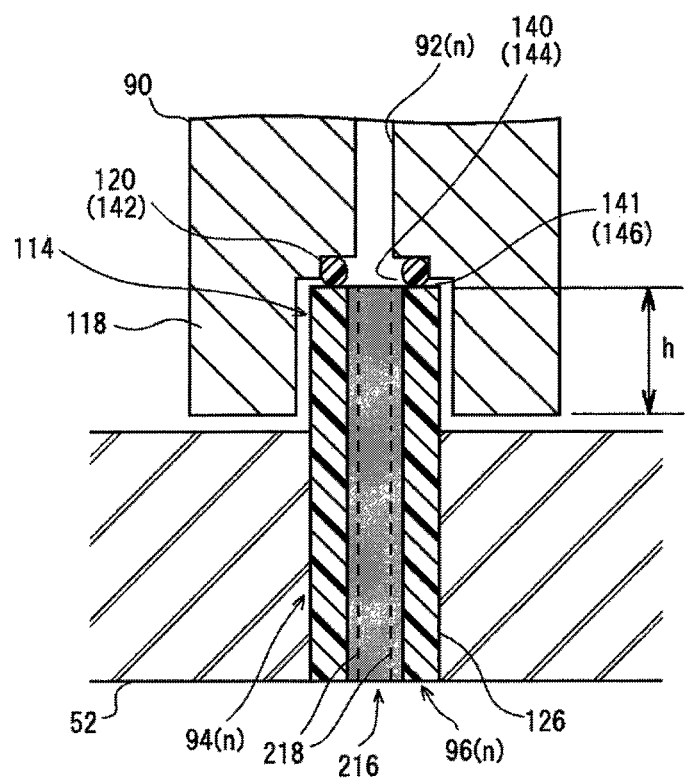
FIG. 20 is a partially enlarged cross-sectional view illustrating yet another modified example of Example 2.

The modified example of FIG. 20 is characterized by a configuration in which, in the electric discharge prevention member 96(*n*) of FIG. 18, the nozzle piece 216 made of a dielectric material and having the longitudinal grooves 218 in Example 9 to be described is filled in the cylinder portion 126, instead of the porous dielectric material.

Example 3 Concerning Configuration Around Dielectric Window Gas Flow Path

Figure 21:
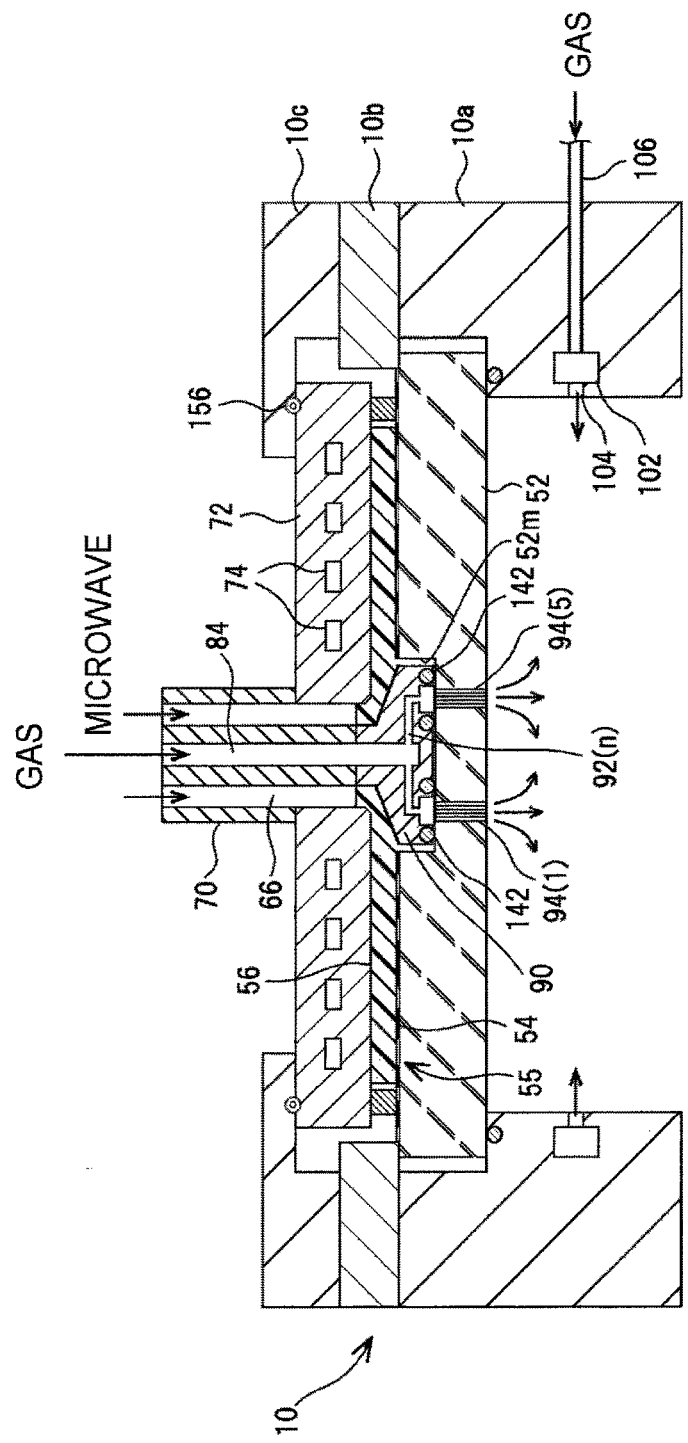
FIG. 21 is a cross-sectional view illustrating a configuration around dielectric window gas flow paths in Example 3.
Figure 22:
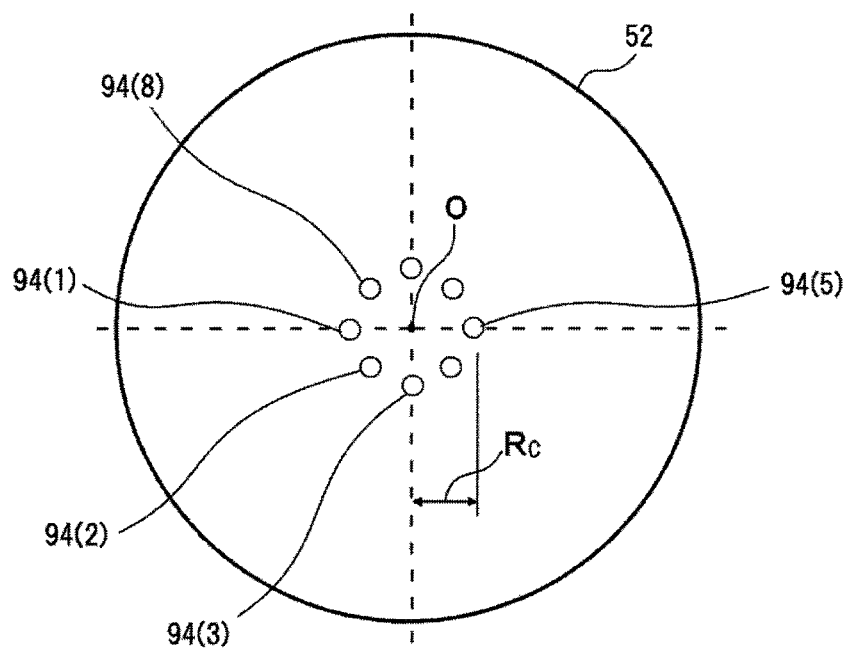
FIG. 22 is a plan view illustrating arranged positions (layout) of the dielectric window gas flow paths in the configuration of FIG. 21.
Figure 23:
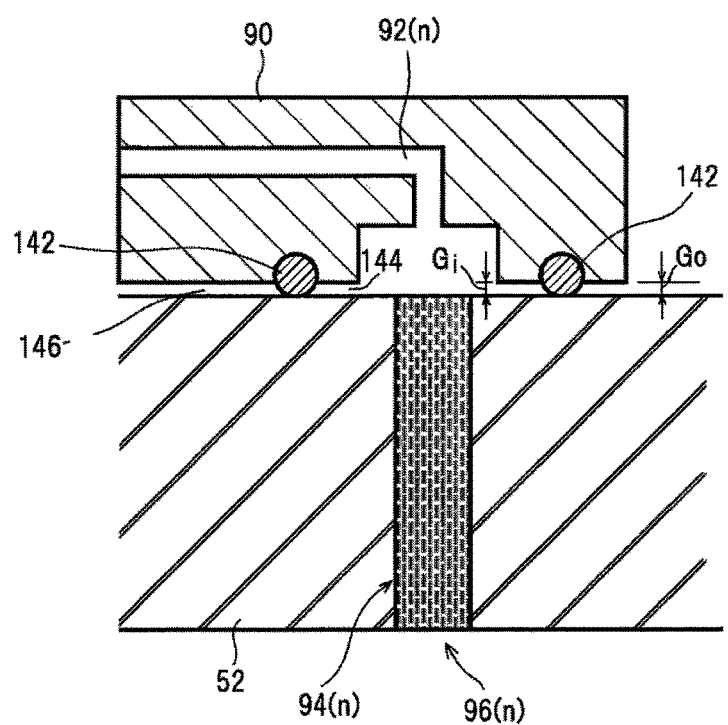
FIG. 23 is a partially enlarged cross-sectional view illustrating a main portion of the configuration of FIG. 21.

FIGS. 21 to 23 illustrate configurations around dielectric window gas flow paths in another viewpoint of the present disclosure (Example 3). Also in Example 3, respective dielectric window gas flow paths 94(*n*) provided in the dielectric window 52 are preferably arranged at equidistant intervals on a circumference of a predetermined distance (radius) $R_C$ from the center of the dielectric window 52 (FIG. 22) and hermetically connected to the branched gas supply paths 92(*n*) at the rear side of the dielectric window 52, respectively. In addition, as in Example 1, each of the dielectric window gas flow paths 94(*n*) is provided with an air-permeable electric discharge prevention member 96(*n*) made of a dielectric material. In addition, in order to seal the vicinity of each dielectric window gas flow path 94(*n*), an endless seal member, for example, an O-ring 142 is inserted between the connector unit 90 and the dielectric window 52.

However, in the present example, as illustrated in detail in FIG. 21, a portion at the inlet side of each electric discharge prevention member 96(*n*) is not configured to protrude upward from the rear surface of the dielectric window 52 and no surrounding conductor 118 is provided around the electric discharge prevention member 96(*n*). In addition, the gap (gas groove) 144 inside the O-ring 142 (within the gas flow path) and the outer gap 146 outside the O-ring 142 has the same gap size ($G_i = G_o$).

The present example is characterized by a configuration in which respective dielectric window gas flow paths 94(*n*) are arranged to be spaced apart from the center O at a distance $R_C$ within a predetermined extent in the dielectric window 52. That is, the present example is characterized by the fact that, assuming that the wavelength of microwaves when the microwaves are propagated is $\lambda_g$, the following Conditional Equation (1) is satisfied with respect to $R_C$.

$$\lambda_g/4 < R_C < 5\lambda_g/8 \tag{1}$$

In general, in a microwave plasma processing apparatus, standing waves of electromagnetic fields which are the same as those generated within the dielectric material 148 in the model of FIG. 16 are generated within a dielectric window (ceiling plate) configured to introduce electromagnetic waves into a chamber. Thus, there exists a place where electric fields are locally strong. Accordingly, when a gas supply hole (a dielectric window gas flow path) is provided in the place where the electric fields are locally strong, plasma (abnormal electric discharge) may be generated within the gas supply hole or within an external gas supply line connected to the gas supply hole or excessively strong plasma may be generated in the vicinity of the outlet of the gas supply hole, for example.

Thus, it is desirable to provide such a dielectric window gas flow path in a place where the electric fields are weak in the dielectric window. However, in general, since the state of plasma within the chamber is changed depending on the kind or pressure of a processing gas, the electromagnetic field distribution within the dielectric window is also changed.

Figure 46:
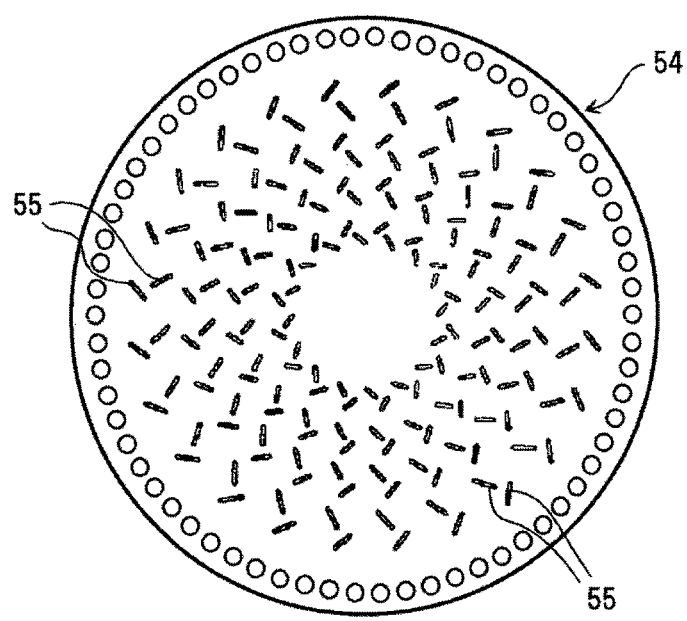
FIG. 46 is a plan view illustrating an example of a radial line slot antenna.

The inventors analyzed electromagnetic field distributions within an electric window by simulation. It has been found that when, for example, a dielectric window (ceiling plate) having a rotational symmetry property as illustrated in FIG. 22 and, for example, a plate type slot antenna having a rotational symmetry property as illustrated in FIG. 46 are used, standing waves of electromagnetic fields of which the electric field strengths have the maximum amplitude at the center O are always formed inside the dielectric window. Under such standing waves, a strong electric field is generated within a radius ($\lambda_g/4$) from the center O of the dielectric window, the electric field is locally weakened around the center (in particular, in the vicinity of a radius ($2\lambda_g/4$)), and the electric field is locally strengthened in the vicinity of a radius ($3\lambda_g/4$). Such a tendency has low dependency on a gas species or pressure.

In addition, the electromagnetic field distribution inside the dielectric window as described above is repeated from the center O toward the radial outside at an interval of a wavelength $\lambda_g$. Accordingly, for example, the electric field is also locally weakened in the vicinity of, for example, a radius ($12\lambda_g/8$). However, in a case where the inside (through hole) of the inner conductor 68 of the coaxial tube 66 is used as the gas flow path 88 and the processing gas is guided to the dielectric window gas supply holes through the branched gas supply paths extending outwardly in the radial direction from the lower end of the inner conductor 68 positioned close to the center of the dielectric window as in the microwave plasma processing apparatus of the present exemplary embodiment, it is desirable for the gas supply holes to be arranged as close to the center of the dielectric window as possible. This is to reduce interference or influence of a gas supply system with respect to a microwave radiation antenna.

In Example 3, based on the knowledge as described above, respective dielectric window gas flow paths 94(*n*) provided in the dielectric window 52 are arranged within an extent defined by Conditional Equation (1) above. Accordingly, according to the present example, no dielectric window gas flow path is provided in a region within $\lambda_g/4$.

For example, when microwaves of 2.45 GHz is used and alumina of which the dielectric constant is 10 is used for the dielectric window 52, $\lambda_g \approx 38$ mm and from Conditional Equation (1), each of the dielectric window gas flow path 94(*n*) may be arranged within a range of $R_C = 9.5$ to 23.75 mm. In addition, the dielectric window gas flow paths 94(*n*) are preferably arranged on a circumference of a predetermined distance (radius) Rc from the center O of the dielectric window 52 in terms of an axial symmetry property of gas introduction into the chamber (FIG. 22). However, the dielectric window gas flow paths 94(*n*) may also be arranged non-equidistantly or at positions of different distances from the center O as long as Conditional Equation (1) is satisfied.

FIG. 21 illustrates a proper upper structure of the chamber 10. In the present example, an annular dielectric window pressing member 10b and an annular antenna pressing member 10c are stacked and arranged on an annular top surface of a top-opened cylindrical chamber body 10a and detachably fixed to the annular top surface of the cylindrical chamber body 10a by, for example, bolts (not illustrated). Here, the dielectric window pressing member 10b presses the dielectric window 52 fitted in the annular recess on the top surface of the inner wall of the chamber body 10a and the antenna pressing member 10c presses the antenna 55 from the top of the cooling jacket 72. A ring-shaped EMI shield member 156 is inserted between the antenna pressing member 10c and the cooling jacket cooling jacket 72 so as to prevent electromagnetic waves from being leaked to the outside of the chamber 10. In the upper structure of the chamber 10, the dielectric window 52, a microwave supply system (e.g., the coaxial tube 66 and the antenna 55) and a gas supply system (e.g., the upper gas introduction section 80 and the connector unit 90) may be integrated with each other and detachably attached to the top surface of the chamber 10.

In addition, in the configuration of FIG. 21, the respective dielectric window gas flow paths 94(n) are provided within a recess 52m formed in the central area of the dielectric window 52 and the connector unit 90 is placed in the recess 52m. In such a case, the branched gas supply paths 92(n) in the connector unit 90 are respectively connected with the dielectric window gas flow paths 94(n) within the recess 52m of the dielectric window 52.

Modified Example of Example 3

Figure 24A:
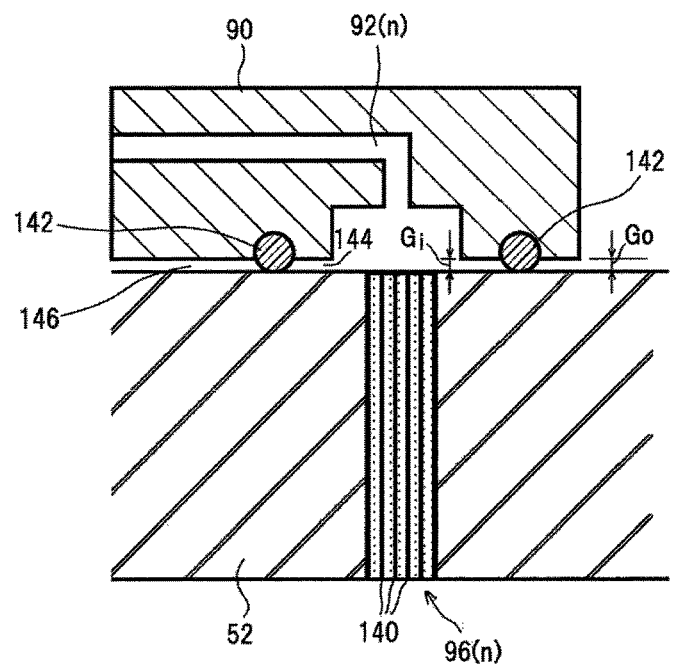
FIG. 24A is a partially enlarged cross-sectional view illustrating a modified example of a main portion of the configuration of FIG. 21.
Figure 24B:
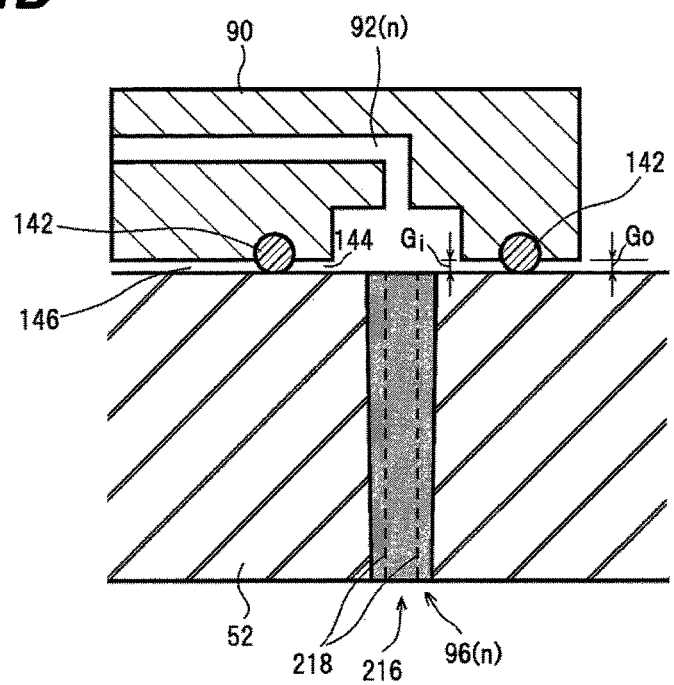
FIG. 24B is a partially enlarged cross-sectional view illustrating another modified example of a main portion of the configuration of FIG. 21.
Figure 24C:
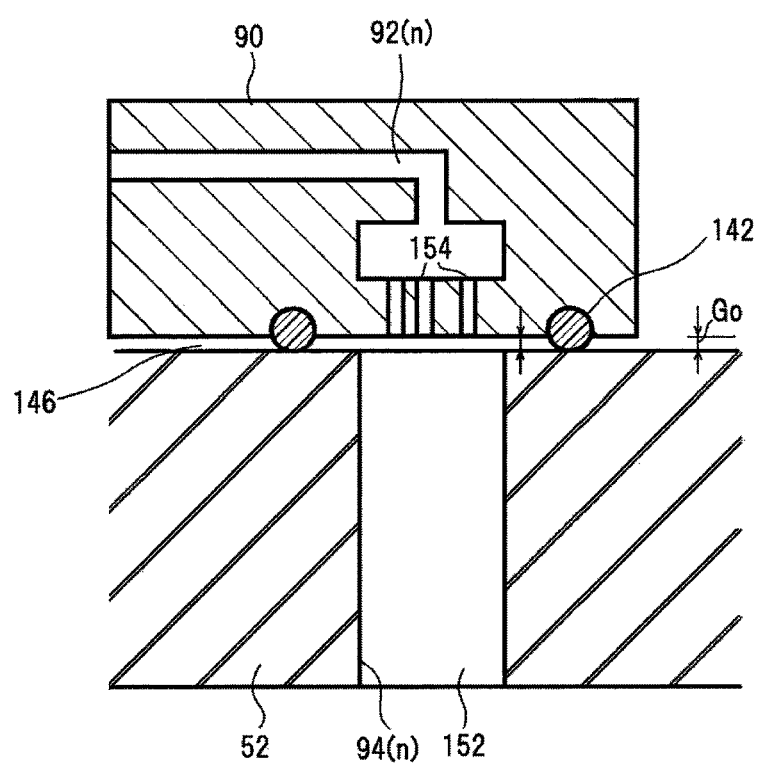
FIG. 24C is a partially enlarged cross-sectional view illustrating still another modified example of a main portion of the configuration of FIG. 21.
Figure 25:
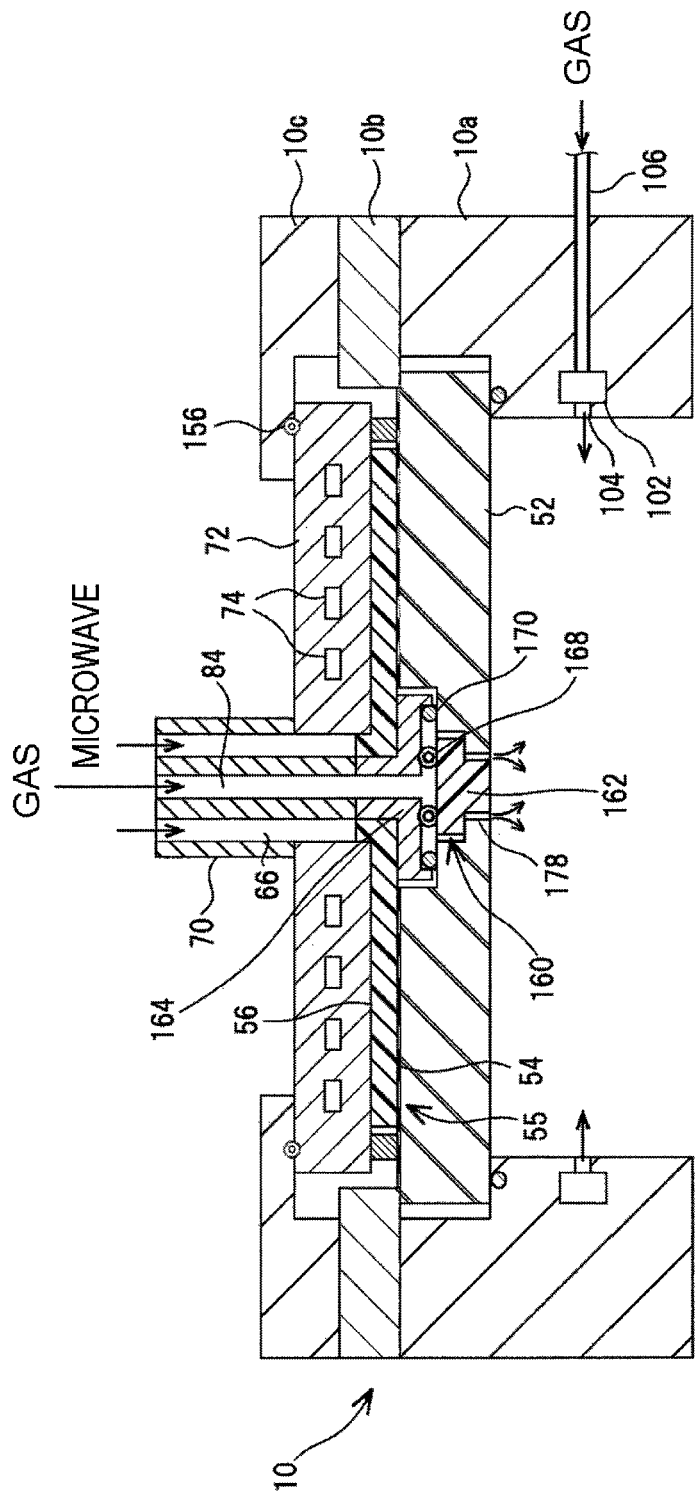
FIG. 25 is a cross-sectional view illustrating a configuration around a dielectric window gas flow path in Example 4.
Figure 26:
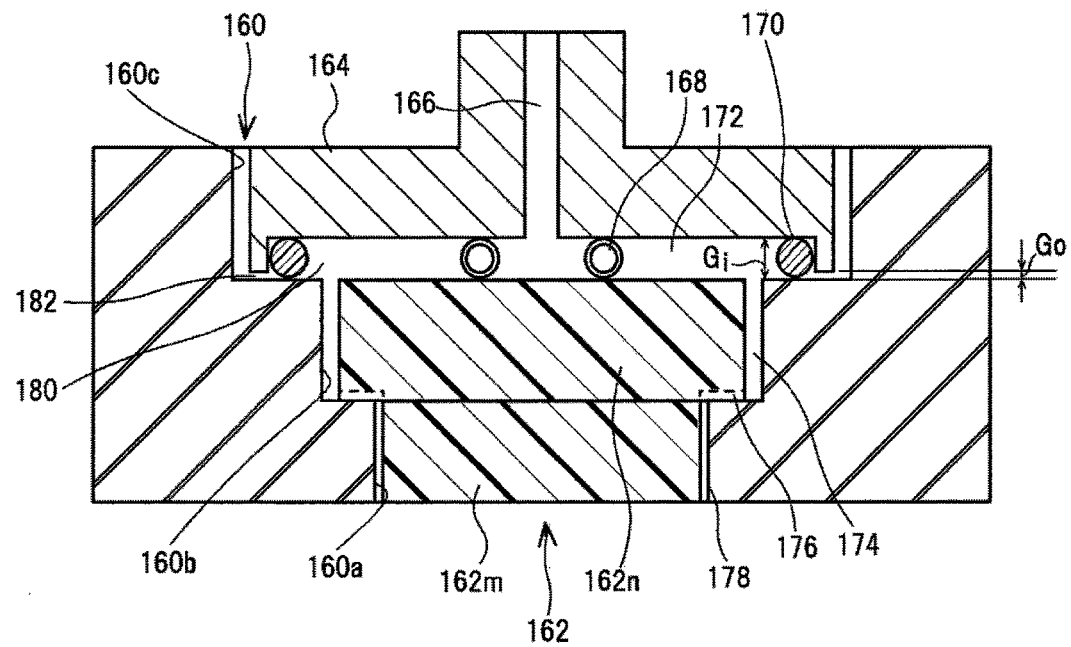
FIG. 26 is a partially enlarged cross-sectional view illustrating a main portion of the configuration of FIG. 25.

Also in Example 3, as illustrated in FIG. 24A, each of the dielectric window gas flow paths 94(n)) may be provided with an electric discharge prevention member 96(n) made of an air-permeable dielectric material having a plurality of extra fine through holes 140. Alternatively, as illustrated in FIG. 24B, the nozzle piece 216 made of a dielectric material having longitudinal grooves 218 in Example 9 (which will be described later) may also be used as the electric discharge prevention member 96(n) provided in each dielectric window gas flow path 94(n). In addition, as illustrated in FIG. 24C, it is possible to form a cavity 152 in each dielectric window gas flow path 94(n) without providing the electric discharge prevention member 96(n). When the cavity 152 is formed in the entire dielectric window gas flow path 94(n)), the outlet of each branched gas supply path 92(n) in the connector unit 90 is preferably formed to have a shower structure 154 provided with a plurality of through holes. Then, the gas flow rate within the cavity 152 and hence, the gas jet amount into the chamber 10 may be adjusted. In the present example, as described above, the electric fields in the place where the dielectric window gas flow paths 94(n) are provided in the dielectric window 52 are localized and normally weak. Thus, even if the place is formed as the cavity 152, abnormal electric discharge within the dielectric window gas flow paths 94(n) may hardly occur.

Of course, Example 3 may be combined with Example 1. That is, Conditional Equation (2) according to Example 3 is applied to the positions where the dielectric window gas flow paths 94(n) are provided in the dielectric window 52 in Example 1 (FIG. 3) and the dielectric window gas flow paths 94(n) are arranged at the positions where the following Conditional Equation (2) may be satisfied.

$$\lambda_g/4 < R_A < 5\lambda_g/8 \tag{2}$$

As a result, the effects according to Example 1 and the effects according to Example 3 are added to each other such that the abnormal electric discharge in the vicinity of the inlets of the dielectric window gas flow paths 94(n)) in the case where the electric discharge prevention members 96(n)) are provided can be suppressed more securely. That is, the electric fields propagated from the inside of the dielectric window 52 along the inside of the protruding portions 114 of the electric discharge prevention members 96(n)) from the top may be attenuated by being reflected within the surrounding conductor 118 or an equivalent reactance and the electric fields in the vicinity of the dielectric window gas flow paths 94(n) are weakened locally and normally within the dielectric window 52. Thus, the abnormal electric discharge may be suppressed more securely.

In addition, Example 3 may also be combined with Example 2 as described above. That is, Conditional Equation 1 according to Example 3 is applied to the positions where the dielectric window gas flow paths 94(n) provided in the dielectric window 52 in Example 2 (FIG. 12) and the dielectric window gas flow paths 94(n) are arranged at the positions where the following Conditional Equation (3) is satisfied.

$$\lambda_g/4 < RB < 5\lambda_g/8 \tag{3}$$

As a result, the effects according to Example 2 and the effects according to Example 3 to be added to each other such that the abnormal electric discharge may be suppressed more securely in the vicinity of the inlet of each dielectric window gas flow path 94(n). That is, since the electric fields are not concentrated to the gaps 144 inside the O-rings 142 (within the gas flow paths) in the vicinity of the electric discharge prevention members 96(n) and the electric fields are locally or normally weakened in the vicinity of the dielectric window gas flow paths 94(n) in the dielectric window 52, the abnormal electric discharge may be suppressed more securely.

Example 4 Concerning Configuration Around Dielectric Gas Flow Path

FIGS. 25 to 28 illustrate a configuration around a dielectric window gas flow path in another viewpoint of the present disclosure (Example 4). In Example 4, a circular opening 160 of which the diameter is reduced stepwise in the thickness direction thereof is formed in the central portion of the dielectric window 52, a columnar nozzle piece 162 is fitted in the opening 160, and a gap extending annularly between the nozzle piece 162 and the dielectric window opening 160 is used as a dielectric window gas flow path.

More specifically, the dielectric window opening 160 includes a circular top opening portion 160c having a first diameter and facing the outside of the dielectric window 52, a circular bottom opening portion 160a having a second diameter which is smaller than the first diameter and facing the inside of the dielectric window (the inside of the chamber 10), and a circular intermediate opening portion 160b having a third diameter between the first diameter and the second diameter and positioned between the top opening portion 160c and the bottom opening portion 160a.

Figure 27:
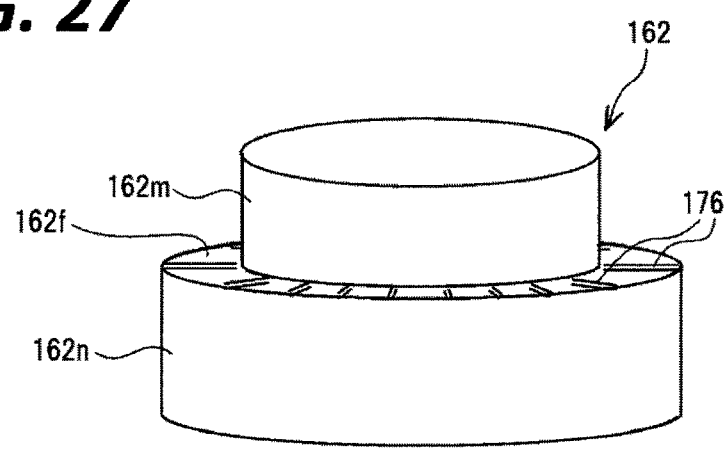
FIG. 27 is a perspective view illustrating a nozzle piece in the configuration of FIG. 25 in an enlarged scale.

The nozzle piece 162 is made of a dielectric material such as, for example, quartz or ceramics such as $Al_2O_3$ and, as illustrated in FIG. 27, includes a small-diameter columnar portion 162m, a large-diameter columnar portion 162n, an annular flange surface 162f extending in the radial direction between the small-diameter columnar portion 162m and the large-diameter columnar portion 162n, and a plurality of grooves 176 formed radially on the flange surface 162f. Here, the diameters of the small-diameter columnar portion 162m and the large-diameter columnar portion 162n are slightly smaller than the diameters of the bottom opening portion 160a and the intermediate opening portion 160b, respectively.

The nozzle piece 162 is attached in such a manner that the small-diameter columnar portion 162m is fitted into the opening portion 160a with a clearance and the large-diameter columnar portion 162n is fitted into the intermediate opening portion 160b with a clearance. In addition, a connector unit 164 is put into the top opening portion 160c of the dielectric window opening 160. The connector unit 164 is made of a conductor which is the same as that of the connector unit 90 in Examples 1 to 3, and connected to the terminal end of the inner conductor 68 of the coaxial tube 66 to be electrically grounded. In the central portion of the connector unit 164, an external gas flow path (first gas flow path) 166 is formed to be connected with the gas flow path 84 of the coaxial tube 66 to extend in the vertical direction.

A ring-shaped elastic support member 168 is inserted between the bottom surface of the connector unit 164 and the top surface of the nozzle piece 162 in which the ring-shaped elastic support member 168 is made of an air-permeable material or member and has a diameter larger than the first gas flow path 166. In addition, a ring-shaped seal member made of a non-air-permeable material, for example, an O-ring 170, is inserted between the bottom surface of the connector unit 164 and the annular bottom surface of the bottom opening portion 160c. Due to this, a second gas flow path 172, which is flat and communicates with the connector unit 164 (first gas flow path 166), is formed inside the O-ring 170.

Further, an annular clearance communicating with the second gas flow path 172, i.e. the third gas flow path 174 is formed between the large-diameter columnar portion 162n of the nozzle piece 162 and the intermediate opening portion 160b. In addition, the annular flange surface of the nozzle piece 162 comes in close contact with the annular bottom surface of the intermediate opening portion 160b to form a fourth gas flow path 174 that makes the grooves 176 on the flange surface 162f communicate with the third gas flow path 174. Further, an annular clearance communicating with the fourth gas flow path 176, i.e. a fifth gas flow path 178 is formed between the small-diameter columnar portion 162m of the nozzle piece 162 and the bottom opening portion 160a. The fifth gas flow path 178 faces the plasma generation space within the chamber 10, thereby forming a gas jet port. In order to prevent plasma from flowing backward (entering) from the gas jet port, it is desirable to make the clearance of the fifth gas flow path 178 smaller.

In the present example, the processing gas sent from the processing gas supply source 86 (FIG. 1) through the gas flow path 84 of the coaxial tube 66 is ejected (introduced) into the plasma generation space within the chamber 10 through the first gas flow path 166 of the connector unit 164, the second gas flow path 172 within the dielectric window 52, the third gas flow path 174, the fourth gas flow path 176, and the fifth gas flow path 178. This gas supply mechanism has an advantage in that the configuration of the dielectric window gas flow path is simple and the fabrication thereof is easy. Further, since the radial grooves (the fourth gas flow path) 176 formed in the dielectric window 52 form a gas flow path having a low conductance and thus, controls the entire gas conductance in a high accuracy, variations in gas flow rate may be suppressed.

Also in the present example, a number of microwave electric fields are distributed within the dielectric window 52, and a processing gas is exposed to the microwave electric fields within the gas flow paths 172 to 178 of the dielectric window 52. In connection with this point, the present example sets the gap 180 inside the O-ring 170 (gas flow path side) to be larger than the gap 182 outside the O-ring 170 (atmospheric space side) in particular in the vicinity of the inlet of the second gas flow path 172 among the gas flow paths 172 to 178, as in Example 2 described above. In the illustrated configuration example, the inner wall portion of the O-ring 170 is removed so as to fully satisfy the condition ($G_i > G_o$) and so as to suppress the electric fields from being concentrated to the gap 180 inside the O-ring 170.

Figure 28:
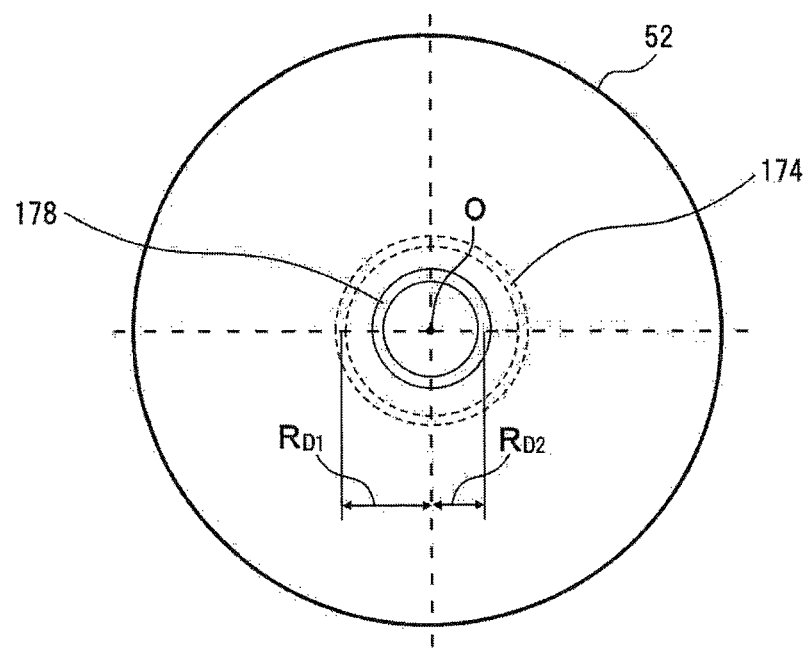
FIG. 28 is a plan view illustrating arranged positions (layout) of the dielectric window gas flow paths in the configuration of FIG. 25.

FIG. 28 illustrates a proper arrangement pattern of the gas flow paths 174, 178 in the dielectric window 52 in the present example. Also in the present example, Conditional Equation (1) according to Example 3 described above may be applied to the gas flow paths 174 to 178 formed in the dielectric window 52. That is, assuming that the distances from the center O of the dielectric window 52 to the third and fifth gas flow paths 174, 178 are $R_{D1}$ and $R_{D2}$, respectively, the third and fifth gas flow paths 174, 178 are arrange to satisfy Conditional Equations (4) and (5) as follows.

$$\lambda_g/4 < R_{D1} < 5\lambda_g/8 \quad (4)$$

$$\lambda_g/4 < R_{D2} < 5\lambda_g/8 \quad (5)$$

However, strong electromagnetic fields are distributed in the central region within $\lambda_g/4$ in the dielectric window 52 and electromagnetic fields of microwaves enter into the second gas flow path 172 and further into the first gas flow path 166 from the central region. However, due to the fact that the second gas flow path 172 has a relatively high pressure since the conductance of the second gas flow path 172 is controlled by the third gas flow path 174 and the inside of the second gas flow path 172 and the first gas flow path 166 except for the vicinity of the O-ring 170 is configured such that the electric fields of microwaves are hardly concentrated to one place since the second gas flow path 172 is widened transversely. Thus, the present example is configured such that abnormal electric discharge of a gas hardly occurs.

Although not illustrated, a configuration, in which the diameter of the bottom opening portion 160a is larger than the diameter of the intermediate opening portion 160b such that the small-diameter columnar portion 162m and the large-diameter columnar portion 162n of the nozzle piece 162 are fitted in the intermediate opening portion 160b and the bottom opening portion 160a, respectively, is also possible. In addition, a configuration, in which the top surface of the nozzle piece 162 is coplanar with the top surface of the dielectric window opening 160 (accordingly, the connector unit 164 is provided above the dielectric window 52 rather than within the dielectric window 52), is also possible.

Example 5 Concerning Configuration Around Dielectric Window Gas Flow Path

Figure 29:
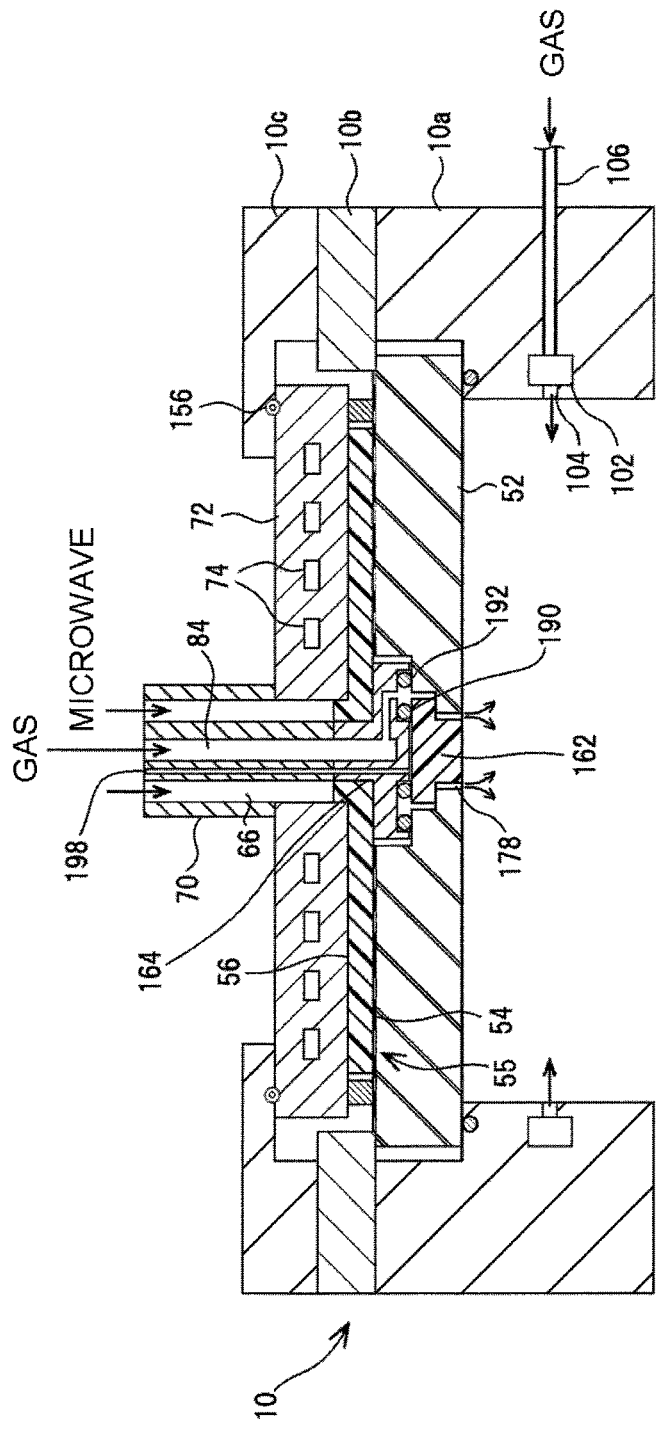
FIG. 29 is a cross-sectional view illustrating a configuration around a dielectric window gas flow path in Example 5.
Figure 30:
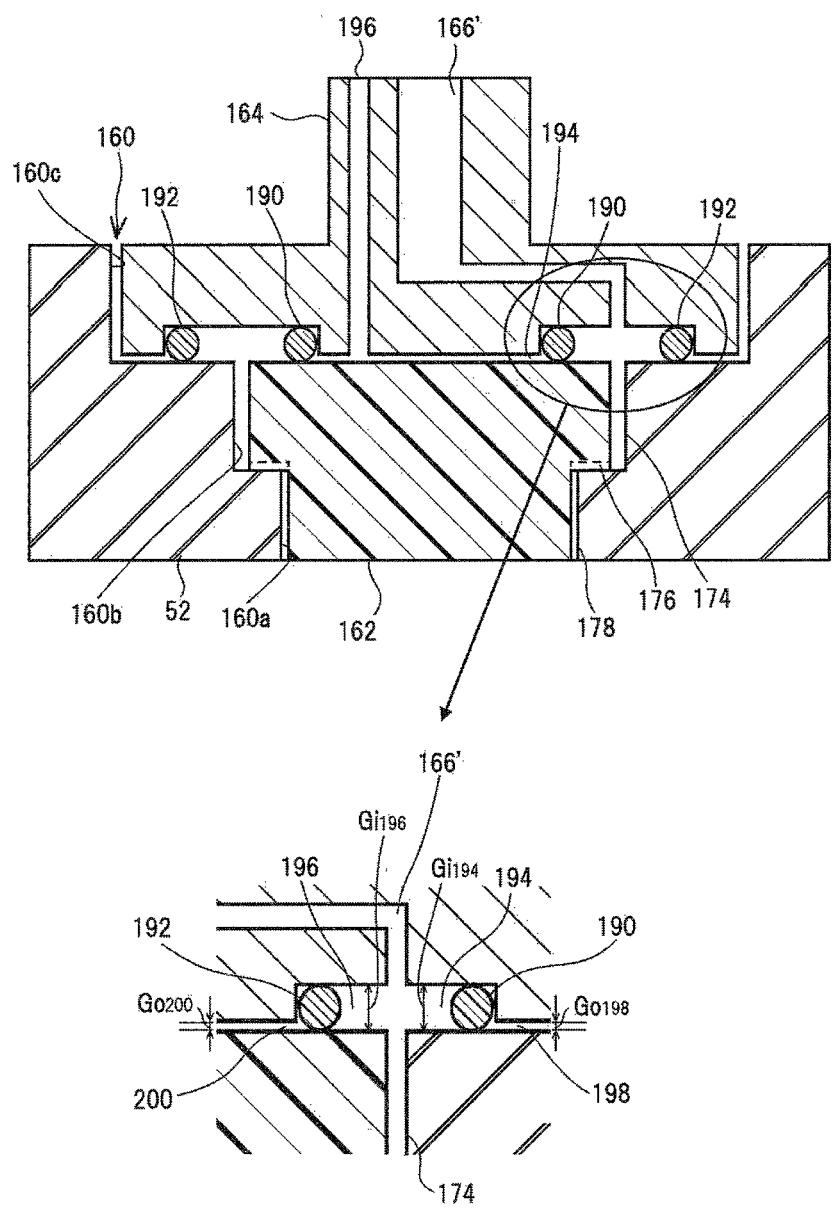
FIG. 30 is a partially enlarged cross-sectional view illustrating a main portion of the configuration of FIG. 29 in an enlarged scale.

FIGS. 29 and 30 illustrate a configuration around a dielectric window gas flow path in another viewpoint of the present disclosure (Example 5). Example 5 solves the above-described problem that, in Example 4, electromagnetic fields of microwaves may easily enter into the second gas flow path 172 within the dielectric window 52 from the central portion of the dielectric window 52.

In Example 5, a gas flow path 166' of a connector unit 164 is formed to be curved outwardly in the radial direction within the connector unit 164 first and then extend vertically downward to be connected to a third gas flow path 174 within the dielectric window, rather than formed to penetrate the connector unit 164 vertically straightly to the lower end of the connector unit 164. In addition, the space formed by the second gas flow path 172 in the above-described fourth exemplary is blocked by the connector unit 164 in Example 5. In addition, in order to seal the vicinity of the second gas flow path 172, endless or ring-shaped seal members, for example, O-rings 190, 192 are inserted between the bottom surface of the connector unit 164 and the top surface of the nozzle piece 162 and between the bottom surface of the connector unit 164 and the annular bottom surface of the dielectric window opening 160 of the top opening portion 160c, respectively. A gap 194 formed between the bottom surface of the connector unit 164 and the top surface of the nozzle piece 162 radially inside the O-ring 190 communicates with an atmospheric space through a pressure releasing hole 196 provided through, for example, the connector unit 164 and the inner conductor 68 of the coaxial tube 66.

According to this configuration, standing waves of electromagnetic fields are generated in the dielectric window 52. Thus, even if an electric field in the central region of the dielectric window 52 is locally strong, abnormal electric discharge in the dielectric window 52 can be prevented since no gas flow path passes through the vicinity of the central region.

Also in Example 5, as in Example 2 as described above, the gaps 194, 196 inside the O-rings 190, 192 (within the gas flow path) are set to be larger than the gaps 198, 200 outside the O-rings 190, 192 (at the atmospheric space side). In the illustrated configuration example, the wall portions inside the O-rings 190, 192 (within the gas flow path) are removed to satisfy the condition ($G_{i194}>G_{o198}$, $G_{i196}>G_{o200}$) and to suppress electric fields from being concentrated to the gaps 194, 196 inside the O-rings 190, 192.

Also in Example 5, Conditional Equation (1) according to Example 3 may be applied to the arrangement positions of the gas flow paths 174 to 178 within the dielectric window 52. That is, assuming that the distances from the center O of the dielectric window 52 to the third and fifth gas flow paths 174, 178 are $R_{D1}$, $R_{D2}$, respectively, the third and fifth gas flow paths 174, 178 may be arranged to satisfy the Conditional Equations (4) and (5).

Although not illustrated, also in Example 5, a configuration, in which the diameter of the bottom opening portion 160a is set to be larger than the diameter of the intermediate opening portion 160b such that the small-diameter columnar portion 162m and the large-diameter columnar portion 162n of the nozzle piece 162 are fitted in the intermediate opening portion 160b and the bottom opening portion 160a, respectively, is also possible. Further, a configuration, in which the top surface of the nozzle piece 162 is coplanar with the top surface of the dielectric window opening 160 (accordingly, the connector unit 164 is provided above the dielectric window 52, rather than within the window), is also possible.

Modified Example of Example 5

Figure 31:
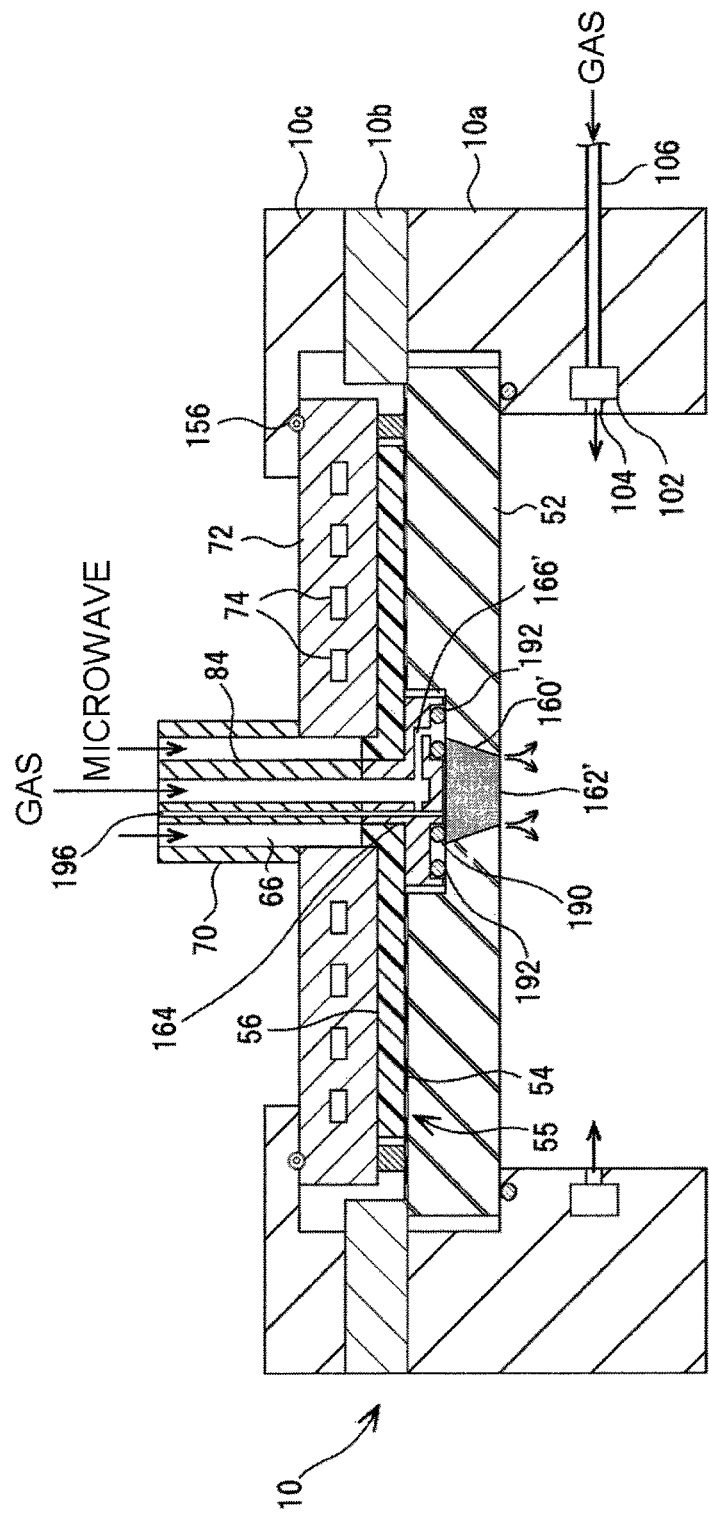
FIG. 31 is a cross-sectional view illustrating a modified example of the main portion in Example 5.
Figure 32:
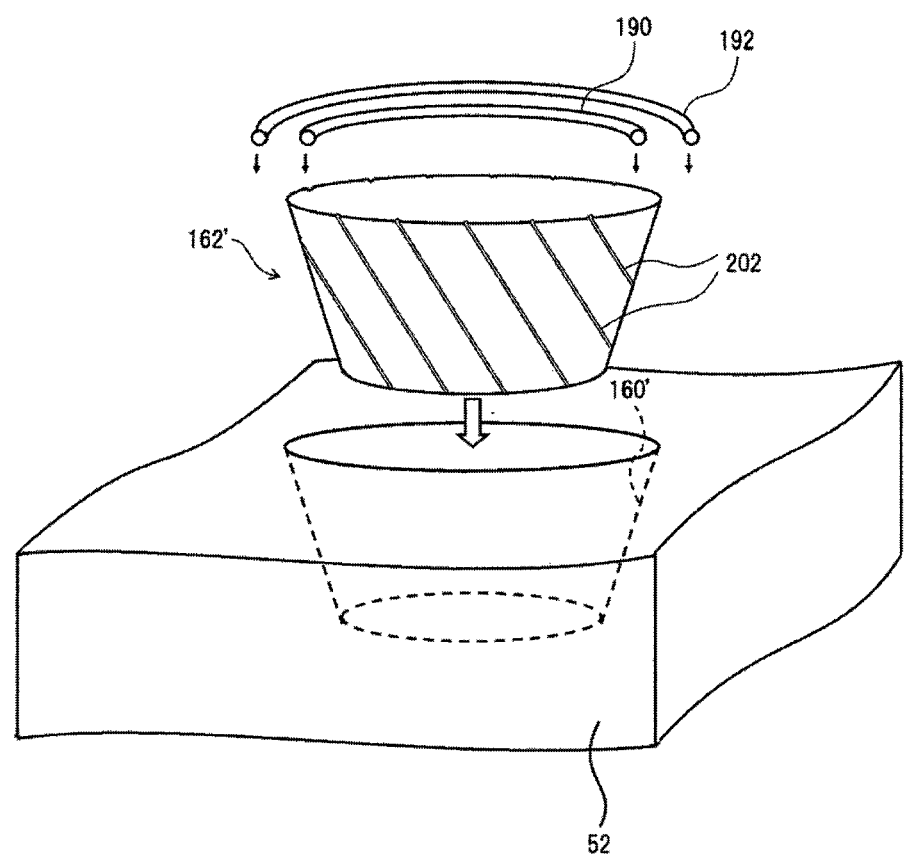
FIG. 32 is a perspective view illustrating a main portion in the configuration of FIG. 31 in an enlarged scale.

FIGS. 31 and 32 illustrate a modified example of Example 5. In the present modified example, the dielectric window opening 160 and the nozzle piece 162 of Example 5 are modified in configuration or shape.

That is, an opening 160' of which the diameter is changed in a taper shape in the thickness direction is formed in the central portion of the dielectric window 52, and a conical nozzle piece 162' is fitted in the dielectric window opening 160' to form a dielectric window gas flow path between the nozzle piece 162' and the dielectric window opening 160'.

In the illustrated modified example, the dielectric window opening 160', of which the diameter is decreased in a taper shape downward (toward the inside of the chamber 10), is formed in the central portion of the dielectric window 52 and the conical nozzle piece 162', of which the diameter is decreased in a taper shape downward (toward the inside of the chamber 10), is fitted in the dielectric window opening 160'. As illustrated in FIG. 32, a plurality of grooves 202 extending vertically or obliquely from the upper end to the lower end of the nozzle piece 162' are formed on the circumferential surface of the body of the nozzle piece 162'. As an example, each groove 202 has a groove width in a range of 0.5 mm to 3 mm and a groove depth in a range of 0.02 mm to 1 mm. When the nozzle piece 162' is fitted in the dielectric window opening 160' from the top side, the circumferential surface of the body of the nozzle piece 162' comes in close contact with the dielectric window opening 160'. In this state, the grooves 202 on the circumferential surface of the nozzle piece 162' form the dielectric window gas flow paths between the gas flow path 166' at the connector unit 90 side and the plasma generation space within the chamber 10. The processing gas from the processing gas supply source 86 (FIG. 1) is ejected (introduced) into the plasma generation space within the chamber 10 through the first gas flow path 166' of the connector unit 164 and the dielectric window gas flow paths (grooves) 202 within the dielectric window 52.

Also in the present modified example, although not illustrated, a configuration, in which the dielectric window opening 160' has a diameter which is increased in a reversed-taper shape downward (toward the inside of the chamber 10 and the conical nozzle piece 162', of which the diameter is increased in a reversed-taper shape downwardly (toward the inside of the chamber 10), is fitted in the dielectric window opening 160', is also possible. In addition, a configuration, in which the top surface of the nozzle piece 162' is coplanar with the top surface of the dielectric window opening 160 (accordingly, the connector unit 164 is provided above the dielectric window 52 rather than within the dielectric window 52), is also possible.

Example 6 Concerning Configuration Around Dielectric Window Gas Flow Path

Figure 33:
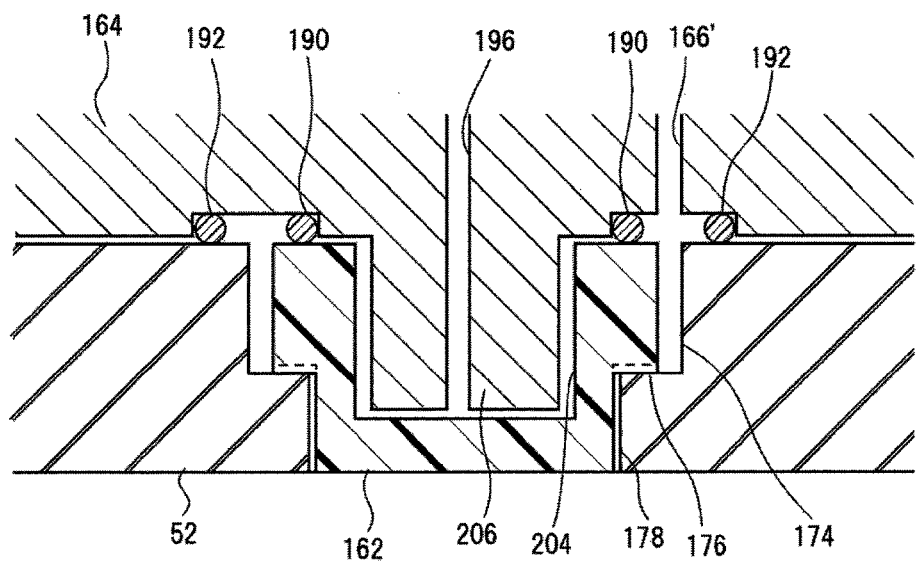
FIG. 33 is a cross-sectional view illustrating a configuration around a dielectric window gas flow path in Example 6.

FIG. 33 illustrates the configuration around the dielectric window gas flow path in another viewpoint of the present disclosure (Example 6). Example 6 is characterized in that a relatively deep longitudinal hole or recess 204 (preferably, having a depth reaching a position in the vicinity of the bottom surface of the dielectric window 52) is formed on the top surface of the nozzle piece 162 of Example 5 (preferably, in the central portion) and an electrically grounded protruding conductor 206 fitted in the recess 204a is provided. The protruding conductor 206 is preferably made of the same material as the connector unit 164 and integrally formed in or bonded to the connector unit 164. It is desirable that the protruding conductor 206 has an axially symmetric shape, for example, a conical or cylindrical shape.

In this configuration, since microwaves propagated in the dielectric window 52 are reflected outward in the radial direction by the protruding conductor 206, the electric field strength in the dielectric window gas flow paths 174 to 178 positioned in the vicinity of the protruding conductor 206 and in the vicinity of the inlets thereof is weakened. Also in the present example, it is, of course, possible to arrange the third and fourth gas flow paths 176, 178 to satisfy Conditional Equations (4) and (5) described above.

In addition, in the present example, a pressure releasing hole 196 is provided through the connector unit 164 and the protruding conductor 206. Further, a plurality of pressure releasing holes 196 may be formed such that a coolant gas from a chiller device (not illustrated) can be supplied to the recess 204 in the nozzle piece 162 through the pressure releasing holes 196. This allows the nozzle piece 162 to be efficiently cooled.

Example 7 Concerning Configuration Around Dielectric Gas Flow Path

Figure 34:
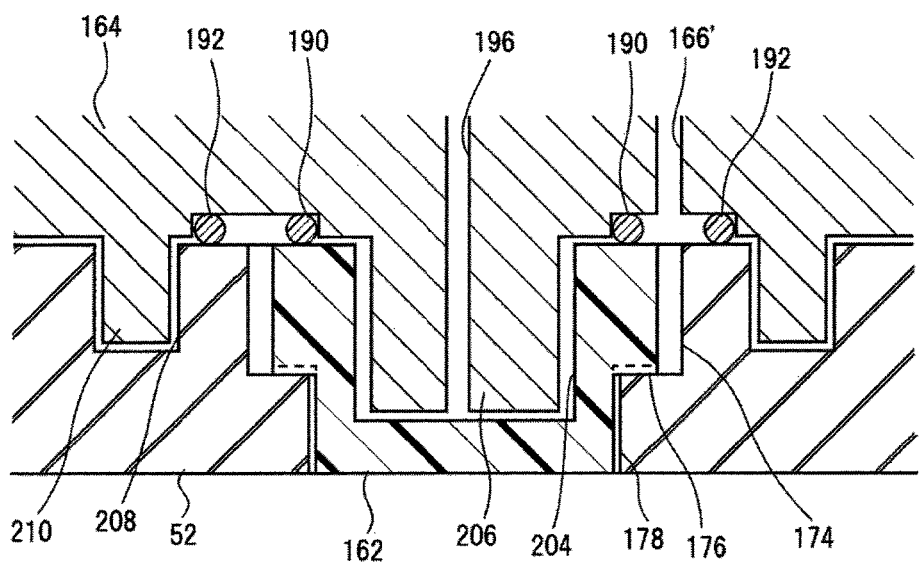
FIG. 34 is a cross-sectional view illustrating a configuration around a dielectric window gas flow path in Example 7.
Figure 35:
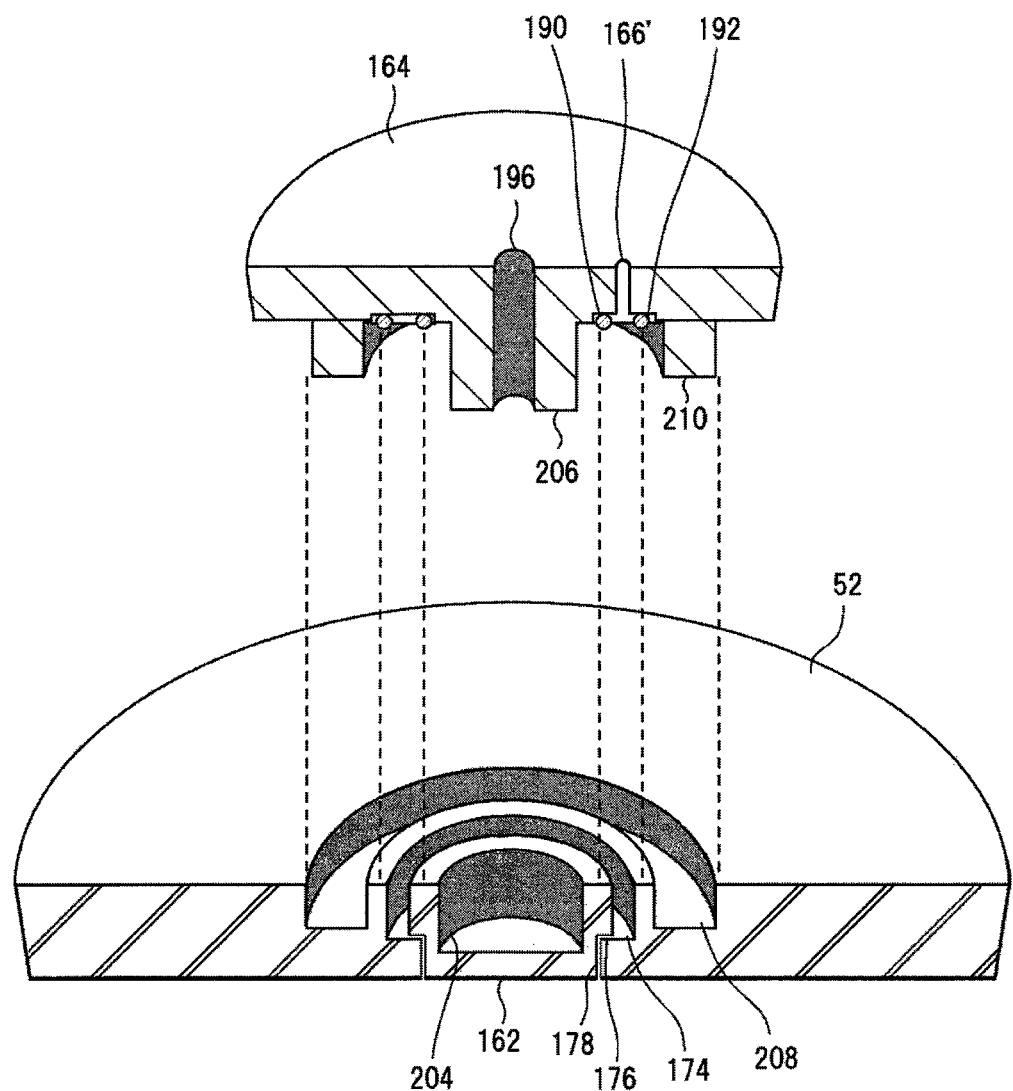
FIG. 35 is a perspective view illustrating a main portion in the configuration of FIG. 34 in an enlarged scale.

FIGS. 34 and 35 illustrate a configuration around a dielectric window gas flow path in another viewpoint of the present disclosure (Example 7). FIG. 34 is a cross-sectional view and FIG. 35 is an exploded perspective view. Example 7 is characterized in that an annular recess 208 is formed on the dielectric window 52 at a position radially outside the dielectric window gas flow paths 174 to 178 in Example 6, and an electrically grounded annular or cylindrical surrounding conductor 210 is provided to be fitted in the recess 208. The surrounding conductor 210 is preferably integrally formed in or integrally bonded to the connector unit 164. The surrounding conductor 210 is preferably shorter (shallower) than the protruding conductor 206 and preferably longer (deeper) than the predetermined distance (H) in Example 1.

In this configuration, in addition to the effects according to Example 6, the microwave electric fields coming up from the inside of the dielectric window 52 toward the gas flow path 166' of the connector unit 164 are attenuated by being reflected within the surrounding conductor 210 or by an equivalent reactance. As a result, as in Example 1 described above, it is possible to obtain an effect that the electric field strength is considerably weakened in the vicinity of the inlets of the dielectric window gas flow paths 174 to 178. This ensures that the abnormal electric discharge of a processing gas can be prevented more securely.

Example 8 Concerning Configuration Around Dielectric Window Gas Flow Path

Figure 36:
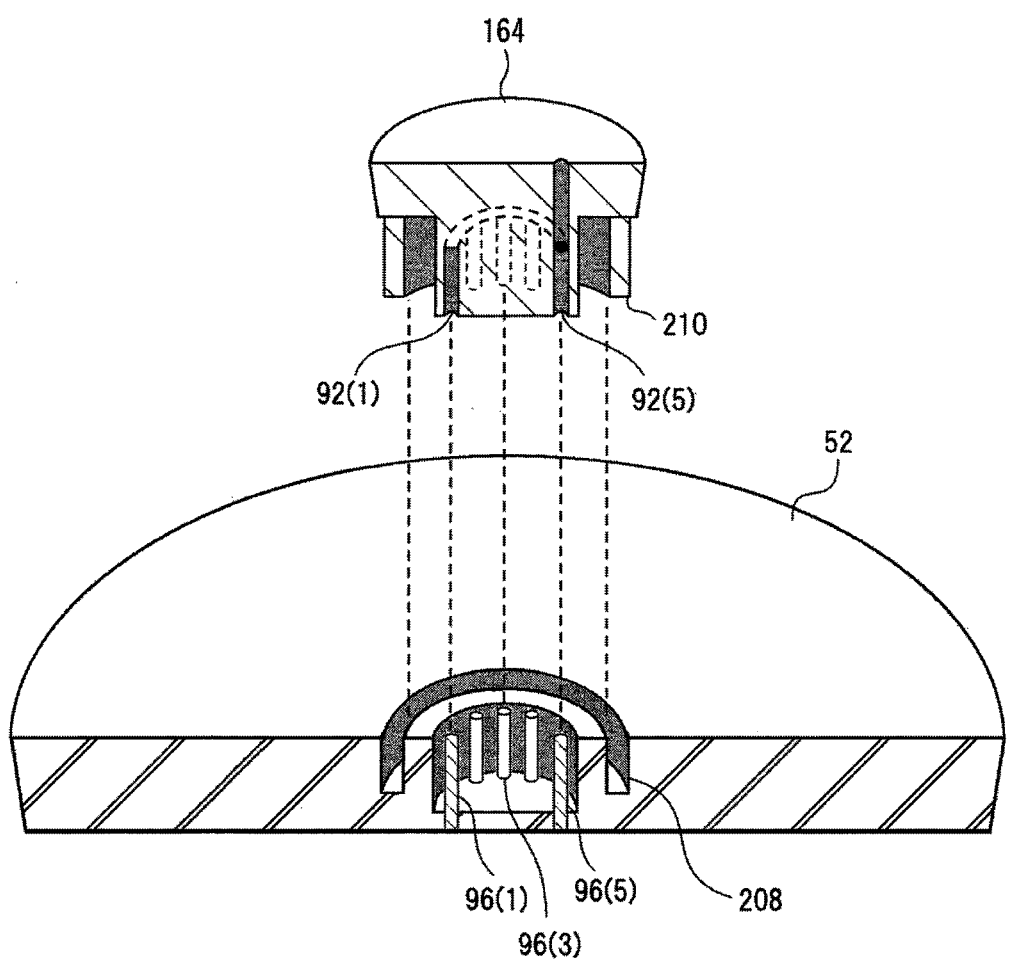
FIG. 36 is a perspective view illustrating a main portion of a configuration around a dielectric window gas flow path in Example 8.

FIG. 36 illustrates a configuration around a dielectric window gas flow path in a viewpoint of the present disclosure (Example 8). Example 8 includes a protruding conductor 206 as in Example 6 and a surrounding conductor 210 as in the FIG. 7. However, Example 8 is characterized in that, instead of being provided with the nozzle piece 162, as in Example 1, a plurality of electric discharge prevention members 96(1), 96(2) . . . 96(n) are provided in a plurality of dielectric window gas flow paths 94(1), 94(2) . . . 94(n) formed in the central region (recess 204) of the dielectric window 52 to protrude above the dielectric window gas flow paths 94(1), 94(2) . . . 94(n), respectively, and branched gas supply paths 92(n) are provided in the connector unit 164 or the protruding conductor 206 to hermetically communicate with the electric discharge prevention members 96(n), respectively. In addition, although not illustrated, a seal member, for example, an O-ring 120 (FIG. 6B) are provided between each of the electric discharge prevention members 96(n) and each of the branched gas supply paths 92(n). Further, each branched gas supply path 92(n) is preferably configured to surround one of the electric discharge prevention members 96(n) from the inlet thereof (or the bottom of a gas groove) toward the outlet over an extent h (h') which is not less than the predetermined distance (FIG. 6B).

In Example 8, in addition to the same effects as Example 7, it is possible to prevent the abnormal electric discharge within each dielectric window gas flow path 94(n), that is, the abnormal electric discharge within each electric discharge prevention member 96(1) more securely. Accordingly, although it is, of course, desirable to apply the above-described Conditional Equation (1) according to Example 3 to the arrangement position of each dielectric window gas flow path 94(n), the abnormal electric discharge of the processing gas in the vicinity of the inlet of each electric discharge prevention member 96(1) may be fully prevented even if the dielectric window gas flow paths have a configuration where Conditional Equation (1) is not applied.

Example 9 Concerning Configuration Around Dielectric Window Gas Flow Path

Figure 37:
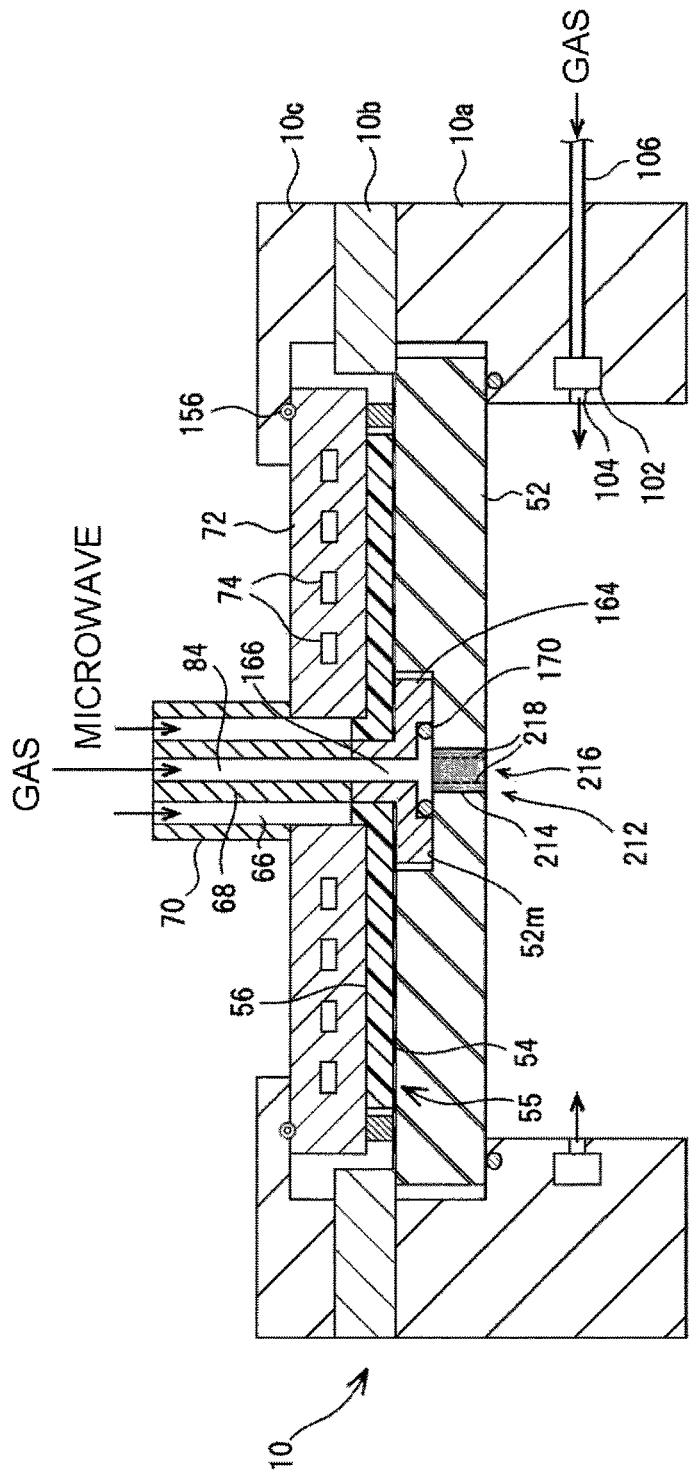
FIG. 37 is a perspective view illustrating a main portion of a configuration around a dielectric window gas flow path in Example 9.

FIG. 37 illustrates a configuration around a dielectric window gas flow path in another viewpoint of the present disclosure (Example 9). Example 9 is characterized by the configuration and functional action of a gas nozzle 212 provided in a central portion of a dielectric window 52. The gas nozzle 212 includes a cylindrical through hole (opening) 214 hermetically connected to a connector unit 164 of the upper gas introduction section and formed in the dielectric window 52, and a columnar nozzle piece 216 fitted in the through hole 214.

In addition, the connector unit 164 has the same configuration as the connector unit 164 in Example 4 (FIG. 25) and is connected to a terminal end of an inner conductor 68 of a coaxial tube 66 to be electrically grounded. An external gas flow path 166 is formed in the central portion of the connector unit 164 in which the external gas flow path 166 is connected with a gas flow path 84 of the coaxial tube 66 and vertically extends. In addition, around the upper end of the nozzle piece 216 (gas inlet), an endless seal member, for example, an O-ring 170 is inserted between the bottom surface of the connector unit 164 and the bottom surface of a recess 52 in the dielectric window 52 which accommodates the connector unit 164. In the illustrated configuration example, a wall portion inside the O-ring 170 is removed such that electric fields are not concentrated to a gap inside the O-ring 170 (a gas groove).

Figure 38:
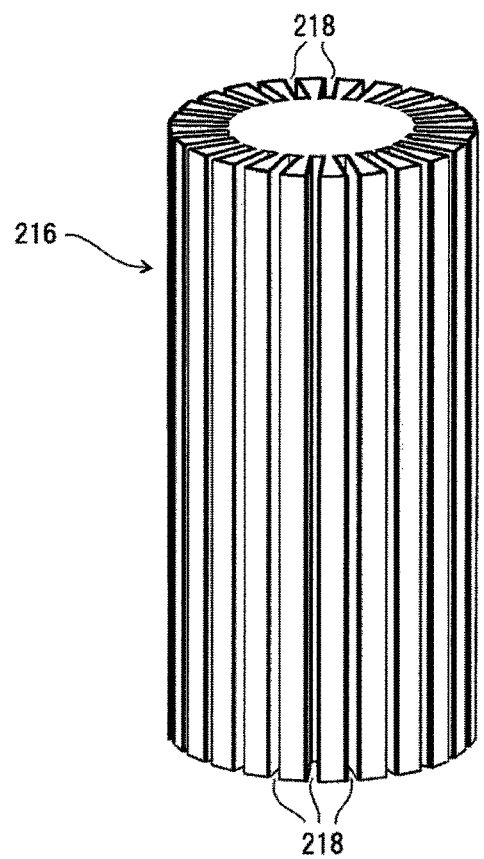
FIG. 38 is a perspective view illustrating an external configuration of a nozzle piece included in the configuration of FIG. 37.
Figure 39:
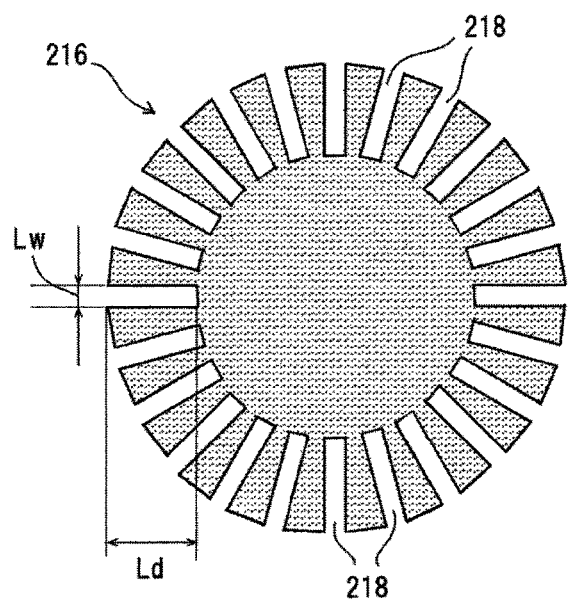
FIG. 39 is a horizontal cross-sectional view illustrating the shape of longitudinal grooves provided in the nozzle piece.
Figure 40:
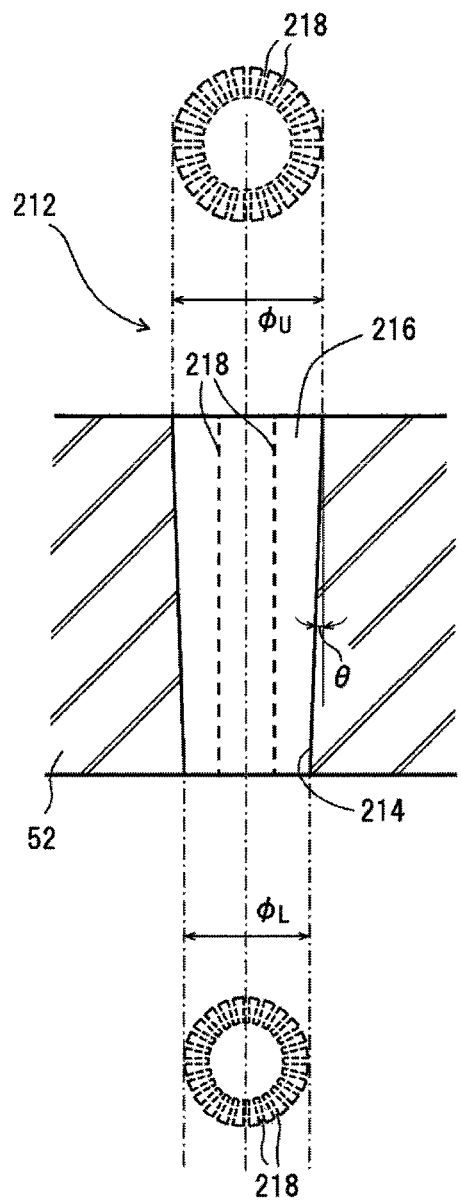
FIG. 40 is a vertical cross-sectional view illustrating a configuration of the nozzle piece.

FIGS. 38 to 40 illustrate a configuration of the nozzle piece 216. Any dielectric material may be used as a material of the nozzle piece 216. However, a dielectric material which is the same as the dielectric window 52 may be properly used. For example, when the dielectric window 52 is made of quartz, it is desirable to form the nozzle piece 216 using the same quartz.

On a side surface or outer circumferential surface of the nozzle piece 216, a plurality of longitudinal grooves 218 are formed to straightly extend in the axial direction from the upper end to the lower end thereof and in parallel to each other. In the illustrated configuration example, twenty four (24) longitudinal grooves 218 are provided to be spaced apart from each other in the circumferential direction on the outer circumferential surface of the nozzle piece 216. The longitudinal grooves 218 form dielectric window gas flow paths which are uniformly distributed in the circumferential direction in the gas nozzle 212. A processing gas, which has flowed through the gas flow path 84 of the coaxial tube 66 and the external gas flow path 166 of the connector unit 164 in the upper gas introduction section, is adapted to flow out from the twenty four longitudinal grooves 218 at a uniform flow rate and to be ejected into the plasma generation space. Since the processing gas flows out from the inside of the twenty four longitudinal grooves 218, which are uniformly distributed in the circumferential direction, straightly in the axial direction (at the shortest distance), a sufficiently high gas conductance may be obtained in the entire gas nozzle 212.

The longitudinal grooves 218 may have, for example, a circular shape, an elliptical shape, a triangular shape, and a square shape in cross section. However, a rectangular shape having long sides which correspond to the groove depth $L_d$ and short sides which correspond to the groove width $L_w$, may be properly employed. When the longitudinal grooves 218 have the rectangular shape in cross section, a ratio of the groove depth $L_d$ and the groove width $L_w$, i.e. an aperture ratio $L_d/L_w$ is important in order to prevent a backflow or abnormal electric discharge of plasma as well as to obtain a high gas conductance. For example, the aperture ratio is preferably 2 or more, and more preferably 5 or more.

More specifically, the groove width of the longitudinal grooves 218 is preferably in a range of 0.05 mm to 0.2 mm. When the groove width $L_w$ is less than 0.05 mm, the gas conductance becomes poor to such an extent that the conductance cannot be compensated even if the groove depth $L_d$ is considerably increased. Meanwhile, when the groove width $L_w$ exceeds 0.2 mm, abnormal electric discharge may occur easily. That is, even if ions exist in the longitudinal grooves 218, abnormal electric discharge is not caused when the walls of the longitudinal grooves 218, which dissipate the ions by collision, are close to each other. However, when the groove width $L_w$ corresponding to the short sides of the rectangular shape aperture exceeds a certain value, i.e. 0.2 mm, a length of time until the ions collide with the walls of the groove width $L_w$ is increased. Thus, it becomes highly probable that the ions may ionize other gas molecules due to the collision with the other gas molecules, thereby causing abnormal electric discharge.

In addition, the groove depth $L_d$ of the longitudinal grooves 218 is preferably 1 mm or more in order to secure a sufficiently high gas conductance and preferably 2 mm or less in view of easiness of machining the grooves. When the groove width $L_w$ is set to be in the range of 0.05 mm to 0.2 mm and the groove depth $L_d$ is set to be in the range of 1 mm to 2 mm, the aperture ratio $L_d/L_w$ of the longitudinal grooves 218 may be placed in the range of 5 to 40. Typically, in a nozzle piece 216 of which the whole length $L_N$ is 10 mm and the diameter ($\phi_U$) of the upper end is 6 mm, the groove width $L_w$ of the longitudinal grooves 218 is selected to be 0.1 mm and the groove depth $L_d$ is selected to be 1.2 mm. In such a case, the aperture ratio $L_d/L_w$ is 12.

The nozzle piece 216 has a diameter which is the same as or slightly smaller than that of the through hole 214 in the dielectric window 52 such that the nozzle piece 216 is snugly fitted in the through hole 214 over the whole length from the upper end to the lower end thereof. In the present example, in order to prevent the nozzle piece 216 from being released from the through hole 214, the diameters of both the through hole 214 and the nozzle piece 216 are set to be gradually reduced from the top toward the bottom in the thickness direction of the dielectric window 52 with the same taper angle θ. The taper angle θ is preferably in a range of 0.005≤tan θ≤0.2 in view of securing both of the positioning or release-preventing function and the aperture ratio (or effectiveness in nozzle size) at the lower end of the nozzle where the longitudinal grooves 218 become shallowest. Typically, in the nozzle piece 216 of which the whole length $L_N$ is 10 mm and the diameter of the upper end (maximum diameter) $\phi_U$ is 6 mm, the diameter of the lower end of the nozzle (minimum diameter)($\phi_L$) is selected to be 5.99 mm. In such a case, tan θ=0.01.

As described above, according to the processing gas supply mechanism of Example 9, the through hole 214 is formed in the central portion of the dielectric window 52 and the nozzle piece 216, which is made of a dielectric material and provided with the plurality of longitudinal grooves 218 having a predetermined aperture ratio and uniformly distributed in the circumferential direction on the outer circumferential surface thereof, is fitted in the through hole 214 to assemble the gas nozzle 212 such that the plurality of longitudinal grooves 218 form dielectric window gas flow paths. As a result, the backflow or abnormal electric discharge of plasma can be efficiently prevented while sufficiently enhancing the gas conductance.

Modified Example of Example 9

Figure 41:
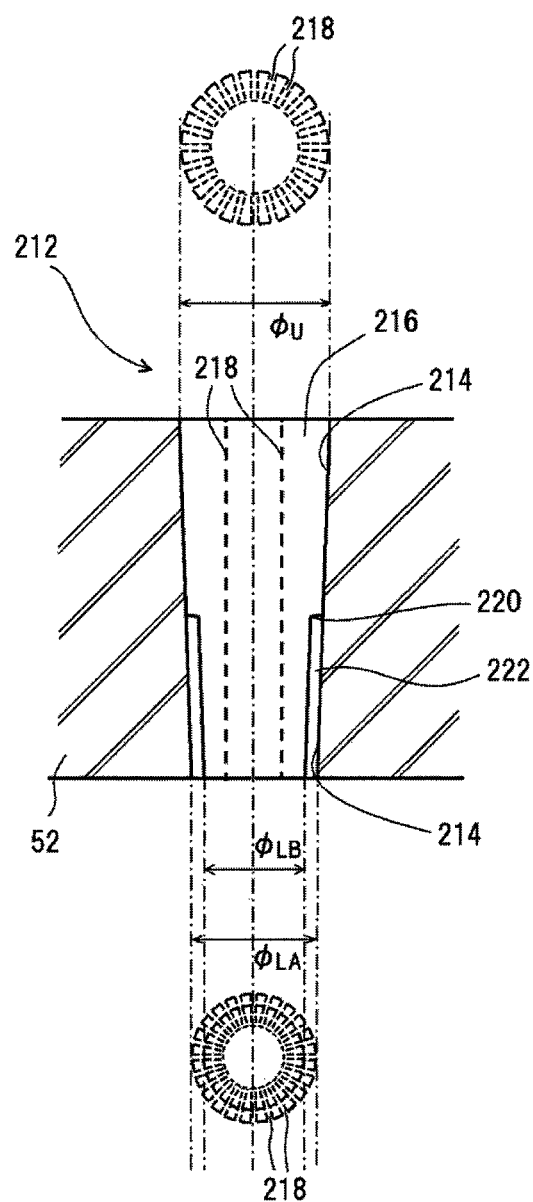
FIG. 41 is a vertical cross-sectional view illustrating a configuration of the nozzle piece in a modified example.

FIG. 41 illustrates a modified example of Example 9 as described above. The modified example is characterized in that, in the gas nozzle 212, the diameter of the nozzle piece 216 is changed stepwise in the middle of or at the intermediate portion of the nozzle piece 216 in the axial direction (in the thickness direction of the dielectric window 52).

More specifically, the diameter of the through hole 214 is continuously reduced in a predetermined taper angle θ from the top to the bottom in the thickness direction of the dielectric window 52. Meanwhile, the diameter of the nozzle piece 216 is reduced from the top to the bottom in the same taper angle θ as a whole but is provided with a step 220 at an intermediate portion in the middle of the nozzle piece 216. As a result, the outer circumferential surface of the nozzle piece 216 is in contact with the inner wall of the through hole 214 from the upper end to the top side edge of the step 220 in the thickness direction of the dielectric window 52, and is spaced apart from the inner wall of the through hole 214 from the bottom side edge of the step 220 to the lower end of the nozzle piece 216, thereby forming a gap 222. In such a case, the diameter $\phi_{LB}$ of the lower end of the nozzle piece 216 becomes smaller than the diameter $\phi_{LA}$ of the lower end of the through hole 214 by the gap 222. When the configuration, in which the outer circumferential surface of the nozzle piece 216 is spaced apart from the inner wall of the through hole 214 on the lower half portion thereof as described above, is employed, the gas conductance may be further enhanced while maintaining the aperture ratio of 2 or more substantially constantly.

Although not illustrated, as another modified example, a configuration, in which the direction of the step 220 is reversed such that the lower half portion of the outer circumference surface of the nozzle piece 216 is in contact with the inner wall of the through hole 214 and the upper half portion of the outer circumference surface is spaced apart from the inner wall of the through hole 214, is also possible. Alternatively, a configuration, in which only the intermediate portion of the nozzle piece 216 is narrow to be spaced apart from the inner wall of the through hole 214, is also possible. Further, as still another modified example, it is also possible to employ a configuration in which no step is provided on the nozzle piece 216 and instead, a step is provided on the inner wall of the through hole 214, that is, the diameter of the inner wall of the through hole 214 is changed stepwise in the middle of the through hole 214 in the thickness direction of the dielectric window 52.

Figure 42:
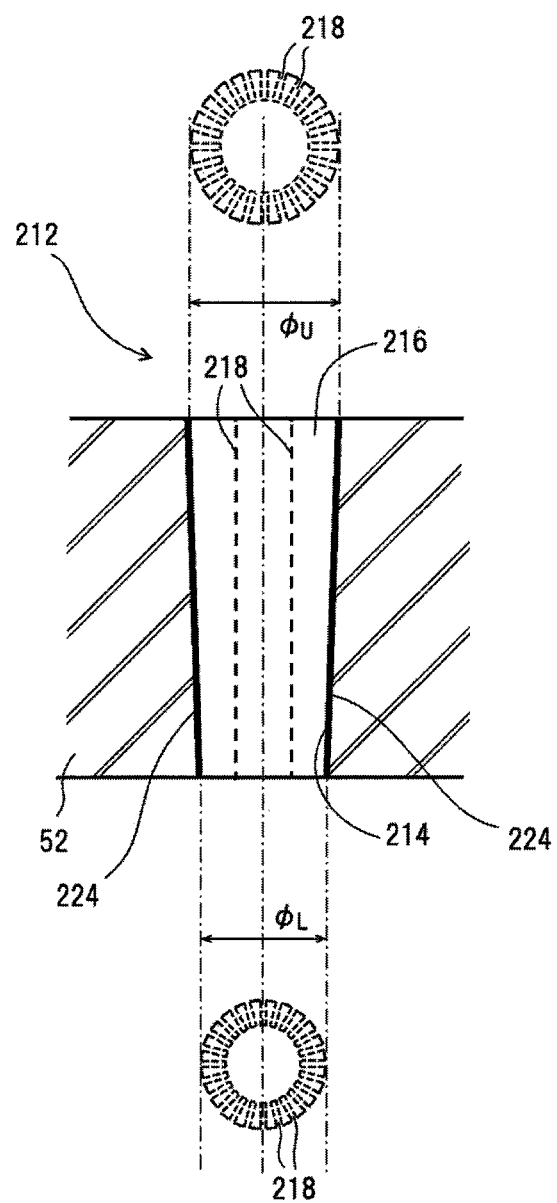
FIG. 42 is a cross-sectional view illustrating a configuration example in which an inner wall of a dielectric window gas flow path (through hole) and an outer circumferential surface of the nozzle piece.

FIG. 42 illustrates another modified example. The present modified example is characterized in that, in the gas nozzle 212 according to Example 9, a layer of an adhesive 224 is provided between the outer circumferential surface of the nozzle piece 216 and the inner wall of the through hole 214. In such a case, when the nozzle piece 216 is fitted in the through hole 214 in assembling the gas nozzle 212, a slight gap corresponding to the thickness of the layer of the adhesive 224 is formed between the outer circumferential surface of the nozzle piece 216 and the inner wall of the through hole 214. When the layer of the adhesive 224 is excessively thin, the adhesive force is reduced and when the layer of the adhesive 224 is excessively thick, the unevenness of the gap is increased. Thus, it is desirable to set the thickness of the layer of the adhesive 224 (gap size) to be in a range of 0.1 μm to 2 μm.

When the nozzle piece 216 and the through hole 214 are adhered to each other by the adhesive 224 as described above, friction (a cause of producing particles) between the nozzle piece 216 and the through hole 214 due to, for example, thermal expansion, may be removed and the dielectric window (ceiling plate) may be removed from the chamber such that the danger of release of the nozzle piece 216 can be completely avoided when performing cleaning by, for example, ultrasonic cleaning. As a result, the physical strength and reliability around the gas nozzle in a ceiling plate assembly may be enhanced.

The material and viscosity of the adhesive 224 are especially important among the characteristics of the adhesive 224. In order to reduce thermal stress, it is desirable that the adhesive 224 is made of a polymeric baked product having a thermal expansion coefficient equivalent to that of the nozzle piece 216 and/or that of the dielectric window 52 (with a relative difference in a range of, preferably, not more than 5 ppm), or includes it. Accordingly, for example, when the materials of the nozzle piece 216 and the dielectric window 52 are both quartz, an adhesive 224 made of a silicon-based inorganic polymer or containing the same may be properly used. In addition, it is desirable that the layer of the adhesive 224 in the gas nozzle 212 does not include small pores which may cause occurrence of abnormal electric discharge or deterioration at the time of cleaning, if possible, and that the layer of the adhesive 224 is substantially a compact body of which the porosity is not more than 10%. For this reason, the filler content of the adhesive 224 is preferably not more than 50 wt. % and most preferably 0 wt. %. That is, it is most preferable that the adhesive 224 does not contain any filler.

Concerning the viscosity, it is desirable that the adhesive 224 has a suitable viscosity (5 mPa·s to 5000 mPa·s) in the liquid state prior to hardening (baking) such that a slight gap (of 0.1 μm to 2 μm) between the nozzle piece 216 and the through hole 214 to be completely and fully filled with the adhesive to ensure a necessary or sufficient adhesion strength.

In addition, when the adhesive 224 is used as described above, it is desirable to roughen the outer circumferential surface of the nozzle piece 216 and/or the surface of the inner wall of the through hole 214 to a proper surface roughness (0.1 μm≤Ra≤3.2 ƒm in which Ra is an arithmetic mean roughness) so as to obtain a good anchoring effect.

In addition, although not illustrated, as another modified example, a configuration, in which, in the gas nozzle 212, the through hole 214 formed in the dielectric window 52 has a diameter which is increased in a reversed taper shape downwardly (toward the inside of the chamber 10), and likewise, the nozzle piece 216, of which the diameter is increased in a reversed taper shape downward (toward the inside of the chamber 10), is fitted in the through hole 214, is also possible. In addition, when the nozzle piece 216 is bonded to the through hole 214 using the adhesive 224, it is possible to form the nozzle piece 216 and the through hole 214 in a columnar shape and a cylindrical shape which have a constant diameter from the upper end to the lower end without being tapered. In addition, it is possible to form the longitudinal grooves 218 on the outer surface of the nozzle piece 216 obliquely in relation to the axial direction of the nozzle. The number of the longitudinal grooves 218 in the illustrated configuration example (twenty four (24)) is an example. The important thing is that when the number of the longitudinal grooves 218 is increased, the gas conductance can be enhanced while maintaining the aperture ratio of the longitudinal grooves 218 constantly.

[Method of Fabricating Gas Nozzle]

In order to fabricate the gas nozzle 212 according to Example 9 as described above, first, a dielectric plate having a predetermined plate thickness and a predetermined diameter is prepared as for a ceiling plate (dielectric window 52). As described above, as for the material of the dielectric plate (dielectric window 52), quartz or a ceramic such as $Al_2O_3$. In the central portion of the dielectric plate (dielectric window 52), a through hole 214 of a predetermined diameter is formed using, for example, laser machining or NC grinding. A nozzle piece 216 having a shape and a size snugly fitted in the through hole 214 is fabricated by molding or machining, preferably using a diametric material which is the same as the dielectric plate (dielectric window 52). In addition, the nozzle piece 216 is inserted into the through hole 214 of the dielectric plate (dielectric window 52) by rotating and screwing the nozzle piece 216.

When the adhesive 224 is used as described above, the outer circumferential surface and/or the surface of the inner wall of the through hole 214 are subjected to a surface treatment, for example, blasting, to a proper surface roughness (0.1 μm≤Ra≤3.2 μm in which Ra is an arithmetic mean roughness) prior to fitting the nozzle piece 216 in the through hole 214. Then, after fitting the nozzle piece 216 in the through hole 214, the adhesive 224 is caused to flow into a gap between the outer circumferential surface of the nozzle piece 216 and the inner wall of the through hole 214. For example, when the materials of the dielectric window 52 and the nozzle piece 216 are both quartz, tetraethoxysilane (TEOS) which has a viscosity in a range of 5 mPa·s to 5000 mPa·s at a contact angle of not more than 10° may be properly used as for the adhesive 224. After a liquid adhesive 224 is spread out throughout the gap between the outer circumferential surface of the nozzle piece 216 and the inner wall of the through hole 214 to completely fill the gap, the ceiling plate assembly is baked at a temperature in a range of 200° C. to 800° C. By the baking, the TEOS of the adhesive 224 is solidified and changed to $SiO_2$. Since the filler content of the adhesive 224 is small (preferably, the adhesive does not contain any filler), it is possible to obtain a compact layer of adhesive 224 that does not contain small pores. In this manner, a ceiling plate assembly having a gas nozzle capable of being attached to the ceiling of the chamber 10 is completed. In addition, as a material of the adhesive 224, for example, SiON or SiOC may be used, besides TEOS or $SiO_2$.

According to the gas nozzle 212 fabrication method as described above, a gas nozzle 212 which has a sufficiently high gas conductance and is capable of efficiently preventing inflow or abnormal electric discharge of plasma may be easily incorporated in the dielectric window 52.

Other Modified Example or Applied Example of Example 9

The configurations or functions of the gas nozzle 212 and the nozzle piece 216 in Example 9 described above may be applied to various applications. For example, as described above, as a modified example of Example 1, the nozzle piece 216 in Example 9 may be filled in the cylinder portion 126 as an air-permeable dielectric material (FIGS. 6I and 6J). In addition, as a modified example of Example 2, the nozzle piece 216 in Example 9 may be mounted in the dielectric window gas flow path 94(n) as an electric discharge prevention member 96(n) or the nozzle piece 216 in Example 9 may be filled in the cylinder portion 126 as an air-permeable dielectric material (FIGS. 19 and 20). Further, as a modified example of Example 3, the nozzle piece 216 in Example 9 may be mounted in the dielectric window gas flow path 94(n) as an electric discharge prevention member 96(n) (FIG. 24B).

Figure 43:
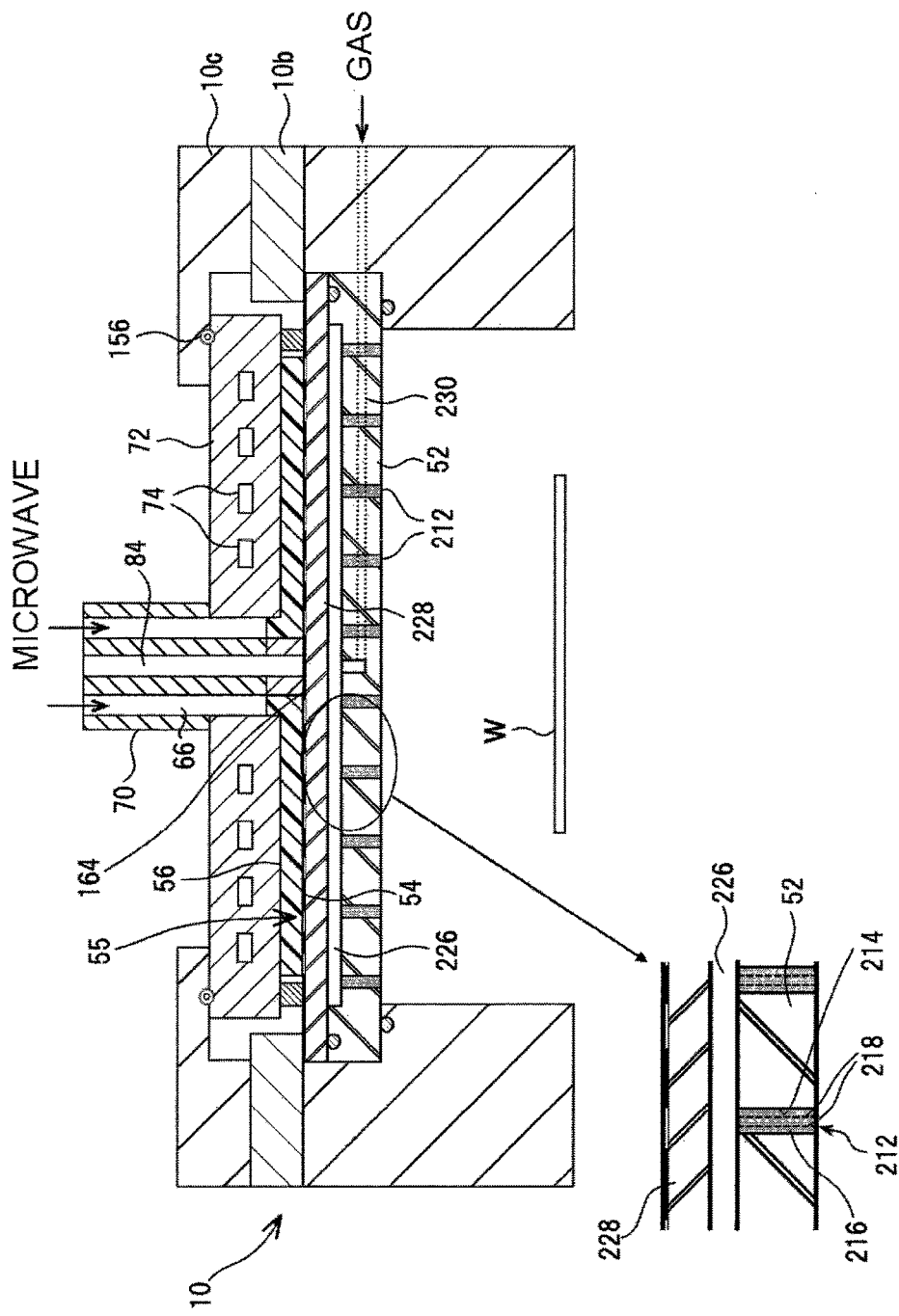
FIG. 43 is a cross-sectional view illustrating a configuration around a shower plate according to a modified example of Example 9.

In addition, as another applied example, as illustrated in FIG. 43, the ceiling plate assembly 52, 212 in Example 9 may be applied to, for example, a shower head of a microwave plasma processing apparatus. In this configuration, a plurality of gas nozzles 212 are provided discretely in the dielectric window 52 of the ceiling plate which is also used as a shower head. A cover plate 228 made of dielectric material is coupled to the rear surface of the dielectric window 52 through a hermetically sealed gap 226, and a processing gas is sent to the gap 226 through a gas passage 230 provided in the chamber 10 and the dielectric window 52. Then, the processing gas is introduced into the plasma generation space within the chamber 10 from the gap 226 and through each of the gas nozzles 212.

Figure 44:
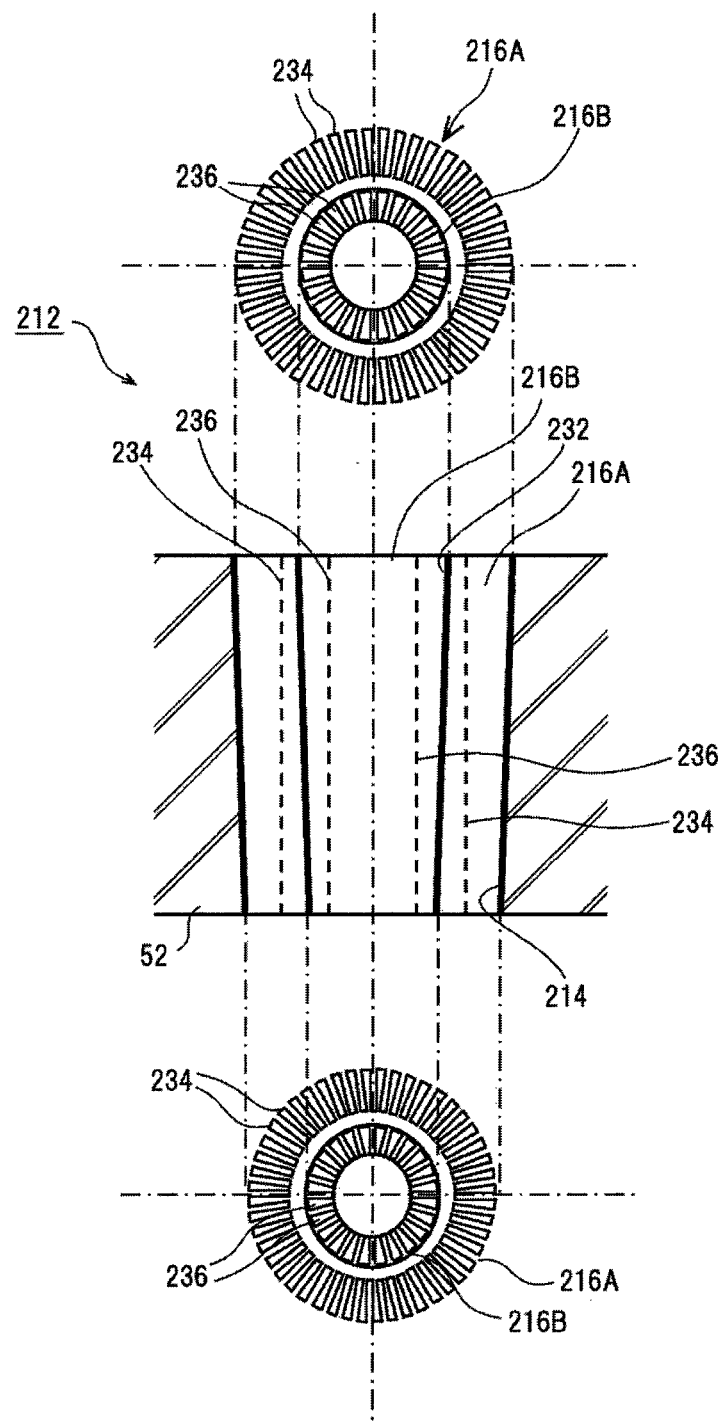
FIG. 44 is a cross-sectional view illustrating a configuration around the gas nozzle according to a modified example of Example 9.
Figure 45:
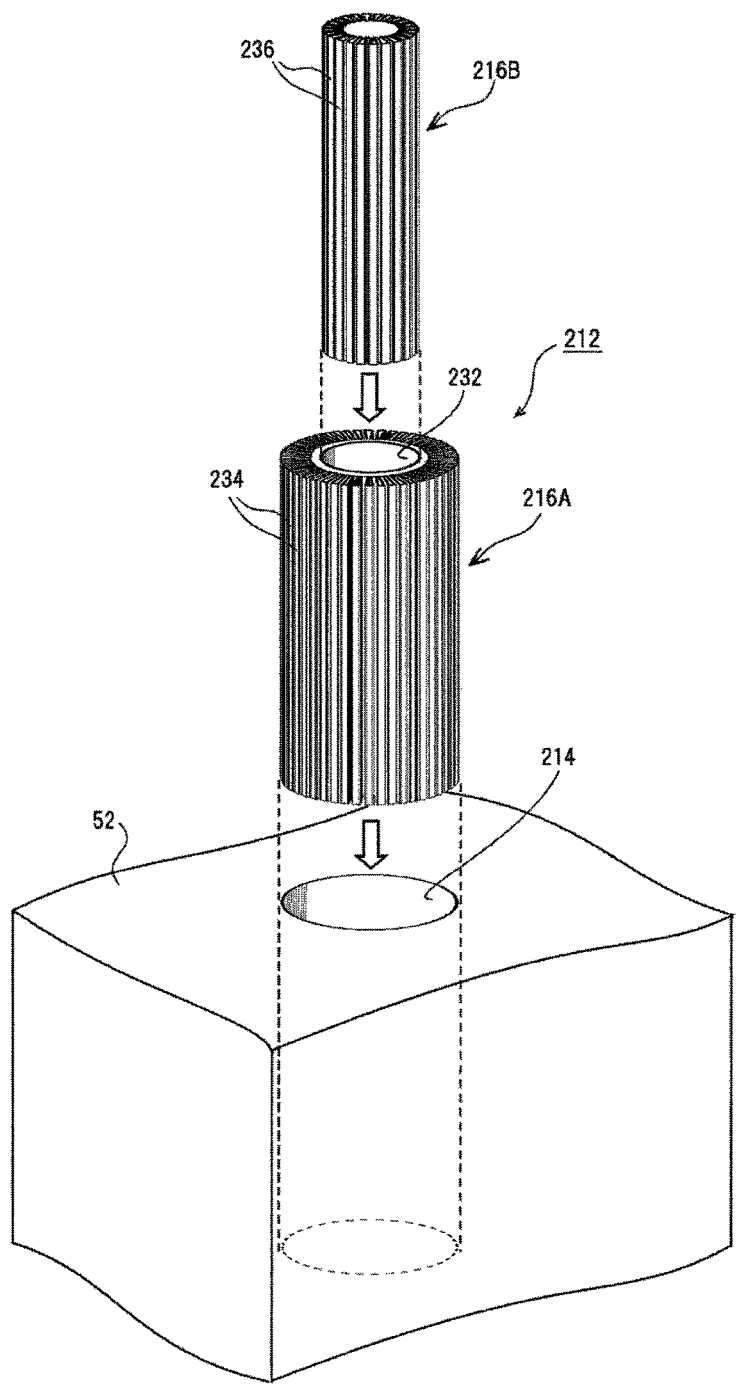
FIG. 45 is an exploded perspective view illustrating the configuration of each portion of the gas nozzle of FIG. 44 in detail.

As a gas nozzle 212 according to a modified example of Example 9, a configuration, in which a plurality of (e.g., two) nozzle pieces 216A, 216B are provided coaxially or concentrically within the through hole 214 of the dielectric window 52 as illustrated in FIGS. 44 and 45, is also possible. In this configuration example, a cylindrical outer nozzle piece 216A is fitted in the through hole 214 of the dielectric window 52. In addition, a columnar inner nozzle piece 216B is fitted in the through hole 232 in the outer nozzle piece 216A. Although not illustrated, it is desirable to interpose an adhesive (layer) such as the above-described adhesive 224 between the outer circumferential surface of the outer nozzle piece 216A and the inner wall of the through hole 214. It is desirable to interpose the same adhesive (layer) between the outer circumferential surface of the inner nozzle piece 216B and the inner wall of the outer nozzle piece 216A as well.

On the side surface or outer circumferential surface of the outer nozzle piece 216A, a plurality of longitudinal grooves 234, which extend straightly from the upper end to the lower end of the outer nozzle piece 216A in the axial direction, are formed in parallel to each other. The longitudinal grooves 234 form first (outer) dielectric window gas flow paths which are uniformly distributed in the circumferential direction within the gas nozzle 212. Meanwhile, also on the side surface or outer circumferential surface of the inner nozzle piece 216B, a plurality of longitudinal grooves 236, which extend straightly from the upper end to the lower end of the outer nozzle piece 216B in the axial direction, are formed in parallel to each other. The longitudinal grooves 236 form second (inner) dielectric window gas flow paths which are uniformly distributed in the circumferential direction within the gas nozzle 212. When the dielectric window gas flow paths are provided coaxially or concentrically within the gas nozzle 212, the conductance of the gas nozzle 212 can be further enhanced.

In addition, as another modified example of Example 9, a configuration, in which grooves that form dielectric window gas flow paths within the gas nozzle 212 are provided on the inner wall of a through hole 214 of the dielectric window 52, is also possible. In such a case, no groove is formed on the outer circumferential surface of the nozzle piece 216. Then, the diameter of the through hole 214 provided in the dielectric window 52 is typically not more than 10 mm and it is practically very difficult to form the grooves having a profile as described above on the inner wall of the through hole 214 having such a small diameter.

Other Example or Modified Example

In the above-described exemplary embodiment, the upper gas introduction section 80 and the side gas introduction section 82 are provided as a gas introduction mechanism that introduces a processing gas into the chamber 10. However, a configuration, in which the side gas introduction section 82 is omitted and only the upper gas introduction section 80 is provided, is also possible.

The above-described exemplary embodiment is related to a configuration in which the dielectric window 52 that forms a ceiling plate of the chamber 10 is provided with the electric discharge prevention member 96. However, the present disclosure may also be applied to a configuration, in which a dielectric window gas flow path is provided in an optional dielectric window (e.g., a dielectric window of the side wall of the chamber) that transmits and introduces microwaves into the plasma generation space within the chamber 10.

Components of the microwave discharge mechanism in the microwave plasma processing apparatus of the above-described exemplary embodiment, in particular, the microwave transmission line 58 and the radial line slot antenna 55 are merely examples and other types or forms of microwave transmission lines and slot antennas may also be used.

Since the microwave plasma etching apparatus in the above-described exemplary embodiment generates microwave plasma without using a magnetic field, it is not necessary to provide a magnetic field forming mechanism such as a permanent magnet or an electromagnetic coil around the chamber 10. As a result, the apparatus may be simplified in construction. Then, the present disclosure may also be applied to a plasma processing apparatus that uses electron cyclotron resonance (ECR).

The present disclosure is not limited to the microwave plasma etching apparatus of the above-described exemplary embodiment and may also be applied to other microwave plasma processing apparatuses that perform, for example, plasma CVD, plasma oxidation, plasma nitriding, and sputtering. Further, the present disclosure may also be applied to an induction coupling plasma processing apparatus that uses high-frequency waves as electromagnetic waves without being limited to a microwave plasma processing apparatus.

In the induction coupling plasma processing apparatus, a conventional coil type antenna is used. Typically, the coil type antenna is disposed above the ceiling plate of the chamber and a high-frequency power source is electrically connected to the coil type antenna through a matching unit. By an RF current flowing in the coil type antenna, RF magnetic fields, of which the magnetic force lines penetrate the dielectric window to pass through the processing space within the chamber, are generated around the coil type antenna, and induction electric fields are generated in an azimuth angle direction within the processing space by the temporal change of the RF magnetic fields. In addition, electrons accelerated in the azimuth direction by the induction electric fields collide with and ionize molecules or atoms of the processing gas and as a result, plasma is generated in a donut shape. Here, when a processing gas supply mechanism configured to supply a processing gas into the chamber through gas flow paths provided in the dielectric window is provided, the present disclosure may be applied to the processing gas supply mechanism.

A substrate to be processed in the present disclosure is not limited to a semiconductor wafer and, for example, a flat panel display, an organic EL, various substrates for use in a solar cell, a photo mask, a CD substrate, or a printed substrate may also be processed.

DESCRIPTION OF SYMBOL

10: chamber
12: susceptor (lower electrode)
26: exhaust apparatus
52: dielectric window (ceiling plate)
54: slot plate
55: radial line slot antenna
56: dielectric plate
58: microwave transmission line
60: microwave generator
66: coaxial tube
80: upper gas introduction section
86: processing gas supply source
90: connector unit (external gas tube)
92(1) to 92(8), 92(n): branched gas supply path
94(1) to 94(8), 94(n): dielectric window gas flow path
96(1) to 96(8), 96(n): electric discharge prevention member
114: protruding portion (of electric discharge prevention member)
116, 134: spring coil
118: surrounding conductor
120: O-ring
126: cylinder portion
128: porous dielectric material (of electric discharge prevention member)
142: O-ring
144: gap (gas groove) inside the O-ring
146: gap outside the O-ring outer
142: connector unit
162, 162': nozzle piece
160: dielectric window opening
166, 166': gas flow path within connector unit
170: O-ring
206: protruding conductor
210: surrounding conductor
212: gas nozzle
214: through hole
216: nozzle piece
216A: outer nozzle piece
216B: inner nozzle piece
218: longitudinal groove
224: adhesive (layer)
234, 236: longitudinal groove

What is claimed is:

1. A plasma processing apparatus, comprising:
a processing container;
a substrate holding unit configured to hold a substrate in the processing container;
a coaxial waveguide and a dielectric window for introducing a microwave over the substrate holding unit;
a dielectric window gas flow path that penetrates the dielectric window;
a processing gas supply unit including an external gas supply path connected to the dielectric window gas flow path from above or a side of the dielectric window, the processing gas supply unit being configured to supply at least a part of a required processing gas into the processing container through the external gas supply path and the dielectric window gas flow path;
an electromagnetic wave supply unit configured to supply electromagnetic waves into the processing container through the dielectric window;
an electric discharge prevention member integrally formed in or coupled to the dielectric window, including an inlet connected to an outlet of the external gas supply path, and configured to form a portion or whole of the dielectric window gas flow path, an inlet side portion of the electric discharge prevention member protruding from a surface of the dielectric window by at least a predetermined distance H; and
a surrounding conductor including a connector unit, the surrounding conductor configured to surround the inlet side portion of the electric discharge prevention member, the connector unit connected to a lower end of an inner conductor of the coaxial waveguide;
wherein the predetermined distance H is determined by a wavelength of the electromagnetic waves and a size of the surrounding conductor in a radial direction, and further wherein the electric discharge prevention member is air permeable and the processing gas passes through the electric discharge prevention member.

2. The plasma processing apparatus of claim 1, wherein, assuming that a wavelength the electromagnetic waves is $\lambda_d$ when the electromagnetic waves are propagated within the electric discharge prevention member, $H \geq 0.05\lambda_d$.

3. The plasma processing apparatus of claim 2, wherein $H \leq 0.3\lambda_d$.

4. The plasma processing apparatus of claim 1, wherein, assuming that an inner diameter of the surrounding conductor or a length of a major axis of a maximum inscribed ellipse of the surrounding conductor is D, $H \geq 0.13D$.

5. The plasma processing apparatus of claim 4, wherein $H \geq 0.5D$.

6. The plasma processing apparatus of claim 1, wherein, assuming that the wavelength of the electromagnetic waves is $\lambda_d$ when the electromagnetic waves are propagated within the electric discharge prevention member and an inner diameter of the surrounding conductor or a length of a major axis of a maximum inscribed ellipse of the surrounding conductor is D, $D \leq 0.6\lambda_d$.

7. The plasma processing apparatus of claim 1, wherein a plurality of dielectric window gas flow paths are provided in the dielectric window in parallel to each other.

8. The plasma processing apparatus of claim 7, wherein, assuming that a distance between a center of the dielectric window and each of the dielectric window gas flow paths is R and the wavelength of the electromagnetic waves is $\lambda_g$ when the electromagnetic waves are propagated within the dielectric window, $\lambda_g/4 < R < 5\lambda_g/8$.

9. The plasma processing apparatus of claim 8, wherein no dielectric window gas flow path is provided within $\lambda_g/4$ from the center of the dielectric window.

10. The plasma processing apparatus of claim 8, wherein the dielectric window has a rotational symmetry property.

11. The plasma processing apparatus of claim 7, wherein the plurality of dielectric window gas flow paths are arranged on a circumference of a predetermined distance from the center of the dielectric window at equidistant intervals.

12. The plasma processing apparatus of claim 1, wherein the electric discharge prevention member includes a porous dielectric material.

13. The plasma processing apparatus of claim 1, wherein the electric discharge prevention member includes a dielectric material which is formed with a plurality of extra fine through holes.

14. The plasma processing apparatus of claim 1, wherein the electric discharge prevention member includes a dielectric material which is formed with a plurality of longitudinal grooves extending in an axial direction on an outer circumferential surface thereof.

15. The plasma processing apparatus of claim 1, wherein the electric discharge prevention member includes a cylinder portion which is made of a dielectric material and integrally formed in or bonded to the dielectric window.

16. The plasma processing apparatus of claim 1, wherein the electric discharge prevention member protrudes on the rear side of the dielectric window and the protruding portion is surrounded by the surrounding conductor.

17. The plasma processing apparatus of claim 1, wherein at least a portion of the external gas supply path in the vicinity of the outlet is made of a conductor and integrally extending from or connected with the surrounding conductor.

18. The plasma processing apparatus of claim 1, wherein the surrounding conductor is segmented into a plurality of conductor members which are connected with each other along an axial direction.

19. The plasma processing apparatus of claim 1, wherein an electromagnetic field absorption member is provided between a side surface of the electric discharge prevention member and the surrounding conductor.

20. The plasma processing apparatus of claim 1, wherein an endless seal member is provided between a side surface of the electric discharge prevention member and the surrounding conductor.

21. The plasma processing apparatus of claim 20, wherein a recess shielded from an atmospheric space by the seal member is formed between the side surface of the electric discharge prevention member and the surrounding conductor, and
the surrounding conductor surrounds the side surface of the electric discharge prevention member over an extent which is equal to or longer than the predetermined distance H, from the deepest position of the recess.

22. The plasma processing apparatus of claim 1, wherein an endless seal member is provided between an end surface of the inlet of the electric discharge prevention member and the outlet of the external gas supply path.

23. The plasma processing apparatus of claim 22, wherein a gap formed inside the seal member in the vicinity of the inlet of the electric discharge prevention member is larger than a gap formed outside the seal member.

24. The plasma processing apparatus of claim 23, wherein the gap outside the seal member is 0.2 mm or less and the gap inside the seal member is 0.3 mm or more.

25. The plasma processing apparatus of claim 24, wherein the gap inside the seal member is 0.5 mm to 1.0 mm.

26. The plasma processing apparatus of claim 1, wherein an endless seal member is provided between the dielectric window and the outlet of the external gas supply path.

27. The plasma processing apparatus of claim 1, wherein the electromagnetic wave supply unit includes an antenna provided above the dielectric window so as to supply the electromagnetic waves into the processing container.

28. The plasma processing apparatus of claim 27, wherein the antenna is a flat plate-type slot antenna.

29. The plasma processing apparatus of claim 28, wherein the flat plate-type slot antenna has a rotational symmetry property.

30. The plasma processing apparatus of claim 28, wherein a slot plate in the flat plate-type slot antenna forms a part of the surrounding conductor.

31. The plasma processing apparatus of claim 28, wherein the electromagnetic wave supply unit includes:
a microwave generator configured to generate microwaves as the electromagnetic waves, and
a microwave transmission line configured to propagate the microwaves generated from the microwave generator to the flat plate-type slot antenna.

32. The plasma processing apparatus of claim 27, wherein the antenna is a coil type antenna.

33. The plasma processing apparatus of claim 32, wherein the electromagnetic wave supply unit includes:
a high frequency power source configured to generate high frequency waves as the electromagnetic waves,
a high frequency wave transmission unit configured to transmit the high frequency waves from the high frequency power source to the antenna, and
a matching unit configured to match a load impedance of the antenna side to an impedance of the high frequency power source side.

34. The plasma processing apparatus of claim 1, wherein the outlet of the electric discharge prevention member extends to an outlet of the dielectric window gas flow path which faces the plasma generation space within the processing container so as to form a gas jet port.

* * * * *